United States Patent
Ohmichi et al.

(10) Patent No.: US 6,885,225 B2
(45) Date of Patent: Apr. 26, 2005

(54) DRIVE CIRCUIT

(75) Inventors: Akira Ohmichi, Tokyo (JP); Keiichiro Numakura, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 86 days.

(21) Appl. No.: 10/267,898

(22) Filed: Oct. 10, 2002

(65) Prior Publication Data

US 2003/0156439 A1 Aug. 21, 2003

(30) Foreign Application Priority Data

Feb. 18, 2002 (JP) ........................................ 2002-039820

(51) Int. Cl.[7] ................................................ H03K 3/00
(52) U.S. Cl. ........................ 327/112; 327/108; 327/538
(58) Field of Search ................................ 327/108, 109, 327/112, 538; 326/82, 83, 85, 86, 87; 323/222; 257/368

(56) References Cited

U.S. PATENT DOCUMENTS

| | | | |
|---|---|---|---|
| 5,365,118 A | * 11/1994 | Wilcox | 327/109 |
| 5,519,306 A | * 5/1996 | Itoh et al. | 323/222 |
| 5,666,280 A | * 9/1997 | Janaswamy et al. | 363/98 |
| 5,973,368 A | * 10/1999 | Pearce et al. | 257/368 |
| 6,154,411 A | 11/2000 | Morishita | 365/226 |
| 6,724,169 B1 | * 4/2004 | Majumdar et al. | 318/811 |

FOREIGN PATENT DOCUMENTS

| | | |
|---|---|---|
| JP | 1-136218 | 5/1989 |
| JP | 2000-47624 | 2/2000 |
| JP | 2000-173266 | 6/2000 |

* cited by examiner

Primary Examiner—Tuan T. Lam
Assistant Examiner—Hiep Nguyen
(74) Attorney, Agent, or Firm—Leydig, Voit & Mayer, Ltd.

(57) ABSTRACT

A drive circuit includes a totem-pole output stage including a top arm and a bottom arm, a pre-drive circuit including a top arm driver and a bottom arm driver, and a power supply voltage boosting power supply circuit. The boosting power supply circuit includes a top arm driver boosting power supply circuit that boosts the top arm and a bottom arm driver boosting power supply circuit that boosts the power supply voltage and outputs a boosted voltage.

7 Claims, 46 Drawing Sheets

AT THE TIME OF PWM RECIRCULATION

AT THE TIME OF PWM CONDUCTION

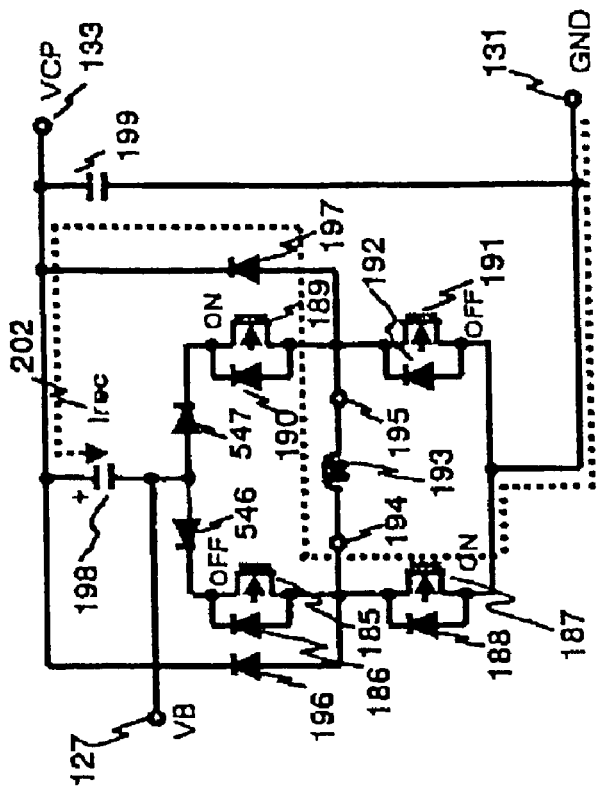
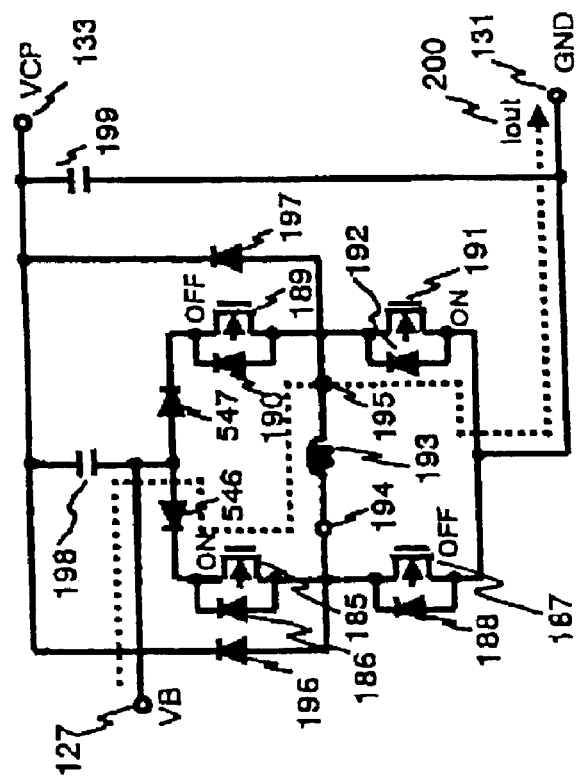

//www.w3.org/1999/xhtml">
DRIVE CIRCUIT

FIELD OF THE INVENTION

The present invention relates to a drive circuit that drives a load based on power obtained from a power supply, such as a battery, in which the power. supply voltage varies greatly.

BACKGROUND OF THE INVENTION

FIG. 67 shows a conventional drive circuit. In FIG. 67, reference numeral 1 denotes a drive circuit power supply such as a battery, 2 a battery voltage terminal VB, 3 a clock input terminal CLK, 4 a grounding terminal GND, 5 a top arm control signal input terminal IT, 6 a bottom arm control input terminal IB, 7 a voltage boosting power supply circuit, 8 a pre-drive circuit for driving a totem-pole type output stage of the next stage, 9 a top arm driver for driving an NMOS transistor 11 (hereafter referred to as top arm transistor, or simply top arm) included in the totem-pole type output stage in the pre-drive circuit 8, 10 a bottom arm driver for driving an NMOS transistor 12 (hereafter referred to as bottom arm transistor, or simply bottom arm) included in the totem-pole type output stage in the pre-drive circuit 8, and 13 an output terminal connected to a load.

A case will now be explained in which the drive circuit power supply 1 connected to the VB terminal 2 and the GND terminal 4 is a battery power supply that drives the load connected to the terminal 13 based on the operation of pulse width modulation (PWM). As for operation of the output stage, the direction of a current that flows through the load connected to the output terminal 13 can be controlled by ejecting (sourcing, or pushing) a current to the output when the top arm 11 is on and the bottom arm 12 is off, and absorbing (sinking or pulling) the current when the top arm 11 is off and the bottom arm 12 is on.

In the instance of a current source in which the top arm 11 is on and the bottom arm 12 is off, the voltage of the output terminal 13 rises up to the power supply voltage (battery voltage) VB. At this time, therefore, VB+Vgs becomes necessary as a gate high voltage of the top arm 11, where Vgs is a gate-source voltage required to drive the NMOS transistor 11. In other words, a power supply voltage higher than the battery voltage VB becomes necessary. Therefore, the voltage boosting power supply circuit 7 is provided.

A charge pump circuit that requires a clock input signal or a step-up converter is used for the voltage boosting power supply circuit 7. A voltage boosted therein is used as a power supply of the top arm driver 9 in the pre-drive circuit 8. An output voltage of the drive circuit power supply 1 is typically supplied from the VB terminal 2 as a power supply of the bottom arm driver 10.

A more concrete circuit example of FIG. 67 is shown in FIG. 68. As an example of the voltage boosting power supply circuit 7, a charge pump circuit that double-boosts a voltage based on the power supply voltage VB as a reference voltage is shown. Reference numerals 40 and 41 denote rectifier diodes, 43 a pile-up capacitor for boosting, 45 a decoupling capacitor for a boosted output voltage, 46 a PMOS transistor, and 47 an NMOS transistor. These components form an inverter for charging the capacitor 43.

The pre-drive circuit 8 includes a top control circuit 51 and a bottom arm controller 52. The top arm controller 51 receives a top arm control signal from the IT input terminal 5, and activates a top arm drive inverter formed of a PMOS transistor 57 and an NMOS transistor 58. The bottom arm controller 52 receives a bottom arm control signal from the IB input terminal 6, and activates a bottom arm drive inverter formed of a PMOS transistor 59 and an NMOS transistor 60. Resistors 61 and 62 are gate resistors for adjusting switching speeds of the top arm 11 and the bottom arm 12, respectively.

Supposing that the power supply voltage VB is 20 V, at least 20 V is required as a drain-source withstanding voltage of the output stage transistors 11 and 12. Since the power supply of the bottom arm driver is VB, at least 20 V becomes necessary as the withstanding voltage of the transistors 59 and 60 and the bottom arm controller 52 as well. As for the top arm driver, the voltage boosting power supply circuit 7 outputting an output of the charge pump circuit, which boosts the voltage to twice, is used as a power supply. Neglecting the voltage loss in circuit elements, the output voltage of the charge pump becomes 40V. Therefore, at least 40 V becomes necessary as a withstanding voltage of the top arm controller 51, and the transistors 57 and 58.

Typically, in MOS transistors each having a high withstanding voltage, the gate-source withstanding voltage is small as compared with the drain-source withstanding voltage. In order to prevent over voltage gate-source breakdown of the transistors each having a withstanding voltage of 20 V or 40 V, Zener diodes 53 to 56, 63 and 64 become necessary. For the same reason, gate-source protection Zener diodes 505 and 506 become necessary also for the transistors 46 and 47, which form an inverter in the voltage boosting power supply circuit 7.

The conventional drive circuit shown in FIG. 67 and FIG. 68 has problems as mentioned below.

First, when a power supply such as a battery in which a power supply voltage varies greatly ("large in power supply voltage variation") is used and the power supply voltage has fallen, the output current drive capability of the bottom arm cannot be exhibited sufficiently. For example, if a battery of 12 V is used as a power supply, the voltage becomes approximately 16 V when the battery is fully charged and the voltage becomes approximately 6 V when the battery voltage has fallen. Such a variation of the operation power supply voltage must be considered. For example, when the battery voltage has fallen, the gate input high voltage of the bottom arm becomes 6 V. A voltage in the range of approximately 8 to 10 V is typically needed as the gate-source voltage, although it depends upon the output current and the characteristic of the NMOS transistor 12 as well. When the battery voltage is 6 V, therefore, on-resistance of the bottom arm transistor becomes lower and a required output sink current cannot be obtained.

A second problem is as follows, when a power supply having a large power supply voltage variation, such as a battery power supply, is used, it becomes necessary to use a circuit designed with due regard to a maximum power supply voltage and a larger voltage than needed is applied to the output gate sometimes. For example, the gate-source voltage required for driving each of the output stage transistors is in the range of approximately 8 to 10 V, although it depends upon the output current and the NMOS device characteristic as well. If a power supply of, for example, VB=24 V is used in the circuit of FIG. 68, the power supply voltage of the top arm driver 9 and the power supply voltage of the bottom arm driver 10 become 48 V and 24 V, respectively, neglecting the voltage loss within the charge pump circuit. The power supply voltages thus become very large as compared with the necessary drive voltage in the range of 8 to 10 V of the output stage transistors.

Especially, a top arm driver power supply voltage of 24 V+10 V=34 V is sufficient considering the numerical values. As a matter of fact, however, the top arm driver power supply voltage becomes an unnecessarily excessive voltage of 48 V.

If the power supply voltage becomes excessively large, noise generated at the time of circuit operation also increases. If the power supply voltage is made larger than needed, then the influence of the power supply noise and GND noise on circuit operation or the influence of radiation noise on the external electric circuit readily occurs, which is undesirable. Since withstanding voltage of the voltage boosting power supply circuit 7 and the pre-drive circuit 8 depend on the power supply voltage VB, elements each having a withstanding voltage corresponding to the maximum voltage of VB must be used as most elements forming the circuit. In addition, it also becomes necessary to add protection circuits such as the gate protection circuits.

These unfavorably result in an increased manufacturing cost, because they expand the layout pattern areas of individual elements in integrated circuits, and increase unit prices of element components in electric circuits formed of discrete components.

Thirdly, it also poses a problem that an influence of a variation of circuit characteristics caused by a variation of the power supply voltage appears in the output stage operation when a power supply having a large power supply voltage variation is used.

To be concrete, the operation delay of the top arm driver 9 or the bottom arm driver 10 is changed by the power supply voltage variation. Due to a change of on-resistance of the transistors 57 to 60, which drive the top arm 11 and the bottom arm 12 serving as output transistors, the switching speed of the output transistors varies. In order to prevent the characteristic variation, further a circuit is required to be added, resulting in an increased circuit scale and an increased manufacturing cost.

SUMMARY OF THE INVENTION

It is an object of this invention to provide a drive circuit that drives a load based on a power obtained from a power supply, such as a battery, in which the power supply voltage varies greatly.

The drive circuit according to one aspect of this invention includes a drive circuit power supply, a totem-pole type output stage including a top arm and a bottom arm, a pre-drive circuit including a top arm driver that drives the top arm and a bottom arm driver that drives the bottom arm, and a power supply voltage (VCC) boosting power supply circuit. This VCC boosting power supply circuit includes a top arm driver boosting power supply circuit that boosts the top arm, and a bottom arm driver boosting power supply circuit that boosts a voltage of a VCC power supply and outputs a boosted voltage.

The drive circuit according to another aspect of this invention includes a drive circuit power supply, a totem-pole type output stage including a top arm and a bottom arm, a pre-drive circuit including a top arm driver that drives the top arm and a bottom arm driver that drives the bottom arm, and a pre-drive power supply circuit. This pre-drive power supply circuit includes a top arm driver boosting power supply circuit that boosts the top arm, a battery voltage (VB) boosting power supply circuit that boosts a voltage of the drive circuit power supply and outputs a boosted voltage, and a bottom arm driver constant voltage circuit.

The drive circuit according to still another aspect of this invention includes a drive circuit power supply, a totem-pole type output stage including a top arm and a bottom arm, a pre-drive circuit including a top arm driver that drives the top arm and a bottom arm driver that drives the bottom arm, and a pre-drive power supply circuit. This pre-drive power supply circuit includes a top arm driver boosting power supply circuit that boosts the top arm, a VB boosting power supply circuit that boosts a voltage of the drive circuit power supply and outputs a boosted voltage, a bottom arm driver constant voltage circuit, and a boosted power supply voltage clamp circuit that prevents an output of the VB boosting power supply circuit from rising in voltage.

The drive circuit according to still another aspect of this invention includes a drive circuit power supply, a totem-pole type output stage including a top arm and a bottom arm, a pre-drive circuit including a top arm driver that drives the top arm and a bottom arm driver that drives the bottom arm, and a pre-drive power supply circuit. This pre-drive power supply circuit includes a top arm driver boosting power supply circuit that boosts the top arm, a VB boosting power supply circuit that boosts a voltage of the drive circuit power supply and outputs a boosted voltage, a bottom arm driver constant voltage circuit, a boosted power supply voltage monitor circuit that monitors a voltage rise of an output of the VB boosting power supply circuit, and a CLK controller that controls a clock signal to be supplied to the VB boosting power supply circuit according to an output signal of the boosted power supply voltage monitor circuit.

The drive circuit according to still another aspect of this invention includes a drive circuit power supply, a totem-pole type output stage including a top arm and a bottom arm, a pre-drive circuit including a top arm driver that drives the top arm and a bottom arm driver that drives the bottom arm, and a pre-drive power supply circuit. This pre-drive power supply circuit includes a top arm driver boosting power supply circuit that boosts the top arm, a VB boosting power supply circuit that boosts a voltage of the drive circuit power supply and outputs a boosted voltage, a bottom arm driver constant voltage circuit, a boosted power supply voltage monitor circuit that monitors a voltage rise of an output of the VB boosting power supply circuit, and a CLK controller that controls a clock signal to be supplied to the top arm driver boosting power supply circuit according to an output signal of the boosted power supply voltage monitor circuit.

The drive circuit according to still another aspect of this invention includes a drive circuit power supply, a totem-pole type output stage including a top arm and a bottom arm, a pre-drive circuit including a top arm driver that drives the top arm and a bottom arm driver that drives the bottom arm, and a pre-drive power supply circuit. This pre-drive power supply circuit includes a top arm driver boosting power supply circuit that boosts the top arm, a VB boosting power supply circuit that boosts a voltage of the drive circuit power supply and outputs a boosted voltage, a bottom arm driver constant voltage circuit, a boosted power supply voltage monitor circuit that monitors a voltage rise of an output of the VB boosting power supply circuit, a filter circuit, and a CLK controller that controls a clock signal to be supplied to the VB boosting power supply circuit according to an output signal of the filter circuit.

The drive circuit according to still another aspect of this invention includes a drive circuit power supply, a totem-pole type output stage including a top arm and a bottom arm, a pre-drive circuit including a top arm driver that drives the top arm and a bottom arm driver that drives the bottom arm, and a pre-drive power supply circuit. This pre-drive power supply circuit includes a top arm driver boosting power supply circuit that boosts the top arm, a variable voltage boosting power supply circuit that boosts a voltage of the drive circuit power supply and outputs a boosted voltage and that has a switchover terminal, a bottom arm driver constant voltage circuit, and a bottom arm driver power supply voltage monitor circuit that outputs a signal to the switchover terminal according to an output of the bottom arm driver constant voltage circuit in order to change an output capability of the variable voltage boosting power supply circuit. The pre-drive power supply circuit also includes a boosted power supply voltage monitor circuit that monitors a voltage rise of an output of the variable voltage boosting power supply circuit, a filter circuit, and a CLK controller that controls a clock signal to be supplied to the variable voltage boosting power supply circuit according to an output signal of the filter circuit.

The drive circuit according to still another aspect of this invention includes a drive circuit power supply, a totem-pole type output stage including a top arm and a bottom arm, a pre-drive circuit including a top arm driver that drives the top arm and a bottom arm driver that drives the bottom arm, and a pre-drive power supply circuit. This pre-drive power supply circuit includes a top arm driver boosting power supply circuit that boosts the top arm, a variable voltage boosting power supply circuit that boosts a voltage of the drive circuit power supply and outputs a boosted voltage and that has a switchover terminal, and a bottom arm driver constant voltage circuit. The pre-drive power supply circuit also includes a boosted power supply voltage monitor circuit that monitors a voltage rise of an output of the variable voltage boosting power supply circuit and outputs a signal to the switchover terminal according to an output of the bottom arm driver constant voltage circuit in order to change an output capability of the variable voltage boosting power supply circuit, a filter circuit, and a CLK controller that controls a clock signal to be supplied to the variable voltage boosting power supply circuit according to an output signal of the filter circuit.

The drive circuit according to still another aspect of this invention includes a drive circuit power supply, a totem-pole type output stage including a top arm and a bottom arm, a pre-drive circuit including a top arm driver that drives the top arm and a bottom arm driver that drives the bottom arm, and a pre-drive power supply circuit. This pre-drive power supply circuit includes a top arm driver boosting power supply circuit that boosts the top arm, a VB boosting power supply circuit that boosts a voltage of the drive circuit power supply and outputs a boosted voltage, and a bottom arm driver constant voltage circuit. The pre-drive power supply circuit also includes a boosted power supply voltage monitor circuit that monitors a voltage rise of an output of the VB boosting power supply circuit, a filter circuit, a CLK controller that controls a clock signal to be supplied to the VB boosting power supply circuit according to an output signal of the filter circuit, and a top arm driver boosting power supply voltage monitor circuit that receives an output of the top arm driver boosting power supply circuit and changes an output capability of the top arm driver boosting power supply circuit.

The drive circuit according to still another aspect of this invention includes a drive circuit power supply, a totem-pole type output stage including a top arm and a bottom arm, a pre-drive circuit including a top arm driver that drives the top arm and a bottom arm driver that drives the bottom arm, and a pre-drive power supply circuit. This pre-drive power supply circuit includes a top arm driver boosting power supply circuit that boosts the top arm, a variable voltage boosting power supply circuit that boosts a voltage of the drive circuit power supply and outputs a boosted voltage and that has a switchover terminal, and a bottom arm driver constant voltage circuit. The pre-drive power supply circuit also includes a boosted power supply voltage monitor circuit that monitors a voltage rise of an output of the variable voltage boosting power supply circuit and outputs a signal to the switchover terminal in order to change an output capability of the variable voltage boosting power supply circuit. The pre-drive power supply circuit further includes a filter circuit, a CLK controller that controls a clock signal to be supplied to the variable voltage boosting power supply circuit according to an output signal of the filter circuit, and a top arm driver power supply voltage monitor circuit that receives an output of the top arm driver boosting power supply circuit and changes an output capability of the top arm driver boosting power supply circuit.

The drive circuit according to still another aspect of this invention includes a drive circuit power supply, a totem-pole type output stage including a top arm and a bottom arm, a pre-drive circuit including a top arm driver that drives the top arm and a bottom arm driver that drives the bottom arm, and a pre-drive power supply circuit. This pre-drive power supply circuit includes a top arm driver boosting power supply circuit that boosts the top arm, a VB boosting power supply circuit that boosts a voltage of the drive circuit power supply and outputs a boosted voltage, and a bottom arm driver constant voltage circuit. The pre-drive power supply circuit also includes a boosted power supply voltage monitor circuit that monitors a voltage rise of an output of the VB boosting power supply circuit, a filter circuit, a CLK controller that controls a clock signal to be supplied to the VB boosting power supply circuit according to an output signal of the filter circuit, and a top arm driver power supply voltage monitor circuit that receives an output of the top arm driver boosting power supply circuit and changes an output capability of the top arm driver.

The drive circuit according to still another aspect of this invention includes a first drive circuit power supply, a second drive circuit power supply, a totem-pole type output stage including a top arm and a bottom arm, a pre-drive circuit including a top arm driver that drives the top arm and a bottom arm driver that drives the bottom arm, and a pre-drive power supply circuit. This pre-drive power supply circuit includes a top arm driver boosting power supply circuit that boosts the top arm, a VB boosting power supply circuit that boosts a voltage of the first drive circuit power supply and outputs a boosted voltage, and a bottom arm driver constant voltage circuit. The second drive circuit power supply is connected to the pre-drive circuit.

The drive circuit according to still another aspect of this invention includes a drive circuit power supply, a voltage boosting power supply circuit, a rush current control switch provided between the drive circuit power supply and the voltage boosting power supply circuit, and a boosted output voltage monitor circuit that monitors an output of the voltage boosting power supply circuit and outputs a signal to the rush current control switch when the output of the voltage boosting power supply circuit is lower than a fixed voltage.

The drive circuit according to still another aspect of this invention includes a drive circuit power supply, a voltage boosting power supply circuit, a rush current control switch provided between the drive circuit power supply and the voltage boosting power supply circuit, and a boosted output current monitor circuit that monitors an output current of the voltage boosting power supply circuit and outputs a signal to the rush current control switch when the output current of the voltage boosting power supply circuit is larger than a fixed current.

The drive circuit according to still another aspect of this invention includes a drive circuit power supply, a voltage boosting power supply circuit, a rush current control switch provided between the drive circuit power supply and the voltage boosting power supply circuit, and a delay circuit that outputs a signal to the rush current control switch when the power supply is started.

The drive circuit according to still another aspect of this invention includes a drive circuit power supply, a voltage boosting power supply circuit, a rush current control switch provided between the drive circuit power supply and the voltage boosting power supply circuit, and a power-on reset circuit that is provided outside the drive circuit and outputs a signal. The rush current control switch is controlled based on the signal output of the power-on reset circuit when the power supply is started.

Other objects and features of this invention will become apparent from the following description with reference to the accompanying drawings.

BRIEF DESCRIPTION OF THE DRAWINGS

FIGS. 20A and 20B are diagrams for explaining PWM operation at the time of fast decay that show concrete boost operation of the eleventh embodiment of the present invention.

DETAILED DESCRIPTIONS

Embodiments of this invention will be explained below with reference to the accompanying drawings.

Figure 1:
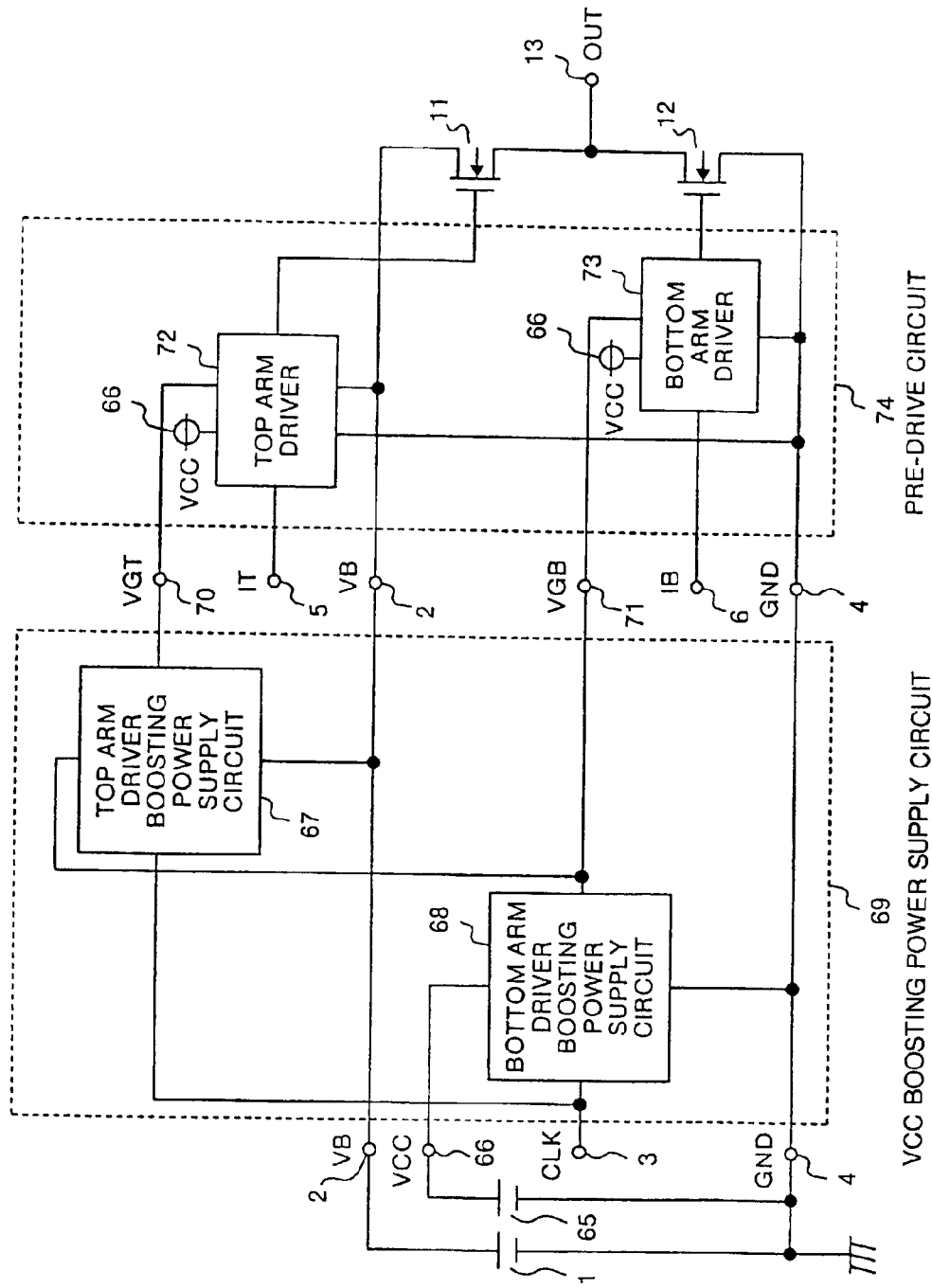
FIG. 1 is a block diagram which shows a first embodiment of the present invention.
Figure 67:
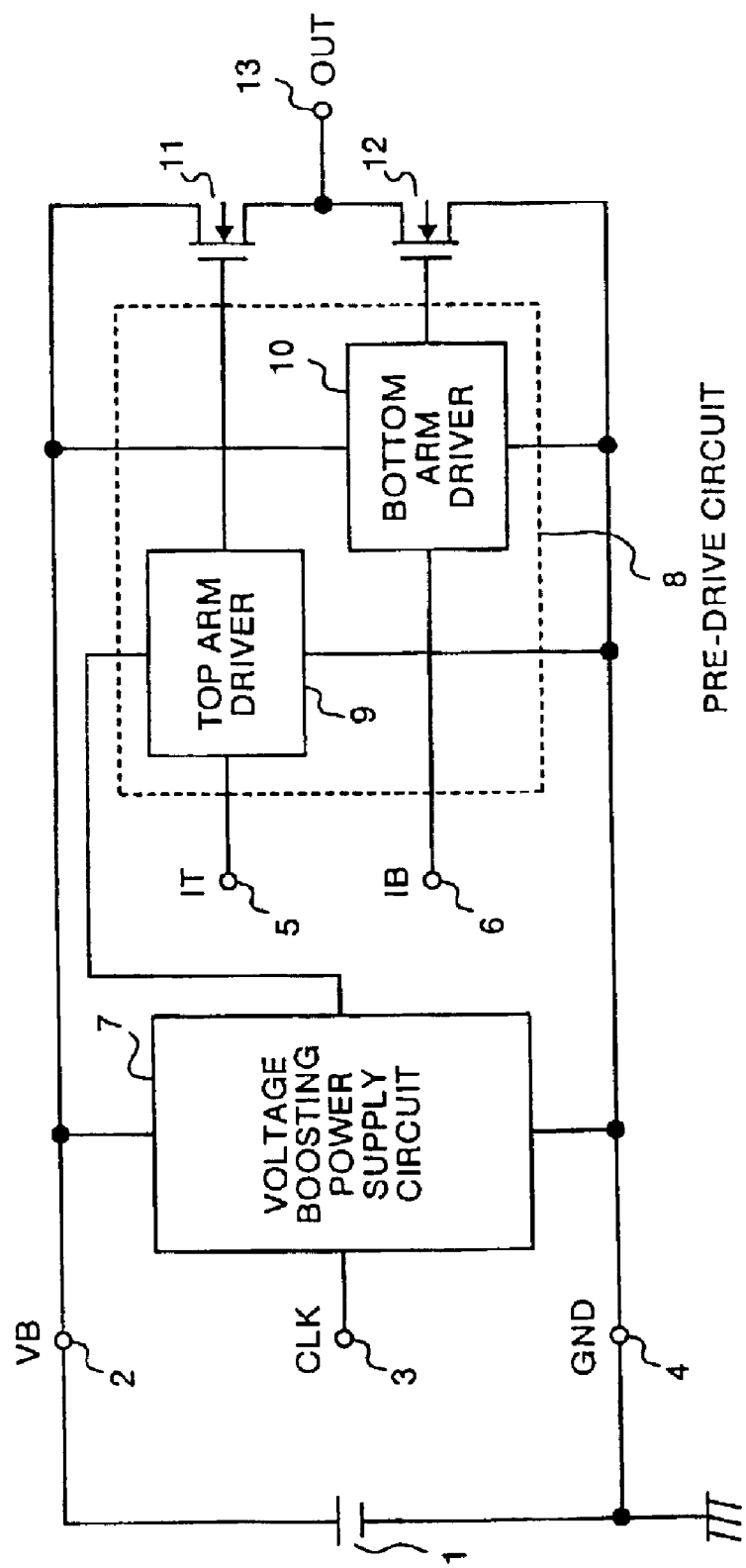
FIG. 67 is a circuit diagram which shows a conventional drive circuit.

A first embodiment of this invention will be explained below. FIG. 1 shows a drive circuit of the first embodiment of the present invention. The voltage boosting power supply circuit 7 of FIG. 67 is replaced with a VCC boosting power supply circuit 69. The pre-drive circuit 8 of FIG. 67 is replaced with a pre-drive circuit 74. The same characters as those of FIG. 67 other than the above-mentioned characters denote the same components.

The VCC boosting power supply circuit 69 includes a top arm driver boosting power supply circuit 67 and a bottom arm driver boosting power supply circuit 68. The pre-drive circuit 74 includes a top arm driver 72 and a bottom arm driver 73. In addition, a VCC power supply 65 is connected to the bottom arm driver boosting power supply circuit 68 as a voltage boosting power supply via a VCC terminal 66.

A load connected to the output terminal 13 will be explained a little below.

Figure 2:
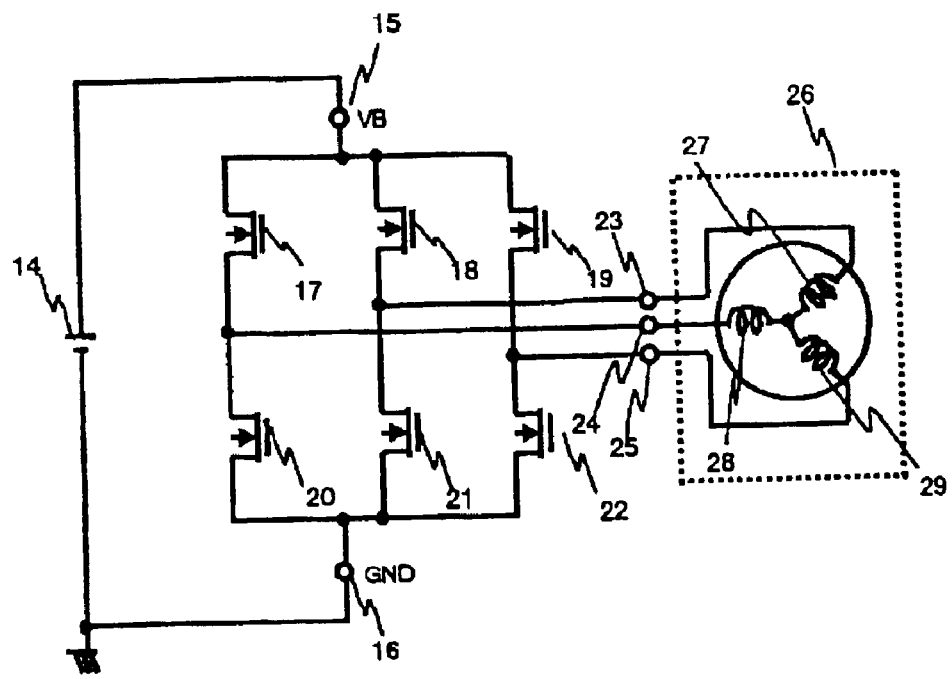
FIG. 2 is a circuit diagram which shows a three-phase brushless motor load and an output stage in the first embodiment of the present invention.
Figure 3:
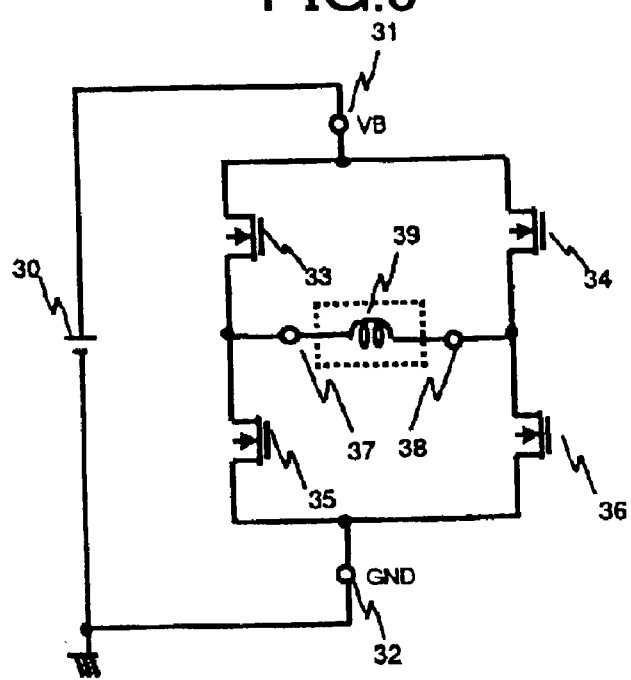
FIG. 3 is a circuit diagram which shows a coil load and an output stage in the first embodiment of the present invention.

The drive circuit of the present invention can be suitably used to drive a coil load such as a motor or an electromotive actuator. For example, there are a system, an electric power steering (EPS), an electromotive valve, an electromotive power window, and an air conditioner auto blower which are mounted on cars and utilize motors and electromotive actuators. Concrete examples of the load are shown in FIGS. 2 and 3. FIG. 2 shows an example of a three-phase brushless motor 26. The three-phase brushless motor 26 including three star-connected coils 27, 28 and 29 represents an actual load. Totem-pole connected NMOS transistors 17 to 22 represent output stage transistors. In other words, the top arm transistors 17 to 19 correspond to the top arm transistor 11 of FIG. 1. The lower arm transistors 20 to 22 correspond to the bottom arm transistor 12 of FIG. 1. Output terminals 23 to 25 correspond to the output terminal 13 (OUT) of FIG. 1. Further, in FIG. 2, reference numeral 14 represents a power supply, 15 a power supply terminal VB, and 16 a grounding terminal GND.

In FIG. 2, therefore, three pre-drive circuits 74 shown in FIG. 1 become necessary.

FIG. 3 shows an electromotive actuator using a DC motor, a VCM coil motor, or a solenoid. A coil 39 represents the load. Totem-pole connected output stage transistors 33 to 36 represent output stage transistors, which actually drive the coil 39. In other words, the top arm transistors 33 and 34 correspond to the top arm 11 of FIG. 1. The lower arm transistors 35 and 36 correspond to the bottom arm 12 of FIG. 1. Output terminals 37 and 38 correspond to the output terminal 13 of FIG. 1. Further, in FIG. 3, reference numeral 30 represents a power supply, 31 a power supply terminal VB, and 32 a grounding terminal GND. In this instance, therefore, a total of two pre-drive circuits 74 of FIG. 1 become necessary. In both FIG. 2 and FIG. 3, one totem-pole connected output stage sources its output current and another totem-pole connected output stage sinks its output current. As a result, the direction of the output current, which flows through the coil load, is controlled, and the motor or electromotive actuator is driven.

Referring back to FIG. 1, operation will be explained hereafter.

Power is supplied from the VCC power supply 65 to the bottom arm driver boosting power supply circuit 68 included in the VCC boosting power supply circuit 69 via the VCC terminal 66. The VCC power supply 65 is a constant voltage source, which generates a constant voltage for an MCU and a DSP included in the system to conduct signal control and computation from a drive circuit power supply voltage VB. In the electric circuit system using the MCU and the DSP, therefore, the VCC power supply 65 outputting a voltage in the range of approximately 3.3 V to 5 V exists. Since the power supply is used for the application, the voltage variation is very small and is typically in the range of approximately ±3 to 10%.

In FIG. 1, the bottom arm driver boosting power supply circuit 68 boosts a VCC voltage (hereafter referred to simply as VGC) VCC in a range of, for example, 3.3 V to 5 V to a voltage in a range from 10 to 15 V, and outputs the boosted voltage to an output terminal VGB of the bottom arm driver boosting power supply circuit 68. This voltage is used as a power supply of the bottom arm driver 73 of the pre-drive circuit 74. The top arm drive boosting power supply circuit 67 adds the voltage on a VGB terminal 71 (hereafter referred to simply as VGB) to a voltage on a VB terminal (hereafter referred to simply as VB), and generates a voltage of VB+VGB, i.e., a voltage on a VGT terminal 70 (hereafter referred to simply as VGT). The voltage VGT is used as a power supply of the top arm driver 72.

Figure 68:
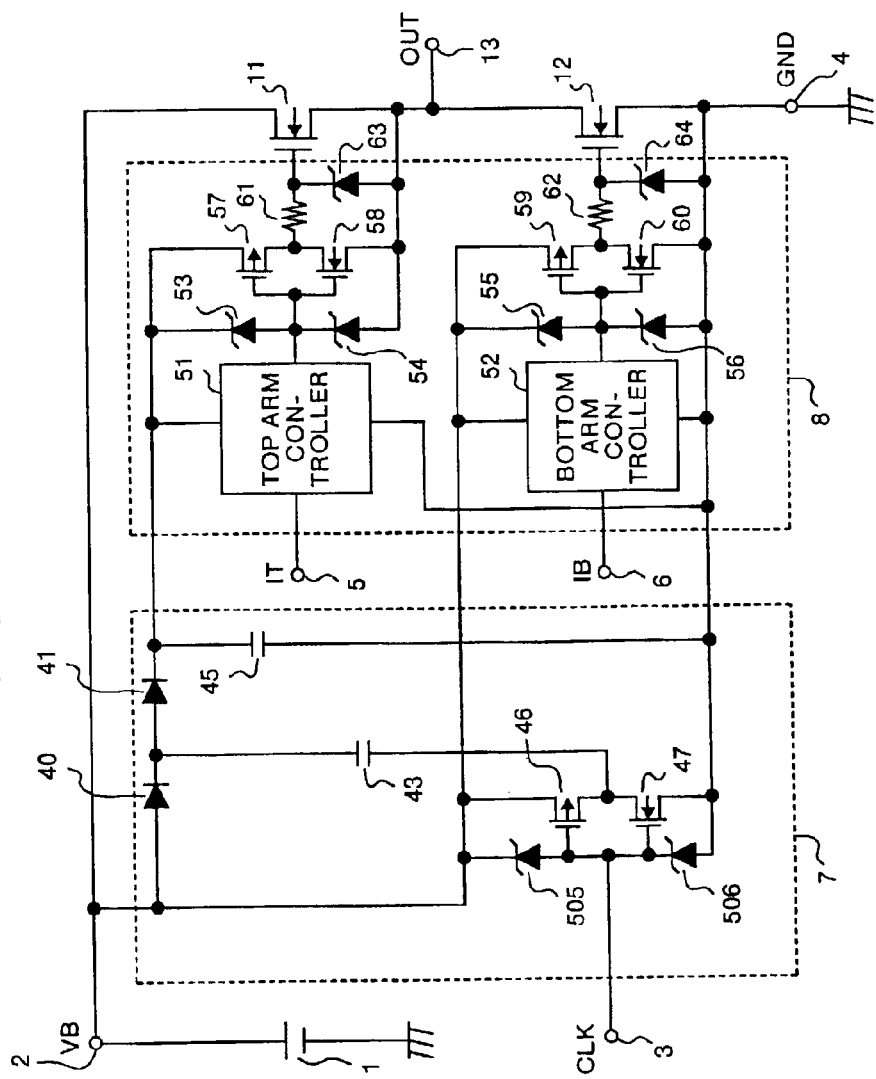
FIG. 68 is a circuit diagram which shows a conventional drive circuit.

The VCC power supply 66 is connected to the top arm driver 72 and the bottom arm driver 73 as a power supply thereof. The reason will now be explained. Signals input from a top arm control input signal terminal IT5 and a bottom arm control input signal terminal IB6 are signals supplied from the MCU and DSP. In other words, the amplitude of the input signal is in a range of 0 to 5 V. As a matter of fact, therefore, each of the top arm driver 72 and the bottom arm driver 73 includes a circuit that conducts level shift on, for example, 0–5 V-signal to yield a signal that drives an output transistor 11 or 12. This also holds true in FIG. 67 and FIG. 68 showing the conventional art. However, for brevity of explanation, illustration is omitted from FIG. 67 and FIG. 68.

The top arm driver 72 is grounded at both GND and VB. This is because a required element withstanding voltage is made low by driving a part of the circuit of the top arm driver 72 within a voltage range of VGT to VB. By way of a concrete example, FIG. 4 shows an internal circuit diagram of the top arm driver 72.

Figure 4:
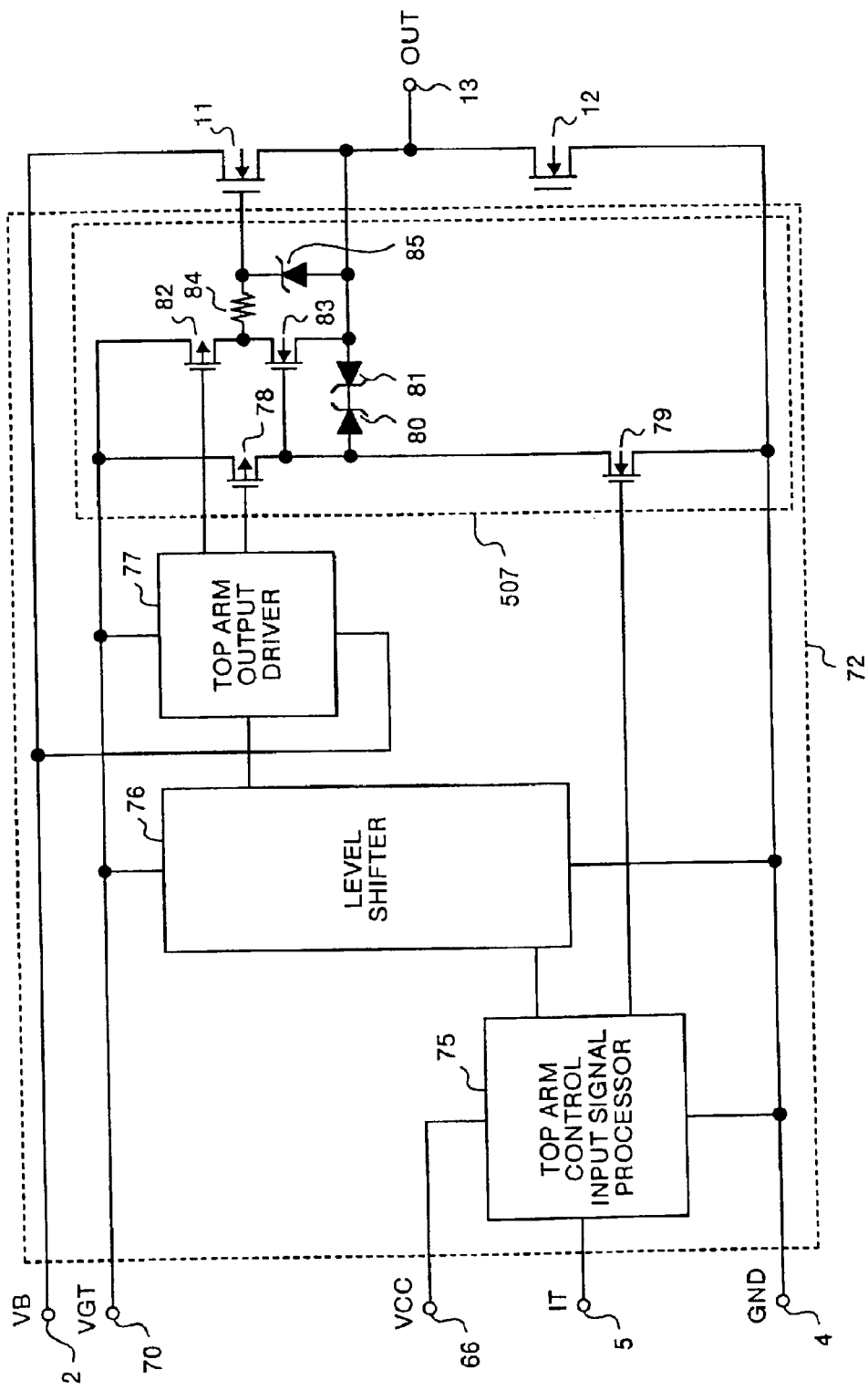
FIG. 4 is a circuit diagram which shows a top arm driver in the first embodiment of the present invention.

A circuit configuration of FIG. 4 includes a top arm control input signal processor 75 which conducts on a top arm control signal (IT) having an input amplitude between VCC and GND, and a level shifter 76 which shifts in level an output signal of the top arm control input signal processor 75 so as to provide therewith an amplitude between VGT and VB. The circuit configuration also includes a top arm output driver 77 which converts the level-shifted signal to a drive signal of the top arm 11, and a pre-output stage circuit 507 which receives a signal having an amplitude between VGT and VB output from the top arm output driver 77 and which drives the top arm transistor 11.

The pre-output stage circuit 507 includes PMOS transistors 78 and 82, NMOS transistors 79 and 83, a gate resistor 84, and Zener diodes 80, 81 and 85 for gate-source protection clamp of NMOS devices. The VB grounding of the top arm driver shown in FIG. 1 represents grounding of the top arm output driver 77 shown in FIG. 4.

Hereafter, how the problems of the conventional art are improved in FIG. 1 will be explained.

The first problem, i.e., the problem that the bottom arm drive capability falls when the power supply voltage falls is improved by using the voltage boosting power supply circuit 68 in order to drive the bottom arm 12. Even if VB falls as low as the lower limit (6 V when the 12 V battery power supply is used), the gate drive voltage 10 V of the bottom arm transistor can be ensured by using a voltage boosting power supply based on VCC with the bottom arm driver boosting power supply circuit 68 as the power supply of the bottom arm driver 73. That is the reason of the improvement.

The second problem, i.e., the problem that the drive power supply voltage of each of the top arm driver 72 and the bottom arm driver 73 becomes too large as compared with the voltage required for driving the gate is improved by using the bottom arm driver boosting power supply circuit 68 using VCC voltage.

For example, assuming that VCC=5 V and a charge pump circuit that conducts treble boosting is used in the bottom arm driver boosting power supply circuit 68, and neglecting the voltage loss in the circuit, it follows that VGB=15 V and VGT=VB+VGB=VB+15 V. At this time, the required withstanding voltage of the bottom arm driver 73 becomes at least 15 V. The with standing voltage of the top arm driver 72 becomes at least 5 V in the top arm control input signal processor 75 included in the internal configuration of the top arm driver 72 shown in FIG. 4, at least the VGT voltage (=VB+15 V) in the level shifter 76, at least 15 V in the top arm output driver 77, and at least the VGT voltage (=VB+15 V) in the pre-output stage circuit 507. The withstanding voltage becomes at least VB voltage in the output stage transistors 11 and 12.

Circuit blocks in which the withstanding voltage of elements needs to be altered so as to correspond to the VB voltage value include only the level shifter 76, the pre-output stage circuit 507, the output stage transistors 11 and 12, and the top arm drive boosting power supply circuit 67 in FIG. 1. Each block includes several elements. Even if the VB voltage changes steeply, an increase of element size is suppressed to a minimum and it becomes possible to prevent an increase of the manufacturing cost.

The third problem, i.e., the problem that the switching characteristics of the top arm 11 and the bottom arm 12 serving as the output transistors are changed by a variation of the power supply voltage VB is also improved by the same reason. Because it becomes possible to keep the influence of a change of the VB power supply voltage on the gate drive power supply voltage of the top arm 11 and the bottom arm 12 serving as the output transistors, to a minimum by using the bottom arm driver boosting power supply circuit 68 based on the VCC voltage and using the top arm driver boosting power supply circuit 67 based on VGB and VB, each of which is small in voltage change.

Figure 5:
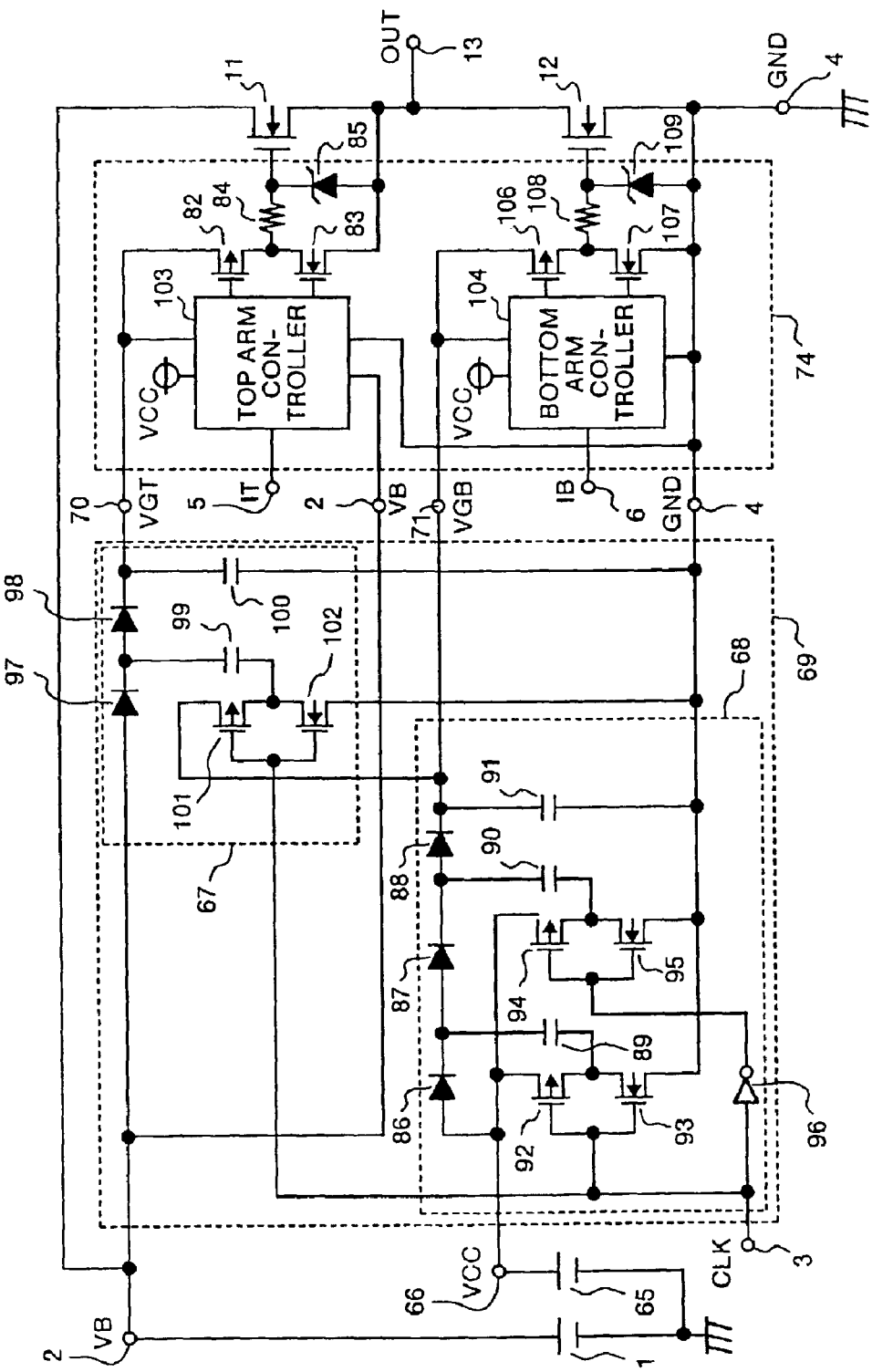
FIG. 5 is a circuit diagram which shows a drive circuit in the first embodiment of the present invention.

As another example of the first embodiment, a more detailed circuit diagram is shown in FIG. 5. In the bottom arm driver boosting power supply circuit 68 included in the VCC boosting power supply circuit 69, a charge pump circuit that conducts treble boosting on the VCC voltage includes elements 86 to 96. The top arm drive boosting power supply circuit 67 includes elements 97 to 102, and piles the VGB voltage above the VB voltage to form a power supply for top arm driving. The pre-drive circuit 74 includes a top arm controller 103 (which is a general term of the top arm control input signal processor 75, the level shifter 76, the top arm output driver 77, and the elements 78 to 81 in FIG. 4), elements 82 to 85, a bottom arm controller 104, and elements 106 to 109.

Deviating temporarily from the main theme, detailed operation of the charge pump circuit will be hereafter explained because it is needed in explaining operation of the drive circuit shown in FIG. 5.

Figure 6:
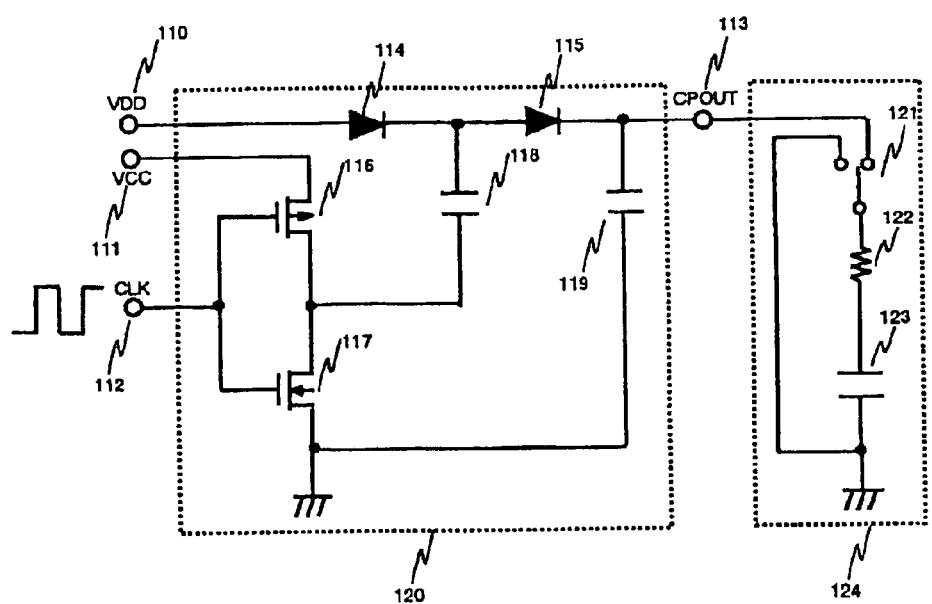
FIG. 6 is a circuit diagram which shows a charge pump circuit and a load model in the first embodiment of the present invention.

FIG. 6 is a simple model diagram for explaining the charge pump circuit and its load. As shown in FIG. 5, one of circuit groups includes rectifier diodes 86 and 87, a boosting capacitor 89, and an inverter formed of a PMOS transistor 92 and an NMOS transistor 93. Another one of the circuit groups includes rectifier diodes 87 and 88, a boosting capacitor 90, a decoupling capacitor 91, and an inverter formed of a PMOS transistor 94 and an NMOS transistor 95. Further another one of the circuit groups includes rectifier diodes 97 and 98, a boosting capacitor 99, a decoupling capacitor 100, and an inverter formed of a PMOS transistor 101 and an NMOS transistor 102. Each of the circuit groups corresponds to a charge pump voltage boosting power supply circuit indicated by reference numeral 120 of FIG. 6. A load circuit 124, which is a model of the load, models gate drive of the top arm transistor 11 or the bottom arm transistor 12.

First, circuit operation of the charge pump 120 will now be explained. An inverter formed of a PMOS transistor 116 and an NMOS transistor 117 is activated by a clock signal applied to a clock input terminal 112 (CLK). When the NMOS transistor 117 is on, a VDD voltage applied to a terminal 110 charges the boosting capacitor 118 through the rectifier diode 114. Denoting a forward voltage across the rectifier diode 114 by VF, therefore, a voltage across the capacitor 118 becomes VDD−VF if it is fully charged. When the PMOS transistor 116 is on, the charged voltage across the capacitor 118 is piled above the VCC voltage applied to an input terminal 111. Denoting a forward voltage drop across a rectifier diode 115 by VF, therefore, a voltage (Vcpout) output to a charge pump circuit output 113 (CPOUT) through the rectifier diode 115 is represented by expression (1).

$$Vcpout = (VDD-VF) + VCC-VF = VCC+VDD-2\cdot VF \quad (1)$$

A capacitor 119 is a decoupling capacitor, which removes output voltage ripple of the charge pump output (CPOUT) 113. Denoting a frequency of the clock input (CLK) 112 by fclk, on-resistance of the NMOS transistor 117 by Ron, and capacitance of the capacitor 118 by Cb, and assuming that the clock frequency has a duty of 50%, charged voltage Vcb at the capacitor 118 can be represented by expression (2).

$$Vcb = (VDD-VF) \times \left\{1 - \exp\left(-\frac{1}{2\cdot fclk \cdot Ron \cdot Cb}\right)\right\} \quad (2)$$

Typically, circuit design is conducted so as to fully charge the capacitor 118 (Cb) to charge voltage (VDD−VF) during the time when the NMOS transistor 117 is on. Placing expression (3) in the expression (2), therefore, it follows that P≅1.

$$P = 1 - \exp\left(-\frac{1}{2\cdot fclk \cdot Ron \cdot Cb}\right) \quad (3)$$

A voltage drop of the output voltage of the charge pump caused by the load will now be considered. If a load current is applied to the output of the charge pump, the charge of the fully charged boosting capacitor 118 is consumed. Denoting a voltage drop of the charge pump output voltage (CPOUT) due to the load by Vdrop and the load current by Icpout, the income and expenditure of charges consumed within one clock period are represented by expression (4).

$$Cb\cdot Vdrop = Icpout/fclk \quad (4)$$

From the expressions (3) and (4), expression (5) is obtained.

$$Vdrop = -2\cdot Ron\cdot \{ln(1-P)\}\cdot Icpout \quad (5)$$

From the expressions (1) and (5), therefore, the charge pump output voltage inclusive of the time when there is the load can be represented by expression (6).

$$Vcpout = VCC+VDD-2\cdot VF+2\cdot Ron\cdot \{ln(1-P)\}Icpout \quad (6)$$

Figure 7:
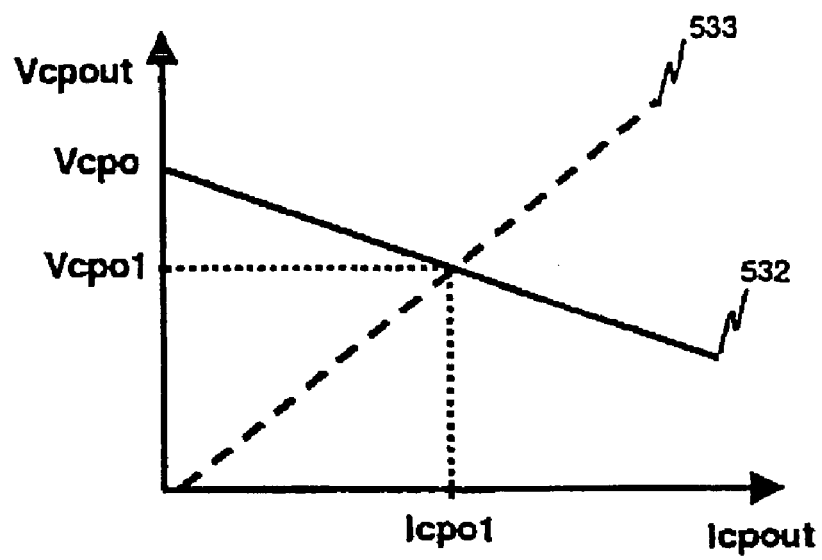
FIG. 7 is a characteristic diagram which shows a relation between an output voltage and an output current in the first embodiment of the present invention.

Since P≅1 as explained above, the charge pump output voltage (Vcpout) becomes a linear function of the load current (Icpout), and is represented by a solid line 532 shown in FIG. 7. Vcpo in FIG. 7 corresponds to VCC+ VDD−2·VF of the expression (6). The inclination of the straight line corresponds to −2·Ron·ln(1−P).

An actual charge pump load will now be explained. Charges consumed by the gate charge of the output stage NMOS transistors 11 and 12 of FIG. 5 occupy most of the charge pump load. If the output transistors 11 and 12 flow a large current, the transistor size also becomes large. Therefore, the input capacitance is also increased, and consequently the load current to the charge pump for gate drive becomes large.

It is supposed that the load model 124 of FIG. 6 represents the output transistor 11 or 12. When high voltage, large current drive is conducted, PWM drive is often employed in order to reduce the power consumption. At this time, output transistors repeat on/off operation in a certain fixed period. Referring to the load model 124, the operation is represented by switchover of a switch 121 at the fixed period. A resistor 122 represents the sum of an on-resistance of the top arm turn-on PMOS transistor 82 and resistance of the gate resistor 84, or the sum of an on-resistance of the bottom arm turn-on PMOS transistor 106 and resistance of the gate resistor 108 in FIG. 5. A capacitor 123 represents an input capacitor of the output transistor 11 or 12.

Figure 8:
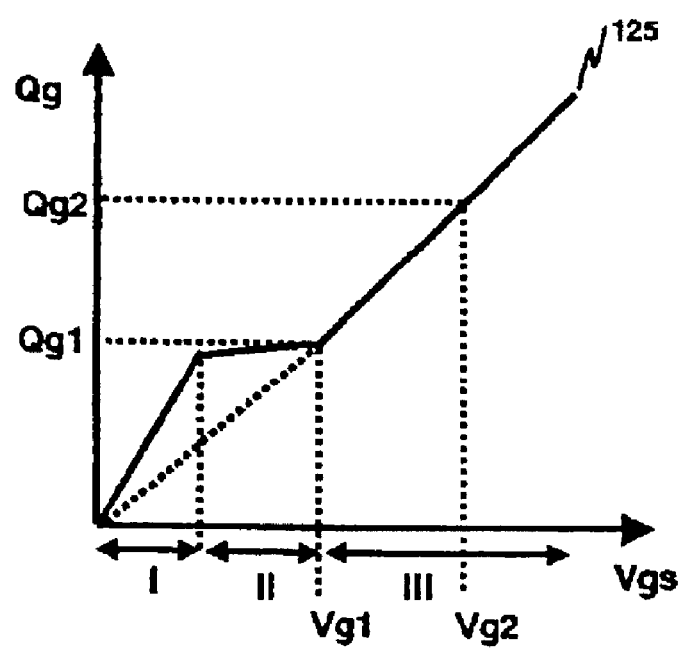
FIG. 8 is a characteristic diagram which shows a gate charge characteristic of an output NMOS transistor in the first embodiment of the present invention.

An actual output NMOS transistor has a gate charge characteristic as represented by a solid line 125 in FIG. 8. Letting a gate-source voltage required for a certain output current be Vg1 charges required for the current become Qg1. A region I represents a gate-source capacitance charging region where a required drain current is obtained.

A region II represents a charging region of gate-drain capacitance (Miller capacitance). A region III represents a state in which the input capacitance of the output transistor has been charged more than required charges. Under the typical use condition, the output NMOS transistor is used in a state provided with a margin with due regard to dispersion of a charge quantity Qg1 required for the output current. This state indicates a gate-source voltage Vg2 and charges Qg2 charged in the input capacitor. Vgs=8 to 10 V required to drive the output NMOS transistor corresponds to Vg2 of FIG. 8. Assuming that dQ/dV=Cg, the relation between the gate drive voltage (Vgs) and required charges (Qg) in the region III is represented by the following approximate expression (7).

$$Qg \approx Cg\cdot Vgs \quad (7)$$

The charges required to drive the gate are consumed in a period of the PWM frequency. For brevity, therefore, an averaged charge pump load current will now be considered. Denoting the average load current by Iave and the PWM frequency of the output stage transistor by fpwm, expression (8) is obtained.

$$Iave = Qg\cdot fpwm \quad (8)$$

As a matter of fact, the number of simultaneously driven output transistors is not limited to one as in the explanation of the actual use example with reference to FIG. 2 and FIG. 3. When one gate drive power supply is used, a maximum total of three top or bottom arm output transistors shown in FIG. 2 might simultaneously turn on in the same PWM period, and a maximum total of two top or bottom arm output transistors shown in FIG. 3 might simultaneously turn on in the same PWM period. Denoting the number of output transistors of each of the top and bottom arms that turn on in a PWM period by n, the expression (8) can be rewritten as expression (9).

$$Iave = n \cdot Qg \cdot fpwm \tag{9}$$

From the expressions (7) and (9), the average load current can be represented by expression (10).

$$Iave = n \cdot Cg \cdot Vgs \cdot fpwm \tag{10}$$

The gate drive voltage (Vgs) is exactly the output voltage (Vcpout) of the charge pump. The average load current (Iave) becomes the output current (Icpout) of the charge pump. Therefore, the average current required to drive the output transistors is also represented by a linear equation. As a result, a characteristic as represented by a broken line 533 in FIG. 7 is obtained.

As for (boosted output voltage of the charge pump, it is clear from the above consideration that an intersection of the charge pump load characteristic 532 of FIG. 7 and the average current characteristic 533 required to drive the output transistors is the actual output voltage of the charge pump. As for numerical expressions, letting Vcpout=Vgs and Icpout=Iave in expressions (6) and (8), expression (11) is obtained.

$$Vcpout = \frac{VCC + VDD - 2 \cdot VF}{1 - 2 \cdot n \cdot Cg \cdot Ron \cdot fpwn \cdot ln(1-P)} \tag{11}$$

Up to this point, the basic operation of the charge pump circuit has been explained. By using this way of thinking, the gate drive voltages of the top arm and the bottom arm in the concrete circuit of FIG. 5 will now be derived. It should be noted that the bottom arm driver is a charge pump circuit that conducts treble boosting and the top arm drive load current is added to the load current of the bottom arm driver boosting power supply circuit 68 because the bottom arm drive boosting power supply voltage (VGB) is used as a boost reference voltage of the top arm drive boosting power supply voltage (VGT). Assuming the output transistors 11 and 12 are the same transistors, and denoting the top arm drive load average current by Igt and the bottom arm drive load average current by Igb, expressions (12) and (13) are obtained from the expression (10).

$$Igb = n \cdot Cg \cdot VGB \cdot fpwm \tag{12}$$

$$Igt = n \cdot Cg \cdot (VGT-VB) \cdot fpwm \tag{13}$$

Denoting the forward voltage of the rectifier diodes 86 to 88, 97 and 98 by VF, and the on-resistance of the inverter output NMOS transistors 93, 94 and 102 by Ron, the top and bottom arm drive voltages at the time of the load currents can be expressed by expressions (14) and (15).

$$VGB = 3 \cdot VCC - 3 \cdot VF + 2 \cdot (2 \cdot Ron) \cdot \{ln(1-P)\} \cdot (Igb + Igt) \tag{14}$$

$$VGT - VB = VGB - 2 \cdot VF + 2 \cdot Ron \cdot \{ln(1-P)\} \cdot Igt \tag{15}$$

From the expressions (12) to (15), therefore, expressions (16) and (17) are obtained. However, α is expressed by expression (18).

$$VGB = \frac{3 \cdot (1 - 2\alpha) \cdot VCC - (2\alpha + 3) \cdot VF}{8\alpha^2 - 10\alpha + 1} \tag{16}$$

$$VGT - VB = \frac{3 \cdot VCC + (8\alpha - 5) \cdot VF}{8\alpha^2 - 10\alpha + 1} \tag{17}$$

$$\alpha = n \cdot Cg \cdot Ron \cdot fpwm \cdot ln(1-P) \tag{18}$$

The expressions (16) to (18) are results of derivation of the charge pump output voltage (Vcpo1), which indicates the top and bottom arm drive boosting power supply voltages (VGB and VGT) of the drive circuit of FIG. 5, i.e., which is an intersection of the charge pump load characteristic 532 and the load current characteristic 533 required to drive the output transistors shown in FIG. 7.

Referring back to FIG. 5 of the first embodiment, output voltages of the voltage boosting power supply will now be calculated under concrete conditions by actually using the expressions. As for a value of n, which indicates the number of output transistors turning on within a PWM period, it is now assumed that two transistors of each of the top and bottom arms turn on within a PWM period in the application as shown in FIG. 3 and one voltage boosting power supply circuit is connected to each transistor as each of the top and bottom arm gate drive power supplies.

In other words, it is assumed that one top arm drive boosting power supply circuit drives two top arm output transistors in a PWM period and one bottom arm drive boosting power supply circuit drives two bottom arm output transistors in a PWM period. In this instance, therefore, it follows that n=2. If an output current of approximately several A to 10 A is required, a value of Cg becomes approximately 0.5 to 2.0 nC/V. The value of Cg indicates the gate charge characteristic determined by the characteristic of the output transistors. Therefore, Cg is determined to be Cg=2.0 nC/V. However, this value depends also upon a wafer process applied to the output transistors, and therefore these values are approximate values.

On-resistance of the NMOS transistors of the inverter output is set equal to Ron=10 Ω. Since the frequency used as the PWM frequency is several tens kHz, fpwm is set equal to fpwm=20 kHz. As for P which indicates the rate of charging the boosting capacitor, typically P≅1 as explained above. If P is set equal to P=1, however, calculation cannot be conducted in the expressions. Therefore, P is set equal to P=0.99. Since the VCC voltage used as the power supply of the MCU and DSP is VCC=3.3 to 5.0 V as explained above, VCC is set equal to VCC=5 V. The forward voltage of the rectifier diode is set equal to VF=0.7 V which is a typical forward voltage value of a PN junction diode using a Si wafer.

Calculating the top and bottom arm drive boosting power supply voltages VGB and VGT of FIG. 5 from the expressions (16), (17) and (18) by using these values, results become VGB=12.6 V and VGT−VB=11.1 V. Assuming that a voltage in the range of 8 to 10 V is required as the gate-source voltage of the output transistors under the conditions, it becomes possible to ensure a gate drive voltage of at least 10 V in the present embodiment, even if the power supply voltage is, for example, VB=8 V.

According to the first embodiment, it becomes possible to drive stably the totem-pole connected output stage transistors with a power supply having a large voltage variation, such as a battery, even when the power supply voltage falls. Owing to such a configuration as to decrease the number of elements to which the power supply voltage is applied directly, it becomes possible to reduce the influence due to a change in power supply voltages on the gate drive characteristic of the output stage transistors, to suppress an increase in element size to a minimum, and prevent the manufacturing cost from rising.

Figure 9:
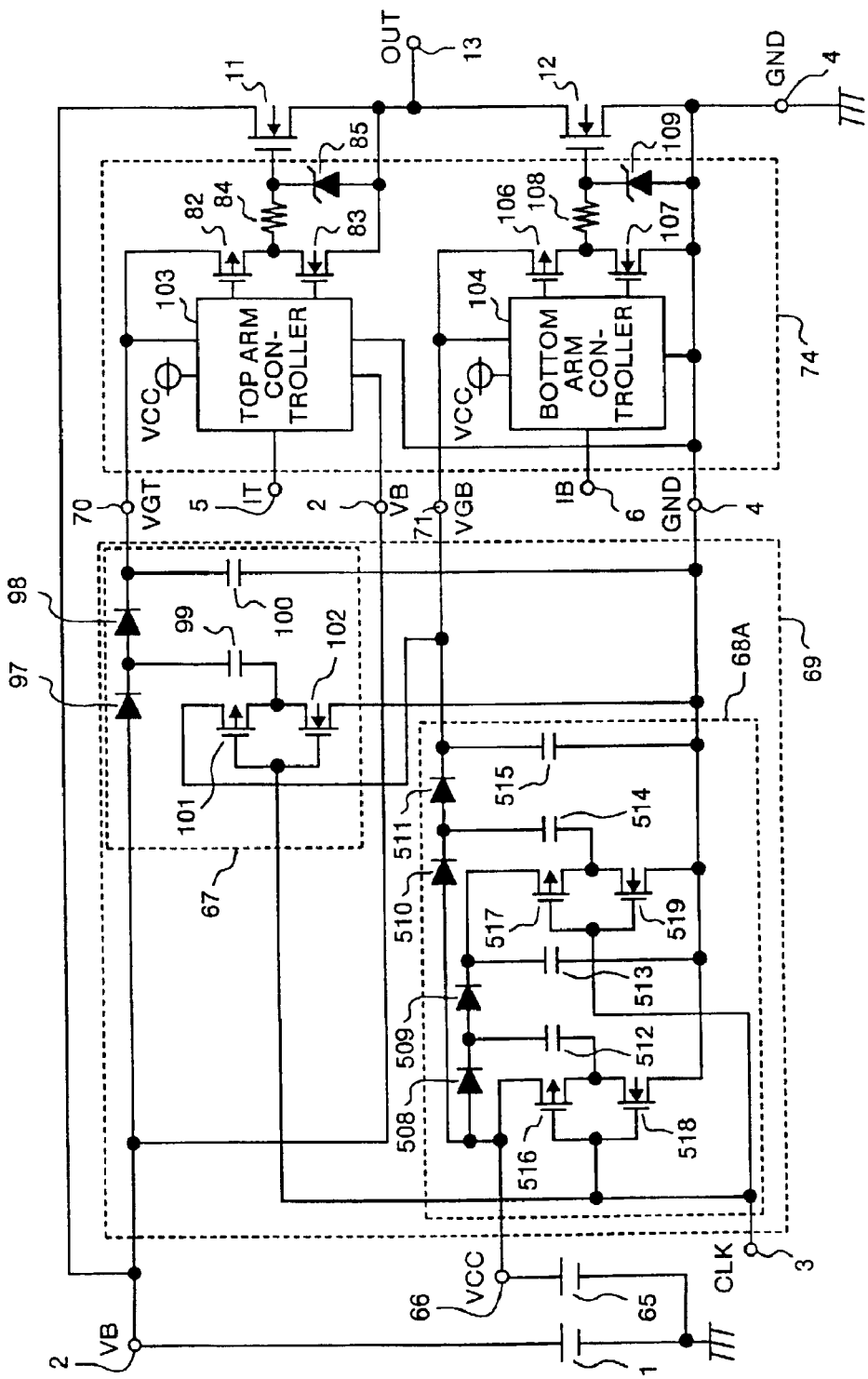
FIG. 9 is a circuit diagram which shows a drive circuit in a second embodiment of the present invention.

A second embodiment of this invention will be explained below. In FIG. 9, the bottom arm driver boosting power supply circuit 68 shown in FIG. 5 is replaced by a bottom arm driver boosting power supply circuit 68A. An object of this embodiment is to reduce the voltage ripple and switching noise in the output voltage of the charge pump boosting power supply circuit for driving a bottom arm by adding a decoupling capacitor 513.

Hereafter, a concrete circuit configuration and basic operation will be explained by referring to FIG. 9. A circuit includes rectifier diodes 508 and 509, capacitors 512 and 513, a PMOS transistor 516, and an NMOS transistor 518. This circuit is a charge pump circuit that double-boosts the VCC voltage. Another circuit includes rectifier diodes 510 and 511, capacitors 514 and 515, a PMOS transistor 517, and an NMOS transistor 519. This circuit is a circuit that piles the VCC voltage above the double-boosted voltage, i.e., that treble-boosts the VCC voltage. The bottom arm driver boosting power supply circuit 68A becomes a charge pump boosting power supply circuit for driving a bottom arm, and is used as the gate drive power supply of the bottom arm 12 and the boost reference voltage of the top arm drive boosting power supply circuit 67.

As compared with the circuit of FIG. 5, one decoupling capacitor 513 and one rectifier diode are added. The decoupling capacitor 513 is effective in reducing the output voltage ripple of the voltage boosting power supply circuit 68A. The added rectifier diode is needed to add the decoupling capacitor 513.

In the same way as the first embodiment, the detailed calculation value of the output voltage is represented by the following expression (19). A top arm drive boosting power supply circuit 67 is the same as that of FIG. 5, the expression (15) can be applied thereto.

$$VGB = 3 \cdot VCC - 4 \cdot VF + 2 \cdot (2 \cdot Ron) \cdot \{In(1-P)\} \cdot (Igb + Igt) \quad (19)$$

$$VGB = \frac{3 \cdot (1 - 2\alpha) \cdot VCC - 4 \cdot VF}{8\alpha^2 - 10\alpha + 1} \quad (20)$$

By conducting calculation using the expressions (12) and (13) in the same manner as that of the first embodiment, expressions (20) and (21) are obtained. Values obtained through the expressions become the top and bottom gate drive voltages of the circuit configuration of FIG. 9.

$$VGT - VB = \frac{3 \cdot VCC + (8\alpha - 6) \cdot VF}{8\alpha^2 - 10\alpha + 1} \quad (21)$$

$$VGB_{[First\ Embodiment]} > VGB_{[Second\ Embodiment]} \quad (22)$$

$$(VGT-VB)_{[First\ Embodiment]} > (VGT-VB)_{[Second\ Embodiment]} \quad (23)$$

Definition of α follows the expression (18). By calculating concrete values under the same condition as that of the first embodiment, VGB=11.9 V and VGT−VB=10.4 V are obtained. Therefore, expressions (22) and (23) hold true. As compared with the first embodiment, the boosted output voltages for the top arm and the bottom arm fall respectively in the circuit configuration of the second embodiment.

The result is caused by influence of addition of one rectifier diode. However, the boosted output voltage does not necessarily fall because of the following reason.

The power supply voltage of the charge pump inverter for treble boosting in the bottom arm driver boosting power supply 68A is altered due to alteration of the circuit configuration. In other words, among the inverter power supply including 94 and 95 of FIG. 5 and the inverter power supply including 517 and 519 of FIG. 9, the former one generates the VCC voltage and the latter one generates a boosted voltage obtained by conducting double boosting on VCC. When the level of the inverter input is high, i.e., the inverter NMOS (95 of FIG. 5 or 519 of FIG. 9) is on, the gate-source voltage becomes larger in the latter one. Therefore, the on-resistance decreases. In the expressions, the value of Ron decreases and the charge pump output voltage becomes large.

According to the second embodiment, a drive circuit having the same effect and function as the first embodiment can be obtained. This drive circuit can reduce in output voltage ripple and switching noise of the voltage boosting power supply can be obtained.

Figure 10:
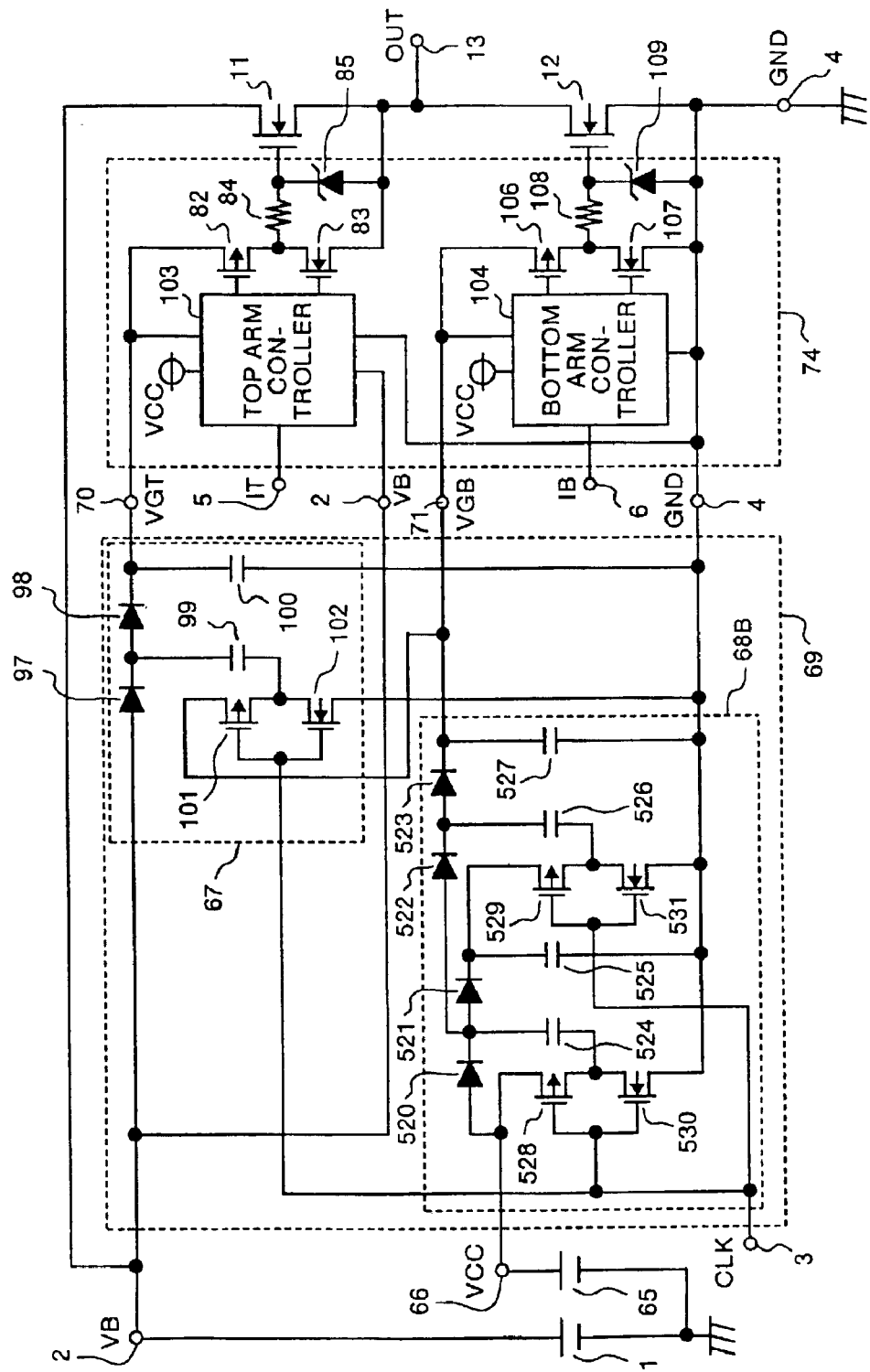
FIG. 10 is a circuit diagram which shows a drive circuit in a third embodiment of the present invention.

A third embodiment of this invention will be explained below. FIG. 10 shows a circuit that reduces the voltage ripple and switching noise of the output voltage (VGB, VGT) of the VCC boosting power supply circuit 69 shown in FIG. 5 and that improves the output current capability.

FIG. 10 differs from FIG. 5 in that an inverter of the first stage including a PMOS transistor 528 and an NMOS transistor 530 charges a boosting capacitor 524 with the VCC voltage through a rectifier diode 520, and piles the charged voltage above the VCC voltage to conduct the double boosting. The double-boosted voltage is used as both a power supply of an inverter of a second stage including a PMOS transistor 529 and an NMOS transistor 531 through a rectifier diode 521 and a charged voltage for the boosting capacitor 526 through a rectifier diode 522. In other words, double boosting is conducted on the double boosting power supply. Therefore, a voltage obtained by quadruple-boosting the VCC voltage becomes an output voltage (VGB) of a bottom arm driver boosting power supply circuit 68B. Thus, it becomes possible to increase the output voltage with the same number of elements as that of FIG. 9. Further, in the power supply circuit 68B, reference numeral 523 represents a rectifier diode, and 527 a capacitor. The top arm drive boosting power supply circuit 67 has the same circuit configuration as that of FIG. 5 and FIG. 9.

By calculating the output voltages in the same way as the first embodiment and the second embodiment, the expressions (24) and (15) are obtained. Conducting the calculation by using the expressions (12) and (13), expressions (25) and (26) are obtained. Definition of a follows the expression (18) in the same way as the first and second embodiments.

$$VGB = 4 \cdot VCC - 3 \cdot VF + 2 \cdot (2 \cdot Ron) \cdot \{In(1-P)\} \cdot (Igb + Igt) \quad (24)$$

$$VGB = \frac{4 \cdot (1 - 2\alpha) \cdot VCC - (2\alpha + 3) \cdot VF}{8\alpha^2 - 10\alpha + 1} \quad (25)$$

$$VGT - VB = \frac{4 \cdot VCC + (8\alpha - 1) \cdot VF}{8\alpha^2 - 10\alpha + 1} \quad (26)$$

In the first and second embodiments, it has been assumed that two transistors (n=2) of each of the top and bottom arms in the output stage of FIG. 3 turn on in a PWM period and a current in the range of approximately several A to 10 A is flown through the output load of FIG. 3. However, it is now assumed that the output form and output load as shown in FIG. 2 are used and a current in the range of approximately 10 A to 50 A is flown through the output load.

First, when driving the three-phase motor as shown in FIG. 2, three output transistors exist in each of the top arm and the bottom arm. A maximum of three transistors turn on in a PWM period, although it depends on the PWM system as well. Therefore, it follows that n=3.

In order to flow an output current in the range of 10 A to 50 A, an output transistor having Cg in the range of 2 to 10 nC as the gate charge characteristic is needed. Therefore, Cg is set equal to Cg=10 nC/V. Other variables are set equal to Ron=10 Ω, fpwm=20 kHz, P=0.99, VCC=5 V, and VF=0.7 V in the same way as the first and second embodiments. In the circuit form of the first embodiment, VGB=10.7 V and VGT−VB=8.8 V are obtained. In this embodiment, VGB= 14.9 V and VGT−VB=12.7 V are obtained from the expressions (25) and (26) in the same way. Even under such a condition that a top arm gate drive voltage of at least 10 V cannot be ensured in the first and second embodiments, a gate drive voltage of at least 10 V can be ensured in the present embodiment.

Thus, according to the circuit configuration of the third embodiment, a drive circuit improved in output current capability of the voltage boosting power supplies can be obtained with the same number of elements as that of the second embodiment, i.e., with the same circuit scale as that of the second embodiment.

A fourth embodiment of this invention will be explained below. In the third embodiment, the output current has been supposed to be in the range of 10 A to 50 A as an example of a concrete condition. If it is supposed that a current in the range of approximately 50 A to several hundreds A is flown, however, a value of Cg which indicates the gate charge characteristic of the output transistors will be at least a numerical value in the range of approximately 10 to 25 nC/V. Assuming that Cg=25 nC/V and other conditions are equivalent to values used in calculation of the third embodiment (i.e., n=3, Ron=10 Ω, fpwm=20 kHz, P=0.99, VCC=5 V, and VF=0.7 V), VGB=12.0 V and VGT−VB=9.3 V are obtained in the circuit of FIG. 10 of the third embodiment from the expressions (25) and (26). The top arm gate drive voltage thus falls below 10 V. That is, if the output current becomes large, the capability of the voltage boosting power supply for gate drive becomes insufficient sometimes even in the drive circuit of the third embodiment.

Figure 11:
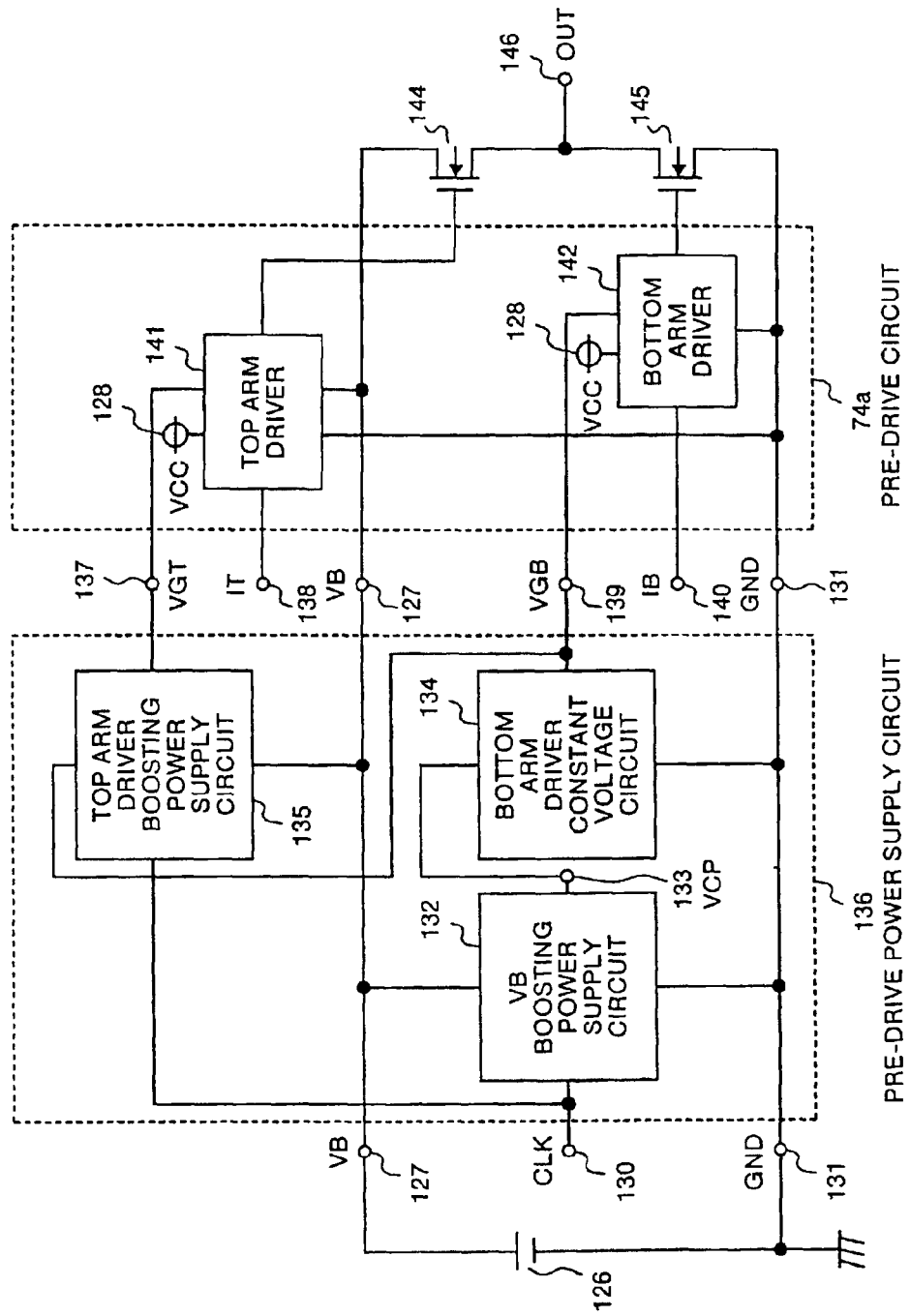
FIG. 11 is a block diagram which shows a fourth embodiment of the present invention.

FIG. 11 shows a drive circuit of the fourth embodiment, which is provided to solve the problem. In FIG. 11, the drive circuit includes a pre-drive power supply circuit 136, a pre-drive circuit 74a, and totem-pole connected output stage transistors 144 and 145. The pre-drive power supply circuit 136 includes a VB boosting power supply circuit 132, a bottom arm driver constant voltage circuit 134, and a top arm driver boosting power supply circuit 135. The VB boosting power supply circuit 132 is activated by a CLK signal supplied from a clock input terminal 130, and uses VB power supply on a terminal 127 as the reference voltage. The bottom arm driver constant voltage circuit 134 uses a boosted output (VCP) of the VB boosting power supply circuit 132 as a power supply. The top arm driver boosting power supply circuit 135 uses a bottom arm gate drive power supply voltage output from the bottom arm driver constant voltage circuit 134 as VGB and piles the bottom arm driver power supply voltage VGB on a terminal 139 above the VB power supply voltage. The pre-drive power supply circuit 136 uses an output voltage of the top arm drive boosting power supply circuit 135 as a top arm drive gate power supply voltage VGT on a terminal 137.

The pre-drive circuit 74a has the same circuit configuration as that of the first to third embodiments. The pre-drive circuit 74a includes a top arm driver 141 and a bottom arm driver 142. The top arm driver 141 uses VCC and VGT as its power supplies and uses VB and GND 131 as its ground. The bottom arm driver 142 uses VCC and VGB as its power supplies and uses GND 131 as its ground. Further, reference numeral 138 represents a top arm control signal input terminal IT, 140 a bottom arm control input terminal IB, and 146 an output terminal.

The VB boosting power supply circuit 132 is used only as a power supply of the bottom arm driver constant voltage circuit 134. Therefore, the VB boosting power supply circuit 132 may only ensure at least a power supply voltage at which the bottom arm driver constant voltage circuit 134 can output a constant voltage when the load due to gate drive of the top and bottom arms 144 and 145 is applied. In other words, the output voltage VCP of the VB boosting power supply circuit 132 should be at least the constant voltage as the output voltage VGB of the bottom arm driver constant voltage circuit 134 even when the load is applied. If the output voltage VCP of the VB boosting power supply circuit 132 is set equal to a sufficiently high voltage and the bottom arm driver constant voltage circuit 134 maintains the constant voltage even if it is considered that a voltage drops when the gate drive load currents of the top and bottom arms are applied, then VGB changes little. By using the constant voltage as the boost reference voltage of the top arm drive boosting power supply circuit 135, the gate drive power supply capability is improved.

By thus using the VB boosting power supply circuit in order to generate the gate drive power supplies VGB and VGT in the same way as the first to third embodiments, it becomes possible to prevent the gate drive voltage of the output transistors from falling when the power supply voltage falls. Further, by thus using the constant voltage source as the bottom arm gate drive power supply and using the voltage boosting power supply as the top arm drive power supply based on the constant voltage as the reference voltage, it also becomes possible to prevent the switching characteristics of the output transistors from being changed by a change in the power supply voltage. The pre-drive circuit 74a is a circuit similar to that of the first to third embodiments. Therefore, the number of elements to which the power supply voltage is applied directly is reduced, and consequently the manufacturing cost is reduced, as explained with reference to the first embodiment. As a result, a circuit that can be applied to a wide range of power supply voltages is obtained.

Figure 21:
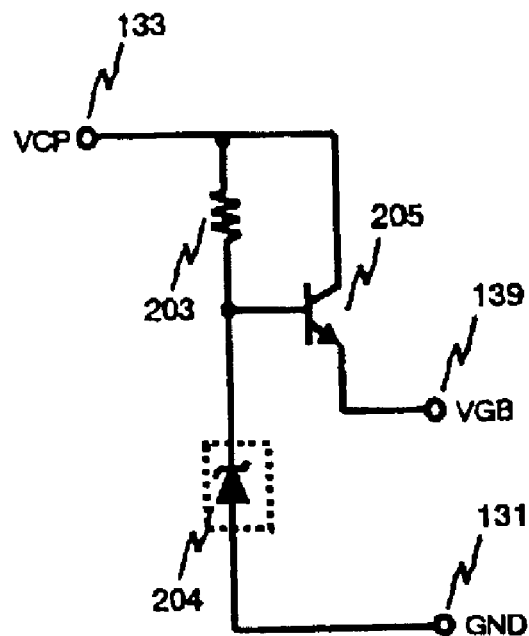
FIG. 21 is a circuit diagram of a constant voltage circuit utilizing an NPN transistor for a constant voltage circuit for bottom arm driving as an output stage that shows a twelfth embodiment of the present invention.
Figure 27:
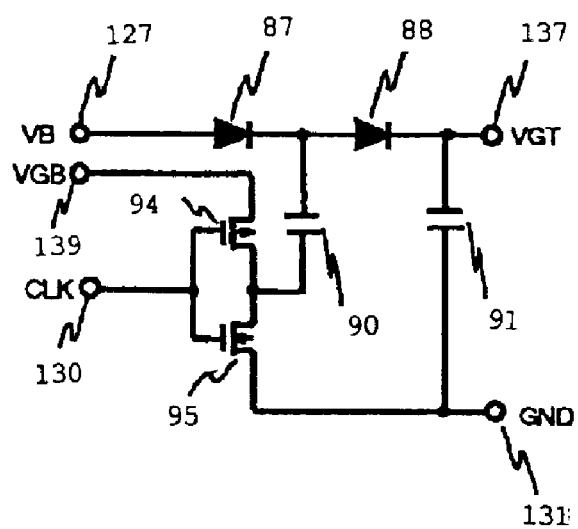
FIG. 27 is a circuit diagram of a voltage boosting power supply circuit for top arm driving that shows a seventeenth embodiment of the present invention.

As for concrete circuits of the VB boosting power supply circuit 132, the bottom arm driver constant voltage circuit 134 and the top arm drive boosting power supply circuit 135, there are various selection branches depending upon the characteristics, drive conditions and power supply voltage (VB) of the output transistors 144 and 145. Therefore, individual concrete examples will be presented in fifth to eighteenth embodiments explained below. In order to compare in capability with the fourth embodiment, concrete calculation will now be conducted in an example of the circuit under the same condition as that of the detailed calculation of the fourth embodiment. It is now assumed that a circuit example shown in FIG. 13 is used as the VB boosting power supply circuit 132, a circuit example shown in FIG. 21 is used as the bottom arm driver constant voltage circuit 134, and a circuit example shown in FIG. 27 are used as the top arm drive boosting power supply circuit, respectively.

Figure 13:
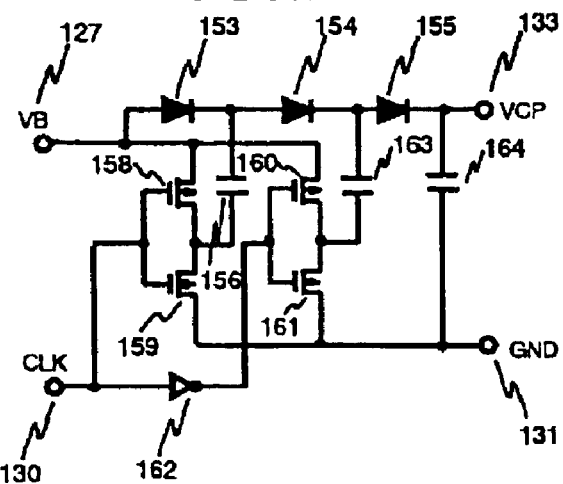
FIG. 13 is a circuit diagram of a treble boosting charge pump circuit for a voltage boosting power supply circuit that shows a sixth embodiment of the present invention.

The circuit example of FIG. 13 becomes a charge pump circuit for treble-boosts a voltage in the same way as the bottom arm driver boosting power supply circuit 68 (FIG. 5) of the first embodiment. Therefore, output (VCP) of the voltage boosting power supply is represented as expression (27).

$$VCP = 3 \cdot VB - 3 \cdot VF + 2 \cdot (2 \cdot Ron) \cdot \{ln(1-P)\} \cdot (Igb+Igt) \quad (27)$$

Igb and Igt are prescribed in the expressions (12) and (13). Assuming now that a gate drive voltage of 10 V can be maintained for both the top arm 144 and the bottom arm 145, it follows that VGB=10 V and VGT−VB=10 V. Assuming that the condition values used when the capability of the circuit in the third embodiment is calculated at the beginning of the explanation of the present embodiment are satisfied, i.e., n=3, Cg=25 nC/V, Ron=10 Ω, fpwm=20 kHz, P=0.99 and VF=0.7 V, and that the power supply voltage VB has fallen to 8 V, VCP=16.4 V is obtained from the expressions (12), (13) and (27).

The example of the constant voltage circuit of FIG. 21 is a circuit that generates a constant voltage, which is lowered from the constant voltage of a Zener diode by an emitter-base voltage of an NPN transistor. For example, assuming that a Zener voltage is VZ=14 V and the power supply voltage is VCP=16.4 V as calculated above, the Zener diode can turn on. Assuming that the base-emitter voltage of the NPN transistor is Vbe=0.7 V, therefore, VGB=13.3 V is obtained.

Finally, the circuit example of FIG. 27 has the same circuit configuration as that of the double boosting charge pump circuit explained with reference to FIG. 6. Therefore, expression (28) can be obtained from the expression (11). At this time, VGT−VB=11.1 V is obtained.

$$VGT - VB = \frac{VGB - 2 \cdot VF}{1 - 2 \cdot n \cdot Cg \cdot Ron \cdot fpwn \cdot In(1-P)} \quad (28)$$

In the third embodiment, the top and bottom arm gate drive voltages are VGB=12.0 V and VGT−VB=9.3 V, respectively. On the other hand, by applying the drive circuit of the fourth embodiment, the top and bottom arm gate drive voltages become VGB=13.3 V and VGT−VB=11.1 V, respectively. Therefore, it is appreciated that the capability has been further improved.

According to the fourth embodiment, it becomes possible to obtain a drive circuit that achieves effects similar to those of the first embodiment and that is improved in output voltage capability of the top and bottom arm gate drive power supplies as compared with the third embodiment.

A fifth embodiment of this invention will be explained below. By applying the double boosting charge pump circuit shown in FIG. 12 to the VB boosting power supply circuit 132 of FIG. 11, effects similar to those of the fourth embodiment can be obtained.

Detailed operation of the double boosting charge pump circuit has been explained with reference to the first embodiment. Therefore, detailed explanation will be omitted. Note that reference numeral 149 represents a capacitor, and 150 a PMOS transistor.

A sixth embodiment of this invention will be explained below. By applying the treble boosting charge pump circuit of FIG. 13, which is similar to the bottom arm driver boosting power supply circuit 68 (FIG. 5) of the first embodiment, to the VB boosting power supply circuit 132 of FIG. 11, effects similar to those of the fifth embodiment can be obtained.

The present embodiment has an effect that an output voltage (VCP) further greater than that of the fifth embodiment is obtained by applying the treble boosting power supply circuit thereto. Detailed operation of the treble boosting charge pump circuit has been explained with reference to the first embodiment. Therefore, detailed explanation will be omitted.

Figure 14:
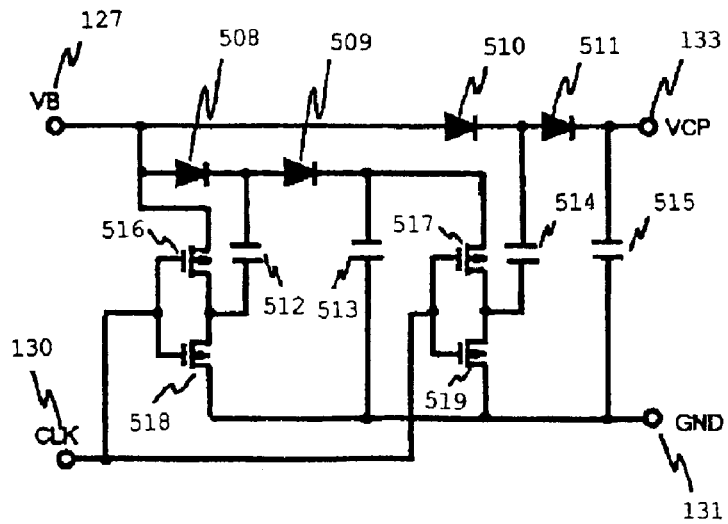
FIG. 14 is a circuit diagram of a treble boosting charge pump circuit for a voltage boosting power supply circuit that shows a seventh embodiment of the present invention.

A seventh embodiment of this invention will be explained below. By applying a treble boosting charge pump circuit of FIG. 14, which is equivalent to the bottom arm driver boosting power supply circuit 68A (FIG. 9) of the second embodiment, to the VB boosting power supply circuit 132 of FIG. 11, it is possible to obtain a circuit further reduced in voltage ripple and switching noise of the boosted output (VCP) as compared with the fourth embodiment. Detailed operation of FIG. 14 has been explained with reference to the second embodiment. Therefore, detailed explanation will be omitted.

Figure 15:
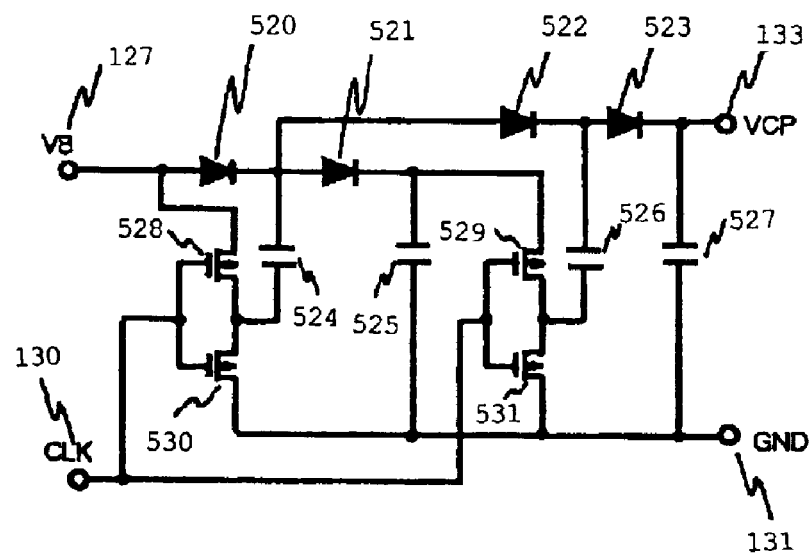
FIG. 15 is a circuit diagram of a charge pump circuit for a voltage boosting power supply circuit that shows an eighth embodiment of the present invention.

An eighth embodiment of this invention will be explained below. By applying a charge pump circuit of FIG. 15, which is equivalent to the bottom arm driver boosting power supply circuit 68B (FIG. 10) of the third embodiment, to the VB boosting power supply circuit 132 of FIG. 11, it is possible to obtain a circuit further improved in output capability as compared with the seventh embodiment. Detailed operation of FIG. 15 has been explained with reference to the third embodiment. Therefore, detailed explanation will be omitted.

A ninth embodiment of this invention will be explained below. Each of the charge pump circuits of the fifth to eighth embodiments requires an inverter that is activated by the clock signal (CLK) to charge the boosting capacitor and perform voltage piling. As explained with reference to the first to fourth embodiments, the on-resistance (Ron) of the NMOS transistor of the inverter affects the load characteristic of the charge pump circuit. In order to obtain a large amount of output, therefore, the on-resistance must be made smaller. In an integrated circuit, this results in expansion of a device area of the NMOS transistor. In an electric circuit formed of discrete components, this results in an increase of a unit price of the NMOS transistor. Therefore, an increase in manufacturing cost is incurred.

Figure 16:
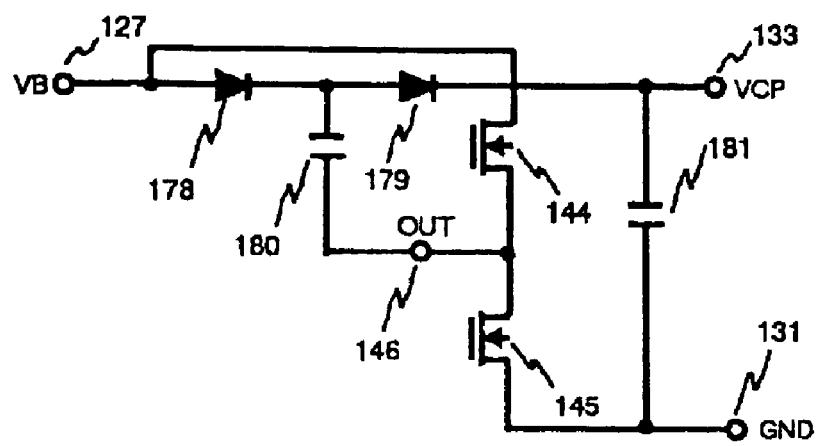
FIG. 16 is a circuit diagram of a charge pump circuit utilizing output stage transistors for a voltage boosting power supply circuit that shows a ninth embodiment of the present invention.

FIG. 16 shows a circuit in which the top and bottom arm transistors at the output stage are substituted for the inverter circuit in the charge pump. When the output stage transistors conduct PWM drive, the top arm 144 and the bottom arm 145 conduct inverter operation in the PWM period. Therefore, it becomes possible to form a double boosting charge pump circuit by adding rectifier diodes 178 and 179, a boosting capacitor 180 and a decoupling capacitor 181.

FIG. 16 shows a double boosting charge pump circuit. However, the treble boosting charge pump circuit of the sixth to eighth embodiments can also be implemented in a form utilizing the output stage transistors in the same way.

According to the ninth embodiment, the top and bottom arm transistors at the output stage are thus utilized as boosting inverter of the voltage boosting power supply circuit of the fourth embodiment. As a result, the drive circuit reduced in circuit scale can be obtained.

Figure 17:
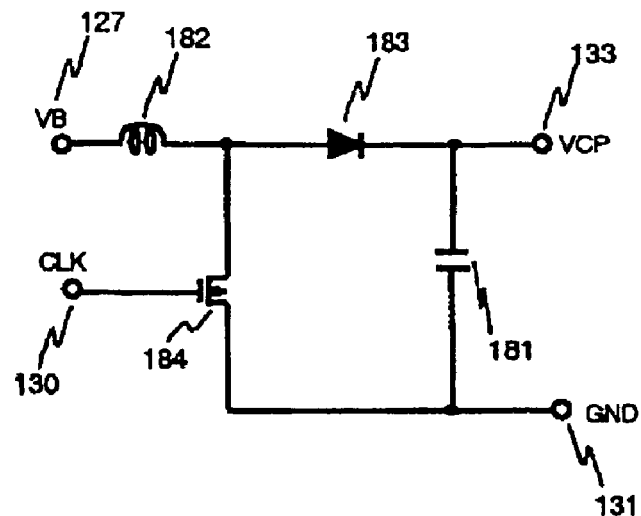
FIG. 17 is a circuit diagram of a step-up converter circuit for a voltage boosting power supply circuit that shows a tenth embodiment of the present invention.

A tenth embodiment of this invention will be explained below. As the VB boosting power supply circuit 132 of FIG. 11, a step-up converter utilizing a coil as shown in FIG. 17 can be applied. In FIG. 17, an NMOS transistor 184 is turned on and off according to a clock input (CLK). When the NMOS transistor 184 is on, a current flows from the power supply (VB) to the transistor 184 through a coil 182. When the NMOS transistor 184 is off, magnetic energy stored across the coil flows through a rectifier diode 183 as a current. Thus, the VB voltage plus the voltage across the coil, i.e., a boosted voltage is output to an output terminal VCP.

According to the tenth embodiment, effects similar to those of the fourth embodiment can also be obtained by using the voltage boosting power supply circuit, i.e., step-up converter using the coil as the voltage boosting power supply circuit of the fourth embodiment.

An eleventh embodiment of this invention will be explained below. The tenth embodiment is the drive circuit that conducts boosting by utilizing a coil. When the coil load is applied to a circuit that performs PWM-driven as explained in Background of the Invention, however, the eleventh embodiment is provided to substitute the output coil load for the boosting coil of the tenth embodiment. Effects similar to those of the tenth embodiment can be obtained. A concrete circuit example of the embodiment is shown in FIG. 18.

Figure 18:
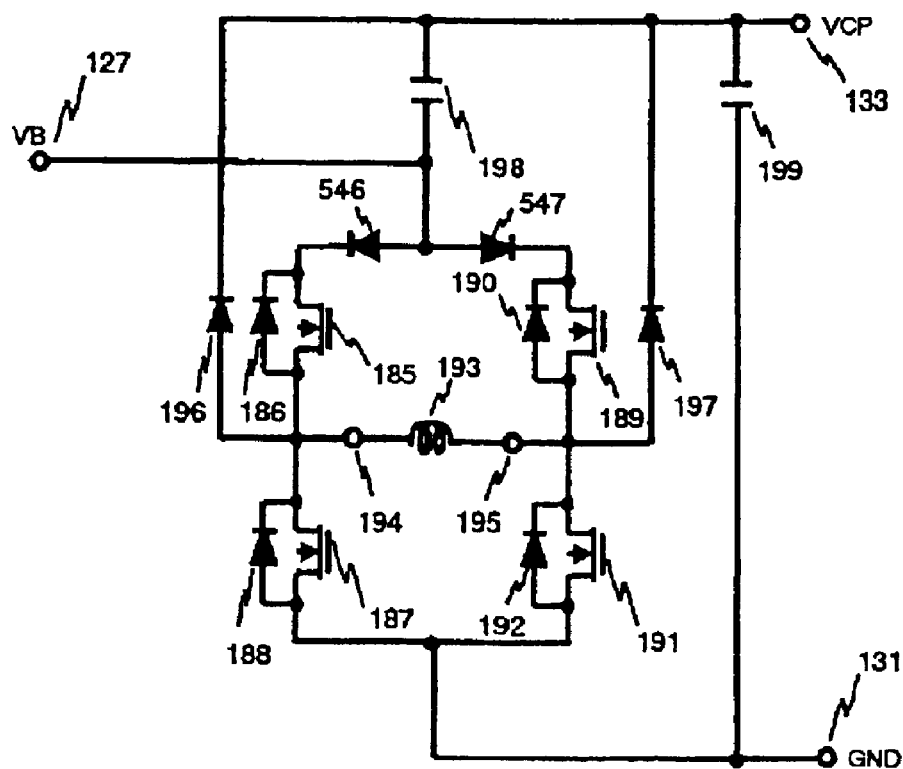
FIG. 18 is a circuit diagram of a voltage boosting power supply circuit utilizing output stage transistors and a coil load that shows an eleventh embodiment of the present invention.

FIG. 18 is a circuit diagram of a voltage boosting power supply circuit that uses a coil for boosting in the same way as FIG. 17. In FIG. 18, however, the output coil load as shown in FIG. 3 is used as the coil. In a MOS transistor having aback gate connected to its source, a parasitic diode, such as 186, 188, 190 or 192 shown in FIG. 18, is typically added between its source and its drain in transistor structure, although omitted in FIG. 3. Diodes 546, 547, 196 and 197 are rectifier diodes that ensure a charging path used to charge a boosting capacitor 198 from the coil. A capacitor 199 is a decoupling capacitor of a boosted output. Further, in FIG. 18, reference numerals 185, 187, 189, and 191 represent output transistors, and 193 a coil.

Hereafter, detailed operation will be explained.

According to the PWM system, the charging path to the boosting capacitor 198 differs. As examples, therefore, two PWM system are shown in FIGS. 19A, 19B, and FIGS. 20A, 20B.

Figure 19B:
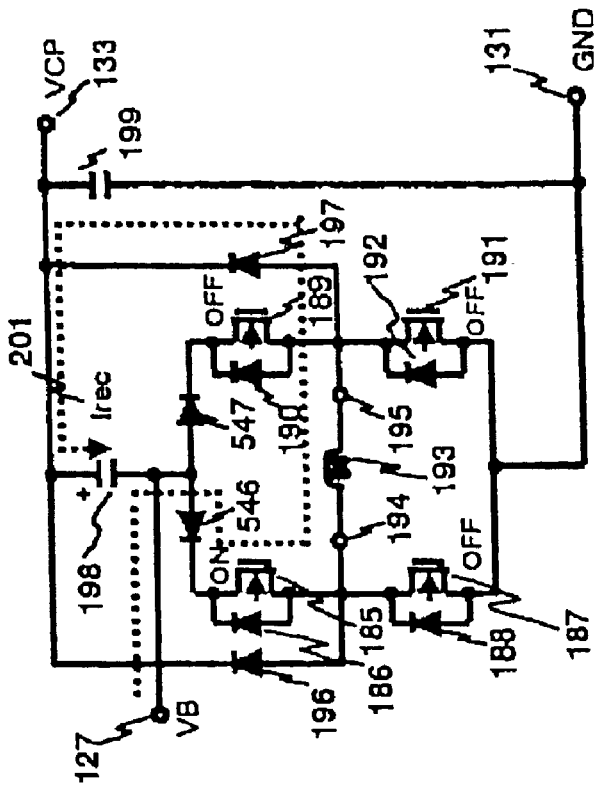
FIGS. 19A and 19B are diagrams for explaining PWM operation at the time of slow decay that show concrete boost operation of the eleventh embodiment of the present invention.
Figure 19A:
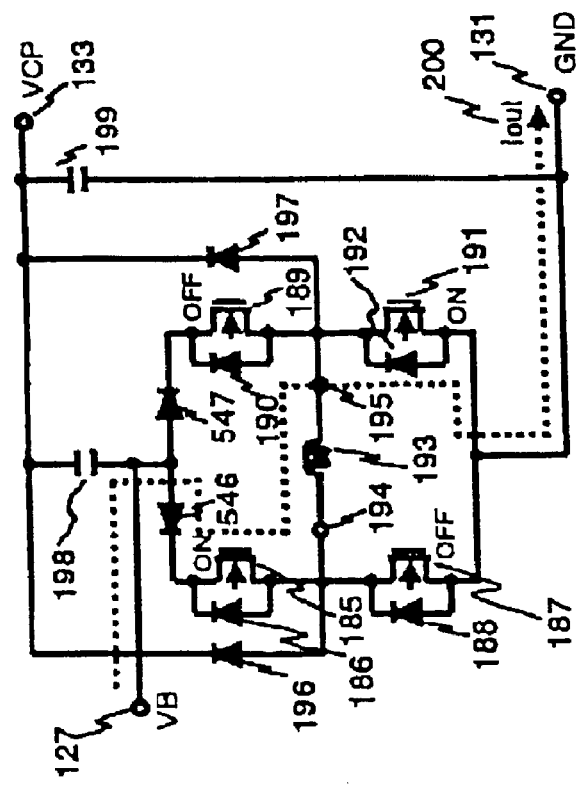

FIG. 19A shows the circuit at the time of PWM conduction, i.e., when a current is flown through the coil load. When the top arm transistor 185 of an output 194 is on and the bottom arm transistor 191 of an output 195 is on, an output current (Iout) 200 flows through the coil load 193 from the output 194 to the output 195. In a state of recirculation section of PWM, the output state is switched over to the state as shown in FIG. 19B and a bottom arm transistor 191 of the output 195 turns off. Energy stored across the coil is recirculated through a current path 201 (Irec). Therefore, the boosting capacitor 198 is charged, and boosted voltage is output to a VCP output 133.

The output stage that is performing the PWM operation is switched from the conduction state of FIG. 19A to the recirculation state of FIG. 19B within a PWM period. When the next PWM period starts, the output stage is switched over to the state of FIG. 19A. Therefore, charging the capacitor 198 at the time of recirculation is repeated. In principle, the PWM recirculation system of FIG. 19A and FIG. 19B recirculations the coil energy by short-circuiting across the coil at the time of recirculation. Accordingly, the recirculation speed is slower than that of the system, explained later, shown in FIG. 20A and FIG. 20B. Therefore, the system of FIG. 19A and FIG. 19B is called slow decay system.

A state diagram at the time of PWM conduction shown in FIG. 20A is completely the same as FIG. 19A. At the time of recirculation shown in FIG. 20B, the output transistors 185 and 191 which have been in the on-state at the time of conduction shown in FIG. 20A, are turned off, and the output transistors 189 and 187 which have been in the off-state at the time of conduction shown in FIG. 20A, are turned on. As a result, a recirculated current flows through a current path 202 (Irec), and the boosting capacitor 198 is charged. As a result, a boosted voltage is output to a VCP output in the same way as FIG. 19B. In principle, the PWM recirculation system is a system that recirculates the coil energy by applying voltages having different polarities to both ends of the coil at the time of recirculation. Accordingly, the recirculation speed is faster than that of the system shown in FIG. 19A and FIG. 19B. Therefore, the system of FIG. 20A and FIG. 20B is called fast decay system.

As heretofore explained, the voltage boosting power supply circuit utilizing the recirculation current of PWM becomes as shown in FIG. 18. FIG. 18 and the foregoing explanation are based on the output stage configuration supposing a DC motor with reference to FIG. 3. However, a similar circuit as the output stage configuration supposing a three-phase brushless motor can also be applied to the configuration as shown in FIG. 2.

According to the eleventh embodiment, effects similar to those of the fourth embodiment can be obtained by using an output coil load and output stage transistors as the voltage boosting power supply circuit of the fourth embodiment and by using the voltage boosting power supply circuit that conducts boosting by utilizing the PWM recirculation. In addition, the drive circuit reduced in circuit scale can be obtained.

A twelfth embodiment of this invention will be explained below. A constant voltage circuit that uses an NPN transistor 205 as the output transistor as shown in FIG. 21 can be applied to the bottom arm driver constant voltage circuit 134 of FIG. 11. A Zener diode 204 of FIG. 21 is used to generate a constant voltage. The Zener diode 204 may be replaced with a constant voltage circuit having little output current capability, such as a band gap circuit. A resistor 203 is a limit resistor that determines a current flown through the Zener diode 204 serving as a constant voltage generation section. This resistor 203 can be replaced with a constant current source. The output transistor 205 generates the constant voltage dropped by the emitter-base voltage on a VGB output terminal.

According to the twelfth embodiment, the drive circuit that uses an NPN transistor as the output transistor of the bottom arm driver constant voltage circuit in the, fourth embodiment can be obtained.

A thirteenth embodiment of this invention will be explained below. If the NPN transistor 205 is used as the output transistor in the twelfth embodiment, then it is necessary to always supply a base current depending upon the output current and the NPN transistor characteristic (hfe) in order to output a current. Since the output (VCP) of the voltage boosting power supply circuit is used as the power supply of the constant voltage circuit, the base current is applied to the VB boosting power supply circuit 132 as the output load current. When the circuit of the twelfth embodiment is used, therefore, the current of the constant voltage circuit of FIG. 21 is applied as the load in addition to gate drive of the top and bottom arm output transistors.

Figure 22:
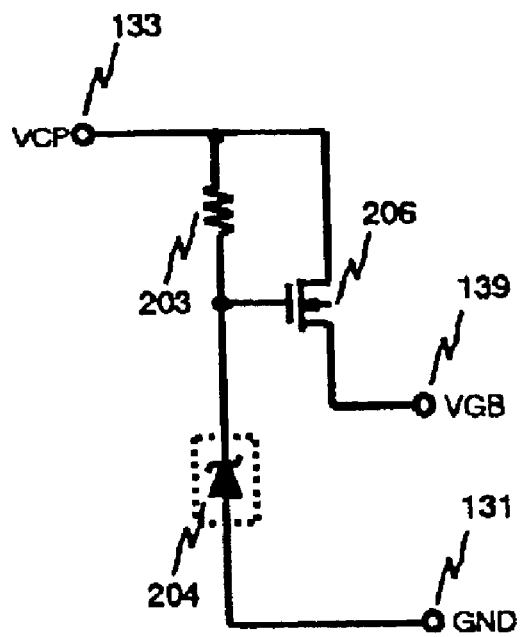
FIG. 22 is a circuit diagram of a constant voltage circuit utilizing an NMOS transistor for a constant voltage circuit for bottom arm driving as an output stage that shows a thirteenth embodiment of the present invention.

In the circuit of FIG. 22, the output transistor of the constant voltage circuit is replaced with an NMOS transistor 206. By applying this circuit to the bottom arm driver constant voltage circuit 134 of FIG. 11, a drive circuit reduced in load current to the VB boosting power supply circuit 132 can be obtained.

Figure 23:
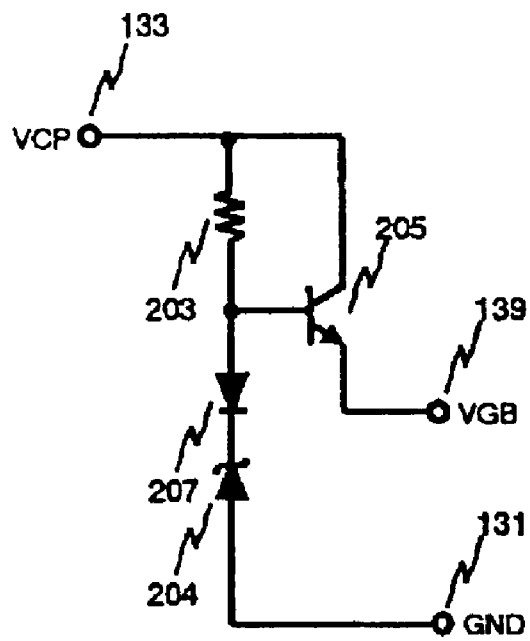
FIG. 23 is a circuit diagram of a constant voltage circuit for bottom arm driving that shows a fourteenth embodiment of the present invention.

A fourteenth embodiment of this invention will be explained below. When implementing the twelfth or thirteenth embodiment as an integrated circuit, the type of the Zener diode that can be used is limited by the wafer process. Therefore, a required constant voltage cannot be obtained sometimes. In FIG. 23, a diode 207 is added to the constant voltage generation section in the constant voltage circuit of FIG. 21. As a result, the forward voltage of the diode is added to the Zener voltage. For example, it is now assumed that 12 V is desired as a constant voltage for the bottom arm drive when only a Zener diode having a Zener voltage of VZ=10 V can be used. At this time, the number of diodes 207 is set equal to four. Assuming that the forward voltage of each diode is VF=0.7 V and the emitter-base voltage of the NPN transistor 205 is Vbe=0.7 V, VGB=12.1 V can be obtained.

According to the fourteenth embodiment, the drive circuit capable of generating a finely adjusted constant voltage by adding diodes to the circuit of FIG. 21 is thus obtained as shown in FIG. 23. The output transistor 205 may be replaced with an NMOS transistor in the same way as FIG. 22.

Figure 24:
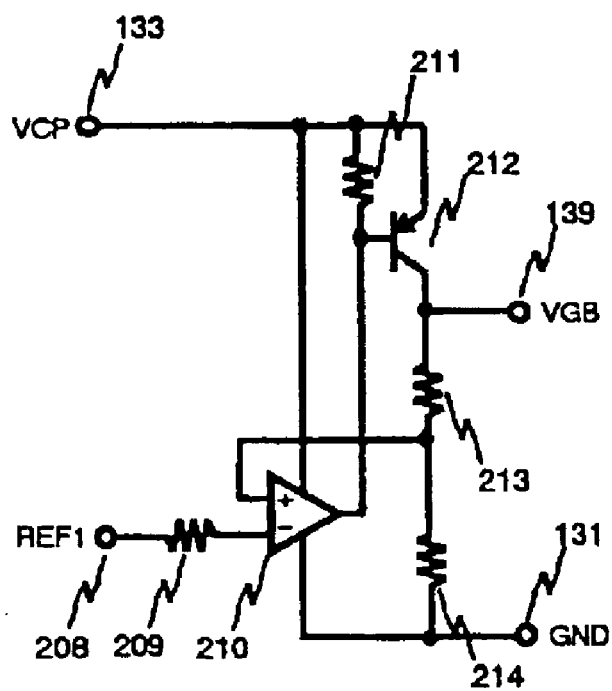
FIG. 24 is a circuit diagram of a constant voltage circuit for bottom arm driving that shows a fifteenth embodiment of the present invention.

A fifteenth embodiment of this invention will be explained below. A constant voltage circuit using a PNP transistor or a PMOS transistor as the output transistor as shown in FIG. 24 can be applied to the bottom arm driver constant voltage circuit 134 of FIG. 11.

Figure 25:
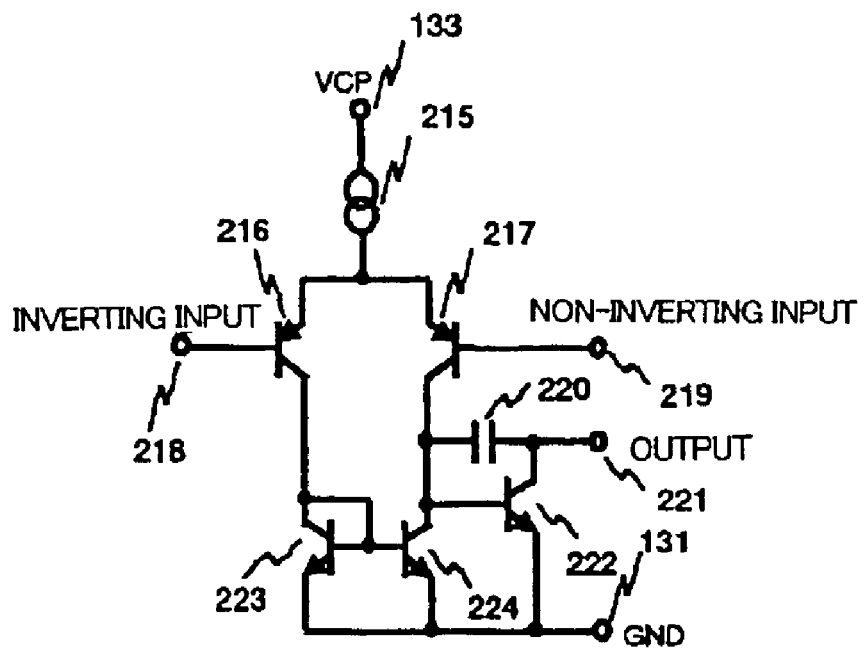
FIG. 25 is a circuit diagram of an amplifier that shows the fifteenth embodiment of the present invention.

The fifteenth embodiment is provided to use a constant voltage circuit using feedback. As shown in FIG. 24, a reference voltage input to REF1 of a terminal 208 is applied to an inverting input of an amplifier 210. Since a non-inverting input is connected to the VGB output terminal via a resistor 213, a constant voltage determined by a resistor ratio between a resistor 214 and the resistor 213 is output to VGB. The amplifier 210 sinks a base current of an output PNP transistor 212 according to an output load current, and feedback is thus conducted. A resistor 209 is an offset voltage correction resistor, and a resistor 211 is a leak cut resistor of the PNP transistor 212. Since the amplifier 210 conducts the operation, an amplifier having only the sink capability may be used. As an example, a differential amplifier circuit that can be used favorably is shown in FIG. 25. In FIG. 25, reference numeral 215 represents a constant current source, 216, 217, 222, 223, and 224 transistors, 218 an inverting input terminal, 219 a non-inverting input terminal, and 221 an output terminal.

In the same way as the explanation of the thirteenth embodiment, however, the circuit current of the amplifier 210 becomes the load of the VB boosting power supply circuit 132. Therefore, the current of the amplifier circuit needs to be decreased. The output PNP transistor 212 can be replaced with a PMOS transistor.

According to the fifteenth embodiment, it is possible to obtain the drive circuit in which the constant voltage circuit using a PNP transistor or a PMOS transistor as the output transistor is applied as the bottom arm driver constant voltage circuit of the fourth embodiment.

Figure 26:
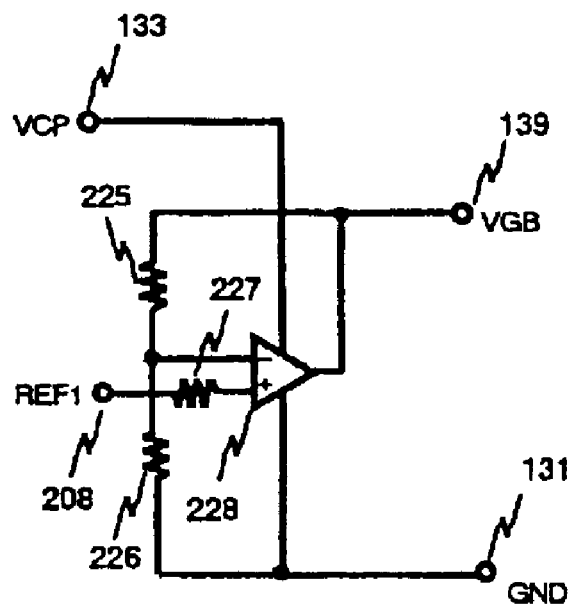
FIG. 26 is a circuit diagram of a constant voltage circuit for bottom arm driving that shows a sixteenth embodiment of the present invention.

A sixteenth embodiment of this invention will be explained below. A constant voltage circuit using an operational amplifier 228 as shown in FIG. 26 can be applied to the bottom arm driver constant voltage circuit 134 of FIG. 11. In the circuit shown in FIG. 26, a reference voltage (REF1) is input to an inverting amplifier formed of resistors 225, 226 and 227, and the operational amplifier 228. The circuit generates a constant voltage output (VGB) determined by a resistance ratio between the resistors 225 and 226. In the same way as the fifteenth embodiment, the current of the operational amplifier 228 becomes the load of the VB boosting power supply circuit 132. Therefore, it is necessary to reduce the operational circuit current.

According to the sixteenth embodiment, it is possible to obtain the drive circuit in which a circuit that generates a constant voltage by means of an inverting amplifier using an operational amplifier is applied as the bottom arm driver constant voltage circuit of the fourth embodiment.

A seventeenth embodiment of this invention will be explained below. A charge pump circuit of FIG. 27 can be applied to the top arm drive boosting power supply circuit 135 of FIG. 11. Since the circuit itself is similar to the top arm drive boosting power supply circuit of the first to third embodiments, explanation of concrete circuit operation will be omitted.

Figure 28:
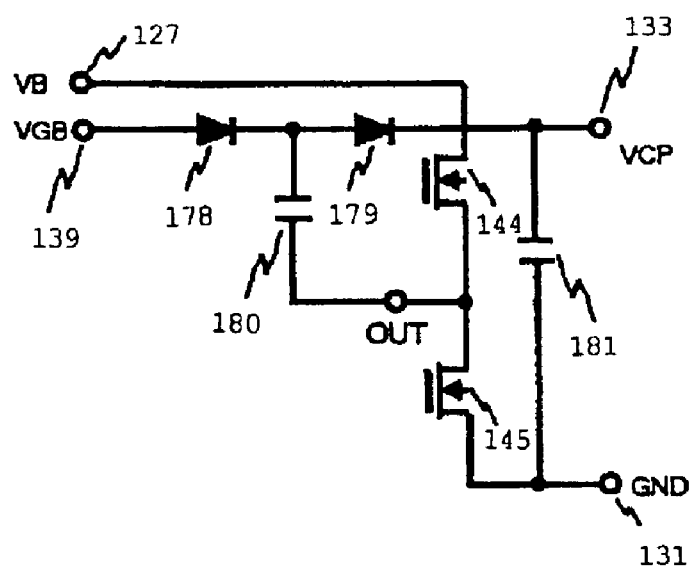
FIG. 28 is a circuit diagram of a voltage boosting power supply circuit for top arm driving that shows an eighteenth embodiment of the present invention.

An eighteenth embodiment of this invention will be explained below. The voltage boosting power supply circuit utilizing the top and bottom arm transistors 144 and 145 at the output stage explained with reference to the ninth embodiment and shown in FIG. 28 can be applied to the top arm drive boosting power supply circuit 135 of FIG. 11. Explanation of FIG. 28 will now be omitted, because FIG. 28 has been explained in detail with reference to the ninth embodiment.

A nineteenth embodiment of this invention will be explained below. With reference to FIG. 11, which shows the circuit of the fourth embodiment, the power supply voltage VB is coupled directly to the VB boosting power supply circuit 132 included in the pre-drive power supply circuit 136. Taking the treble boosting charge pump circuit shown in FIG. 13 of the sixth embodiment as an example, the element withstanding voltage of the boosting inverters 158 to 161, the charging capacitor 156, and the rectifier diode 153 needs to be at least VB voltage, the element withstanding voltage of the rectifier diode 154 and the boosting capacitor 163 needs to be at least 2×VB, and the element withstanding voltage of the rectifier diode 155 and the boosted output decoupling capacitor 164 needs to be at least 3×VB. If a power supply such as a battery having a large voltage variation is used as the VB power supply, therefore, the element withstanding voltage must be determined considering a maximum value of the power supply voltage.

For example, if a battery power supply of VB=12 V is used, it is necessary to suppose 16 V when fully charged. The element withstanding voltage of the rectifier diode 155 and the boost output decoupling capacitor 164 needs to be at least 48 V from the calculation. The bottom arm driver constant voltage circuit 134, which uses the boosted output of the VB boosting power supply circuit 132 as its power supply, is used as the gate drive voltage of the bottom arm. Therefore, the bottom arm driver constant voltage circuit 134 needs only to generate a constant voltage in the range of approximately several V to 20 V as the output (VGB). As the power supply voltage, therefore, a voltage as high as 48 V is not required. Increasing the element withstanding voltage than needed causes expansion of the element size, i.e., increase in layout patterns in integrated circuits, and causes increase of component unit price in electric circuits formed of discrete components. In either case, it increases the manufacturing cost.

Further, if a power supply voltage higher than needed is used, the switching noise caused at the time of circuit operation is increased. At worst, there is a risk of false circuit operation and a bad influence of radiated noise upon external electric circuit operation.

Figure 29:
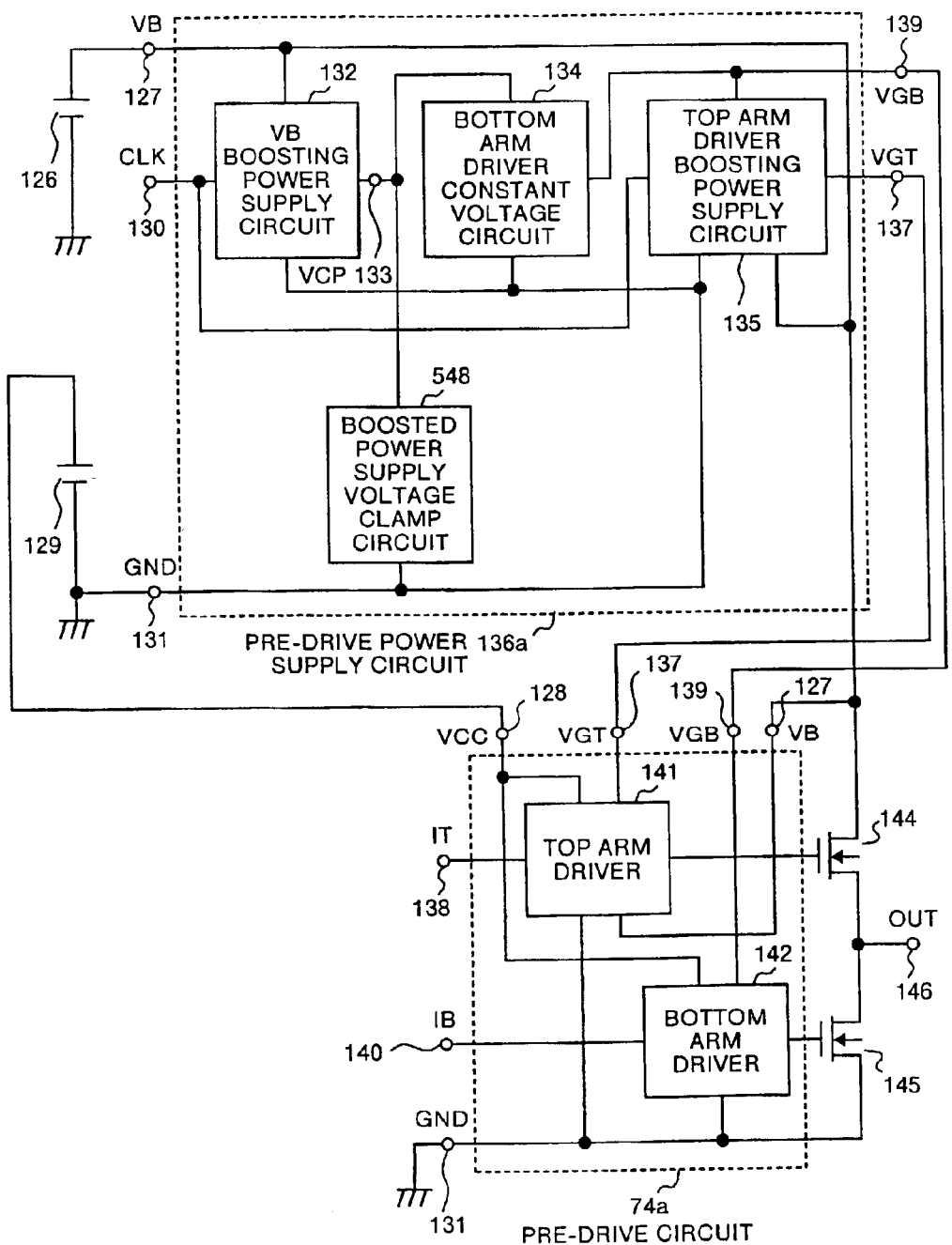
FIG. 29 is a block diagram which shows a nineteenth embodiment of the present invention.
Figure 31:
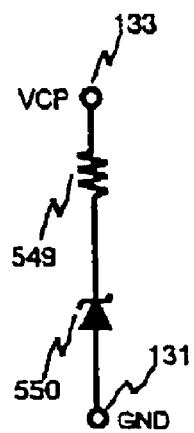
FIG. 31 is a circuit diagram which shows a Zener diode of the nineteenth embodiment of the present invention.

In a pre-drive power supply circuit 136a shown in FIG. 29, a boosted power voltage clamp circuit 548 is added to the circuit 136 of the fourth embodiment shown in FIG. 11. The boosted power supply voltage clamp circuit 548 prevents the voltage of the output (VCP) of the VB boosting power supply circuit 132 from rising. By setting the voltage clamp of the clamp circuit 548 to a suitable value, the withstanding voltage of each of elements included in the VB boosting power-supply circuit 132 and the bottom arm driver constant voltage circuit 134 can be kept to a requisite minimum. As a result, it becomes possible to solve the problems. Further, in FIG. 29, reference numerals 128 repersents a terminal and 129 a power supply. An example of a concrete circuit of the clamp circuit 548 is shown in FIG. 31. In FIG. 31, reference numeral 550 denotes a Zener diode. If a voltage across the diode exceeds the Zener potential, the diode turns on and the Zener potential is generated. A resistor 549 becomes a limit resistor which limits a current flown when the Zener diode turns on. According to circumstances, the resistor 549 may not be provided.

According to the nineteenth embodiment, it is possible to obtain a drive circuit in which the rise of the output voltage of the voltage boosting power supply circuit is suppressed and the withstanding voltage of each of the elements included in the voltage boosting power supply circuit and the bottom arm driver constant voltage circuit is limited to a minimum by adding a boosted power supply voltage clamp circuit to the drive circuit of the fourth embodiment.

A twentieth embodiment of this invention will be explained below. If the circuit of FIG. 31 is applied to the boosted power supply voltage clamp circuit 548 of the nineteenth embodiment, the Zener diode 550 turns on when clamping is conducted and a current flows through the clamp circuit. In order to reduce the clamp current, the limit resistor 549 is provided. By adding the limit resistor, however, the variation of the clamp voltage also becomes large. In the system of limiting the voltage on the boosting power supply in the nineteenth embodiment, therefore, there occurs a problem that the load current to the voltage boosting power supply circuit increases, or the variation of the limit voltage (clamp voltage) increases.

Figure 30:
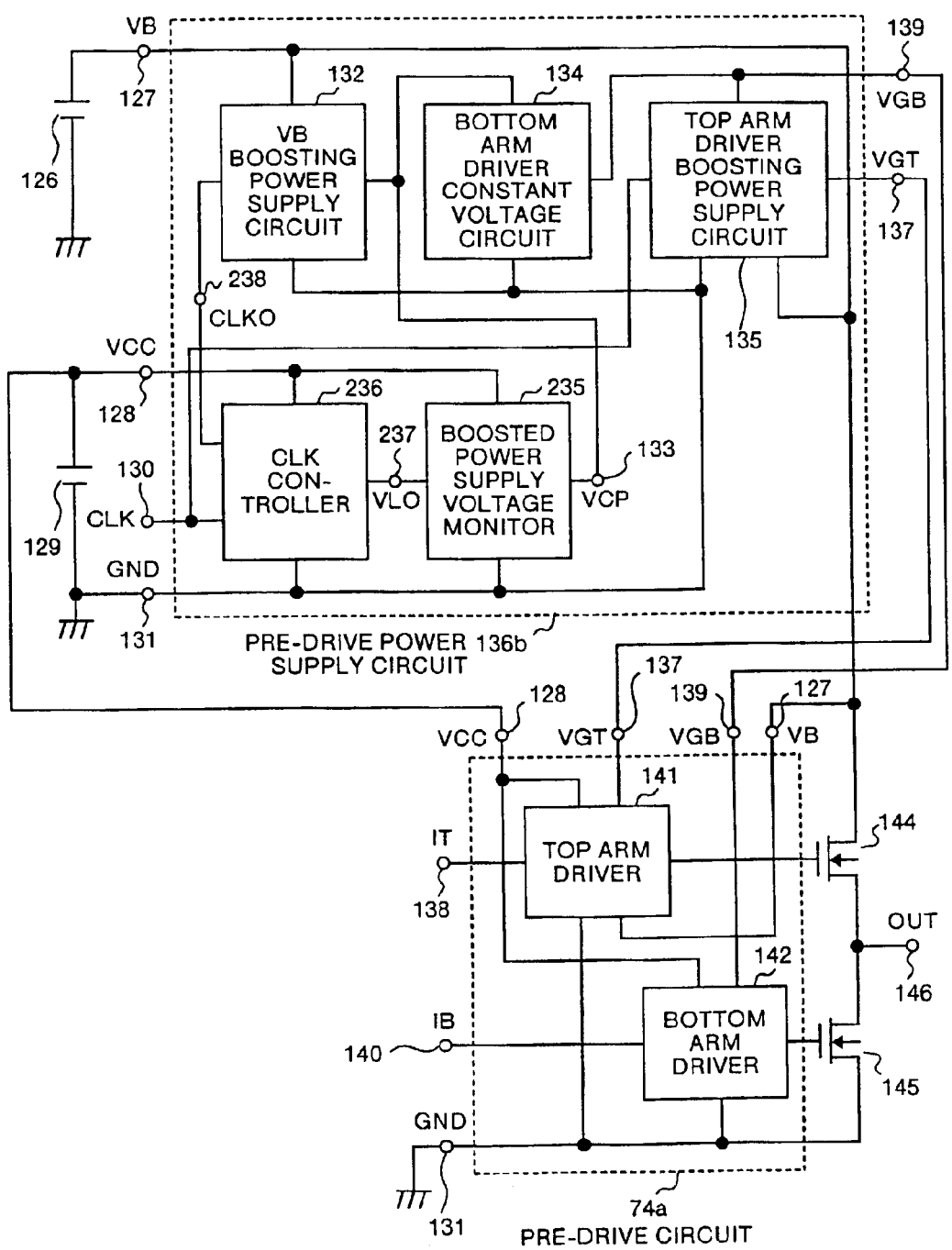
FIG. 30 is a circuit diagram of a boosted power supply voltage clamp circuit that shows the twentieth embodiment of the present invention.

FIG. 30 shows a circuit including a pre-drive power supply circuit 136*b* in which the problems are improved and which limits a boosted voltage power supply voltage (VCP) A boosted power supply voltage monitor circuit 235 that monitors the boosted voltage power supply (VCP). When VCP rises above a certain voltage, the voltage monitor circuit 235 transmits a signal (VLO) to a CLK controller 236. Upon receiving the signal, the CLK controller 236 stops transmission of a clock signal for boosting (CLK) to the VB boosting power supply circuit 132. Since not receiving the clock signal (CLKO), the VB boosting power supply circuit 132 stops the boost operation. By suppressing the rise of the boosted voltage power supply by the operation heretofore explained, effects similar to those of the nineteenth embodiment are achieved. In FIG. 30, the CLK controller 236 stops the transmission of the CLK signal only to the VB boosting power supply circuit 132. However, the CLK controller 236 may stop the transmission of the CLK signal to the top arm drive boosting power supply circuit 135.

Figure 32:
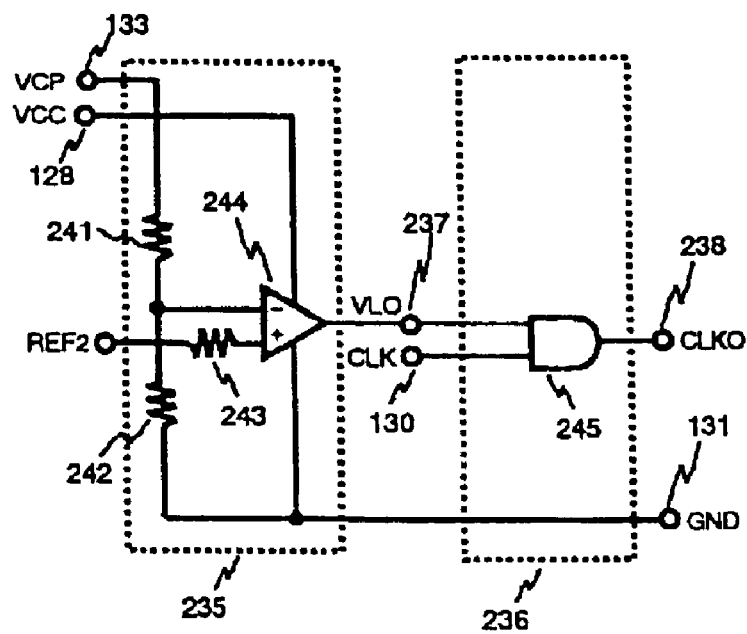
FIG. 32 is a circuit diagram of a boosted power supply voltage monitor circuit and a CLK controller that shows the twentieth embodiment of the present invention.
Figure 33:
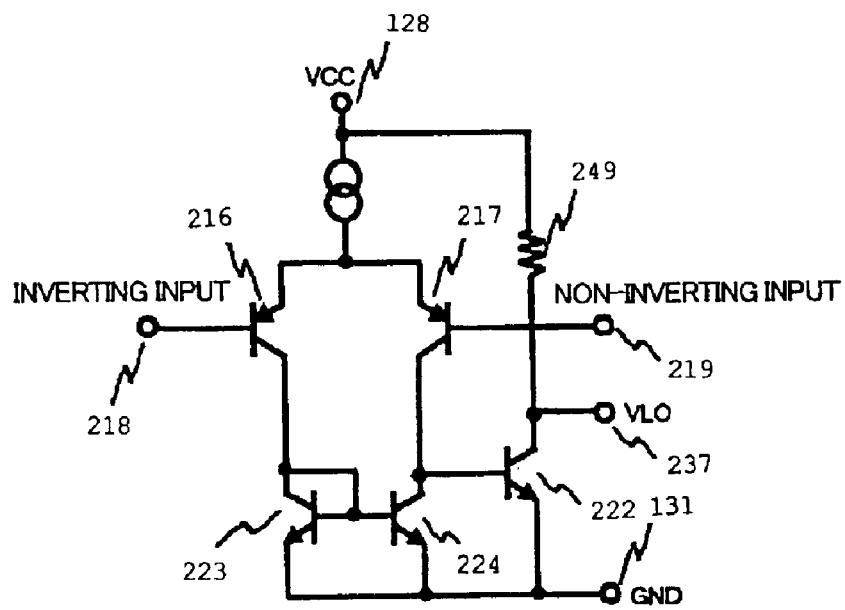
FIG. 33 is a circuit diagram of a comparator that shows the twentieth embodiment of the present invention.

FIG. 32 shows an example of the boosted power supply voltage monitor circuit 235 and the CLK controller 236. A VCP voltage monitor value obtained by compressing the voltage (VCP) on the boosted voltage output terminal 133 to a voltage determined by a resistance ratio of resistors 241 and 242 is compared with a reference voltage (REF2). If the monitor value rises higher than the reference voltage, a comparator 244 outputs a low signal. Upon receiving the low signal, the CLK controller 236 including an AND circuit 245 stops output of the clock signal (CLK), and maintains a low signal irrespective of the CLK signal. As a result, the VB boosting power supply circuit 132 connected in the subsequent stage stops the boost operation. A resistor 243 is an input resistor used to adjust the input offset. The comparator 244 may have a differential comparator as shown in FIG. 33. Although the circuit of FIG. 33 includes bipolar transistors, it is a matter of course that the circuit may include MOS transistors. In FIG. 33, the same numerals are assigned to those corresponding to the transistors and terminals in FIG. 25, except for the power supply 128, a terminal 237, and a resistor 249.

As will be appreciated by seeing the concrete circuit example of FIG. 32, the voltage on the boosting power supply (VCP) is actually applied to only the VCP voltage monitoring resistors 241 and 242. The other circuit power supply has the VCC voltage, i.e., 5 V or less. In FIG. 32, reference numeral 128 represents a VCC power supply terminal, and 238 an output terminal for a clock signal CLKO. Therefore, the influence of the addition of the circuits 235 and 236 on the manufacturing cost becomes less than the influence of the circuit in which the output of the voltage boosting power supply is not limited as explained with reference to the nineteenth embodiment. The load current applied to the voltage on the boosting power supply (VCP) can also be reduced by increasing the resistances of the monitor resistors 241 and 242. At the same time, it becomes possible to improve the precision of a limit voltage by using the comparator. Therefore, the problem of the nineteenth embodiment can be improved.

According to the twentieth embodiment, it becomes possible to obtain a drive circuit in which effects similar to those of the nineteenth embodiment can be obtained, and in which load to the voltage boosting power supply circuit can be reduced and precision of a limit voltage to the rise of voltage boosting can be improved, by adding the boosted power supply voltage monitor circuit and the clock signal controller to the drive circuit of the fourth embodiment.

A twenty-first embodiment of this invention will be explained below. The comparator 244 for the boosted power supply voltage monitor circuit 235 of the twentieth embodiment forms a circuit that stops the boost operation by stopping the clock signal when the boosted power supply voltage (VCP) rises above the voltage limit and resumes the boost operation when the boosted power supply voltage (VCP) becomes lower than the voltage limit. It is now assumed that the VCP voltage is in the vicinity of the limit value. When the VCP voltage exceeds the limit value, then voltage is started to be limited to stop the boost operation. When the VCP voltage falls as a result, the limit for the voltage is released. Therefore, there is a possibility that the limit for the voltage and the release of the limit are repeated in a short time. In other words, such repetition may cause oscillation of the VCP output.

In the twenty-first embodiment, a hysteresis width is added to the comparator in order to solve the problems. In other words, when the VCP voltage becomes a limit value or more, the comparator outputs a signal that stops the clock signal. When the VCP voltage falls to a return voltage, which is lower than the limit value, the comparator outputs a signal that cancels the stopping of the clock signal. In other words, the oscillation of VCP output is prevented by setting the relation, (VCP return voltage)=(VCP limit voltage)–(hysteresis voltage).

Figure 34:
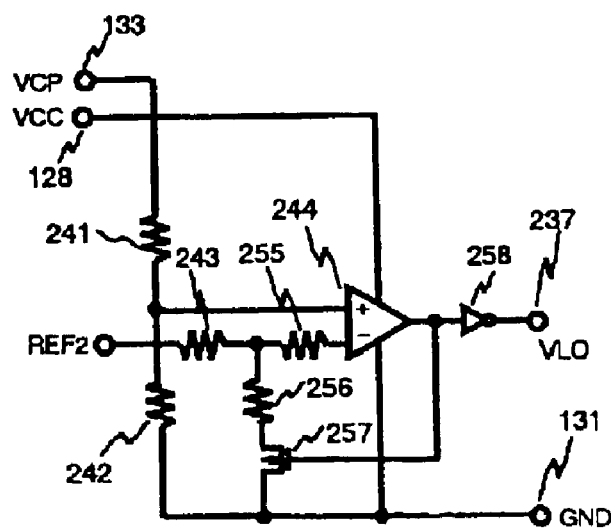
FIG. 34 is a circuit diagram of a boosted power supply voltage monitor circuit that shows a twenty-first embodiment of the present invention.

An example of the twenty-first embodiment is shown in FIG. 34. If the VCP voltage exceeds a limit value determined by a reference voltage (REF2), then a comparator 244 switches from a low level to a high level, and an NMOS transistor 257 turns on. At this time, the reference voltage input to an inverting input of the comparator 244 falls to a value determined by resistors 243 and 256 and on-resistance of the NMOS transistor 257. Therefore, until the non-inverting input voltage determined from the VCP voltage falls below the reference value that is lowered from the REF2 voltage, the output of the comparator 244 does not return to the low level. Owing to the operation heretofore explained, the hysteresis characteristic of the comparator 244 is implemented. Further, reference numeral 255 represents a resistor, and 258 an inverter.

According to the twenty-first embodiment, it becomes possible to obtain a drive circuit that prevents oscillation when the output of the boosting power supply is limited, by adding the hysteresis characteristic to the comparison operation of the boosted power supply voltage monitor circuit of the twentieth embodiment.

A twenty-second embodiment of this invention will be explained below. If the voltage boosting power supply circuit that is activated by a clock signal is included in a circuit of the present invention heretofore explained, switching noise of the clock frequency or its harmonic frequency is generated. Further, if the output stage conducts the PWM operation, switching noise of the PWM frequency and its harmonic frequency is also generated. Therefore, the switching noise might appear as power supply noise and GND noise. For example, the noise gets on the output (VCP terminal) of the VB boosting power supply circuit as well. Even if the hysteresis characteristic is added to the boosted power supply voltage monitor circuit as in the twenty-first embodiment, false operation is caused when the noise amplitude is the hysteresis voltage width or more. If there is no hysteresis characteristic of the twentieth embodiment, the possibility of false operation caused by noise further increases.

Figure 35:
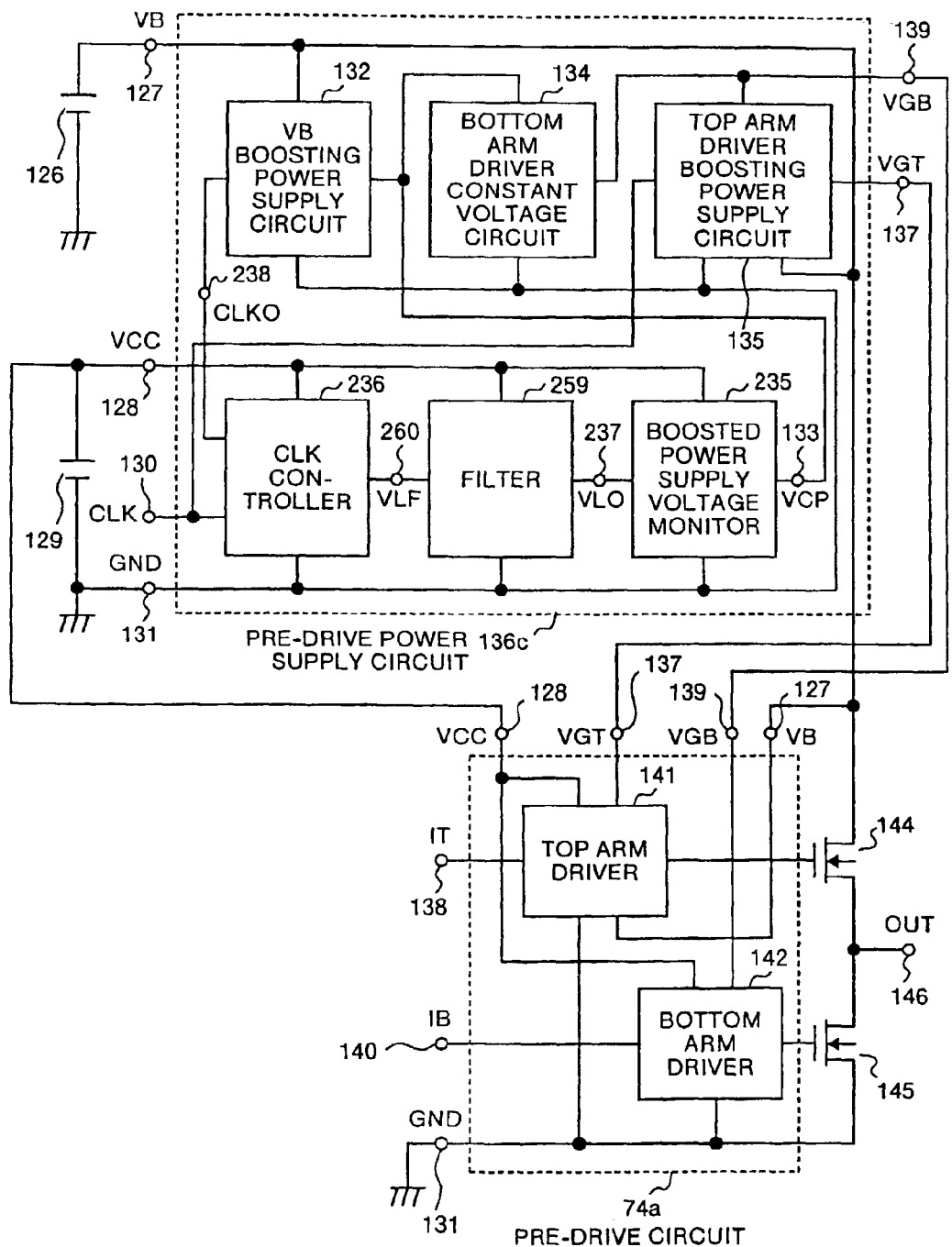
FIG. 35 is a block diagram which shows a twenty-second embodiment of the present invention.
Figure 36:
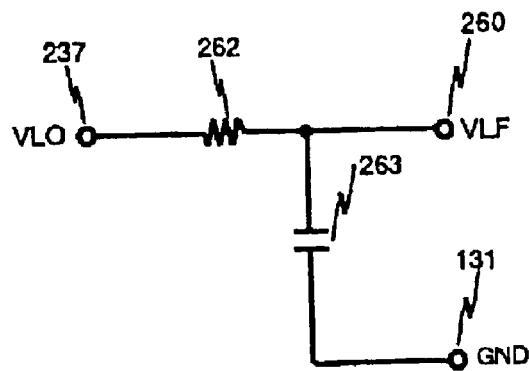
FIG. 36 is a circuit diagram which shows a filter circuit of the twenty-second embodiment of the present invention.

FIG. 35 shows a circuit including a pre-drive power supply circuit 136c having a filter circuit 259 further added in order to prevent the false operation caused by the noise. By adding, for example, a low pass filter formed with a resistor 262 and a capacitor 263 as shown in FIG. 36 as the filter circuit 259, a boost stop signal of the boosted power supply voltage monitor circuit 235 having a width shorter than a certain time width is prevented from its detection. The filter circuit 259 may be connected to the voltage monitor circuit 235 and the boosted voltage output terminal 133 (VCP).

According to the twenty-second embodiment, it becomes possible to obtain a drive circuit in which the filter circuit such as a low pass filter is added to the circuit of the twentieth embodiment or twenty-first embodiment. This filter circuit is provided to prevent false operation of the boosted power supply voltage monitor circuit caused by noise in the output of the voltage boosting power supply circuit.

A twenty-third embodiment of this invention will be explained below. In the circuit of the twenty-second embodiment shown in FIG. 35 and FIG. 36, a signal VLF is transmitted to the CLK controller 236 by adding the same delay time to the output terminal 237 (VLO) of the boosted power supply voltage monitor circuit 235 even in either a case where the level is switched from the low level to the high level or a case where the level is switched from the high level to the low level. In other words, the signal delay time provided by the filter circuit 259 is the same both at the time of limiting the VCP voltage and at the time of its return. Therefore, the circuit of FIG. 36 is not suitable if it is desired to make the delay time given when the boosted voltage (VCP) is limited and the boost operation is stopped differ from the delay time given when the boost operation is resumed.

For example, a case as follows corresponds to the above-mentioned case. That is, the case is such that it might be desired to provide a delay time in order to prevent false operation caused by noise when boost operation is stopped due to a limit for the VCP voltage but to cause return with little delay when the boost operation is resumed after the stopping of the boost operation.

Figure 37:
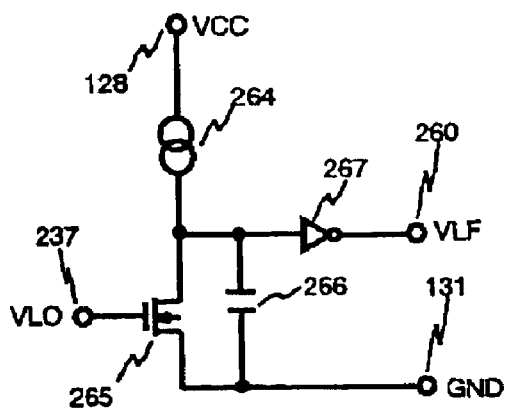
FIG. 37 is a circuit diagram of a filter in a twenty-third embodiment of the present invention.

A concrete example of the filter circuit is shown in FIG. 37. For example, if the circuit of FIG. 34 is applied to the boosted power supply voltage monitor circuit 235, the output terminal 237 (VLO) outputs a signal of low level when the VCP voltage has risen above the limit voltage, and outputs a signal of high level when the VCP voltage has fallen below the return voltage. Therefore, for example, when the boost operation is stopped, the NMOS transistor 265 is switched from the on-state to the off-state. A switchover delay time of the output terminal 260 (VLF) is determined by a constant current depending on a constant current source 264 and a capacitance of a capacitor 266. At the time of return to the boost operation, the NMOS transistor 265 is switched from the off-state to the on-state, and electric charges charged in the capacitor 266 are discharged through the transistor 265 that is on. As a result, a delay time is determined by the on-resistance of the NMOS transistor 265 and the capacitance. Further, reference numeral 267 represents an inverter. Therefore, by making the on-resistance of the NMOS transistor 265 small, such an operation as to provide a delay when the boost operation is stopped and provide little delay at the time of return to the boost operation is made possible.

Figure 38:
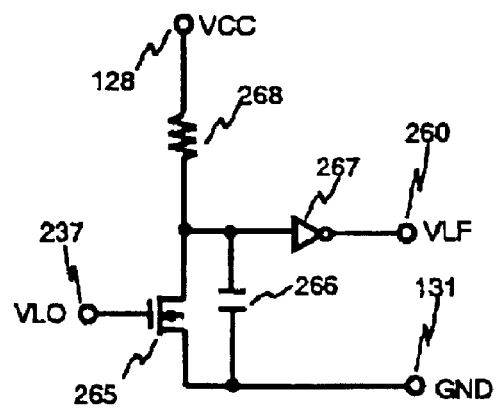
FIG. 38 is a circuit diagram of a filter in the twenty-third embodiment of the present invention.

If the constant current source shown in FIG. 37 is implemented by using a simple circuit, a current variation may become large due to the influence of a variation in power supply voltages, a variation in temperature, or a variation in wafer process parameters over the circuit. In FIG. 38, the precision of the delay time is improved by replacing the constant current source 264 with a resistor 268.

Figure 39:
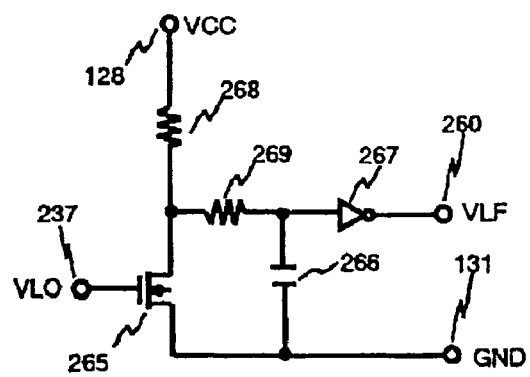
FIG. 39 is a circuit diagram of a filter in the twenty-third embodiment of the present invention.

When a difference is provided between the delay time at the time of stopping the boost operation and the delay time at the time of its returning, adjustment may be conducted by adding a resistor 269 as shown in FIG. 39.

According to the twenty-third embodiment, it becomes possible to obtain a drive circuit in which such a filter that the delay time at the time of limiting voltage boosting (at the time of stopping the boost operation of the voltage boosting power supply circuit) can be set so as to be different from the delay time at the time of returning to the voltage boosting (at the time of resuming the boost operation of the boosting power supply circuit) is used as the filter circuit of the twenty-second embodiment.

A twenty-fourth embodiment of this invention will be explained below. In the twenty-fourth embodiment, a digital filter is used as the filter circuit. Since a clock signal is required for the voltage boosting power supply circuit, a logic circuit such as a counter generates a delay on the basis of the clock signal or a signal obtained by applying frequency division to the clock signal, and conducts filtering. Circuit examples are shown in FIG. 40 and FIG. 41.

Figure 40:
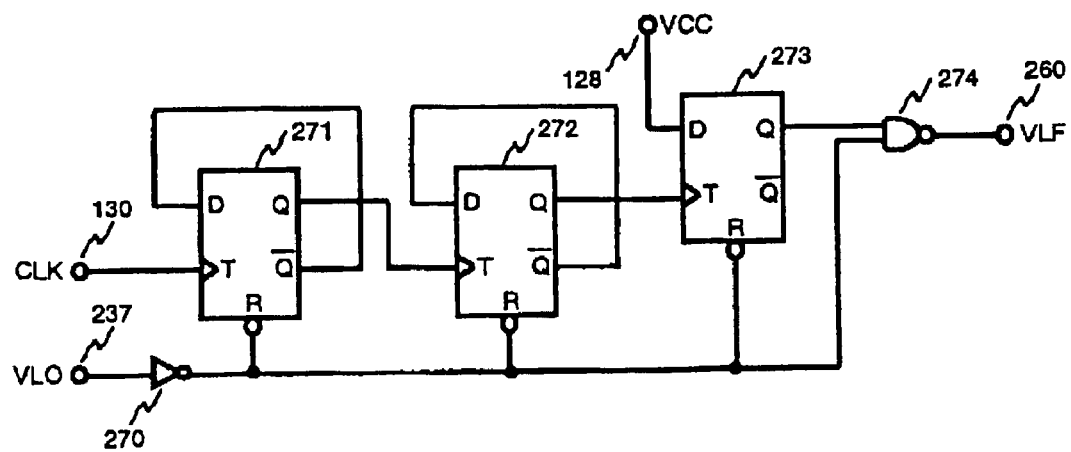
FIG. 40 is a circuit diagram of a digital filter in a twenty-fourth embodiment of the present invention.

A circuit of FIG. 40 is an example of a filter circuit obtained by applying the circuit of FIG. 34 to the boosted power supply voltage monitor circuit 235 in the twenty-second embodiment shown in FIG. 35. Upon detecting that VLO on an output terminal 237 of the boosted power supply voltage monitor circuit shown in FIG. 35 has exceeded the limit value, a signal of low level is output from the boosted voltage output terminal 133 (VCP). As a result, a signal of high level is input to reset inputs of data flip-flops (hereafter referred to as DFF) 271, 272 and 273 of FIG. 40. Therefore, reset is canceled and an input signal is accepted. Thus, denoting a clock frequency by fclk, a clock signal obtained by frequency division with a factor of 4 in a counter circuit formed of the DFF 271 and DFF 272 is input to the DFF 273. In other words, the clock signal is input to the DFF 273 4/fclk seconds later. The DFF 273 uses the clock signal as its trigger, reads the VCC voltage, i.e., the high voltage, and outputs a high signal at its Q output. A NAND 274 receives a high voltage that is the Q output of the DFF 273 and the high signal that is the reset input of the DFF 273, and outputs a low signal to an output terminal 260 (VLF). (Otherwise, a high signal is output to the output terminal 260.) Upon receiving the low signal, for example, the CLK controller 236 shown in FIG. 32 stops the transmission of the clock signal (CLK) to the VB boosting power supply circuit 132. In FIG. 40, the four-frequency division counter circuit composed of two stages of DFF (271 and 272) forms a delay circuit. The number of stages of DFF may be arbitrarily set according to a required delay time. Further, reference numeral 270 represents an inverter.

Figure 41:
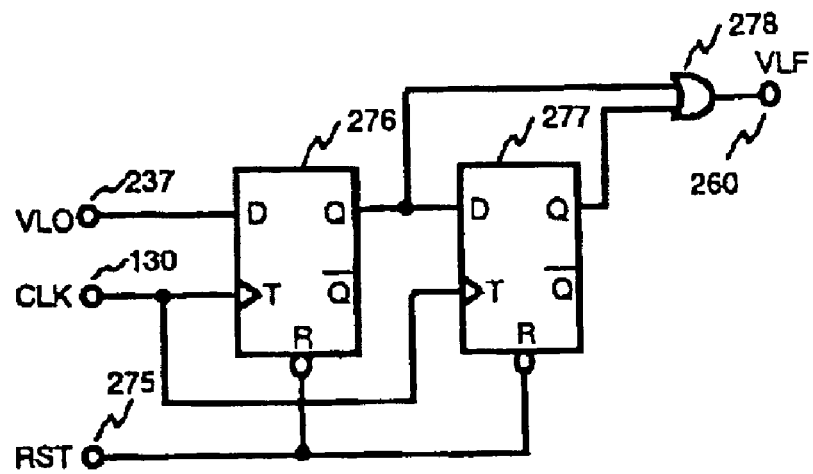
FIG. 41 is a circuit diagram of a digital filter in the twenty-fourth embodiment of the present invention.

FIG. 41 shows a circuit that filters a signal shorter than a clock period (1/fclk) by using DFFs 276 and 277 and an OR circuit 278. A high voltage is supplied to a reset input (RST) terminal 275. Supposing the same condition as that of the foregoing explanation, when the value (VCP) on the boosting power supply has exceeded the limit value, the DFF 276 receives the low signal of the output terminal 237 (VLO) of the voltage boosting power supply circuit and outputs the low signal at its Q output by using the clock frequency as a trigger. At the next trigger timing, the DFF 276 reads the VLO signal at that time and outputs the signal to the Q output. The DFF 277 takes in the previous low signal and outputs the low signal to the Q output. Therefore, only when the VLO signal maintains the low signal longer than the clock period (1/fclk), the OR circuit 278 outputs the low signal to the VLF output terminal 260. Therefore, it becomes possible to filter out a low VLO signal shorter than the clock signal period. In FIG. 41, filtering of the clock period (1/fclk) is conducted. This period can be adjusted by increasing the number of DFFs in the same way. It is also possible to switch the filter circuit between active and non-active states according to the RST signal.

According to the twenty-fourth embodiment, it becomes possible to obtain a drive circuit in which the digital filter using the clock signal for the voltage boosting power supply circuit is applied to the filter circuit of the twenty-second embodiment.

Figure 42:
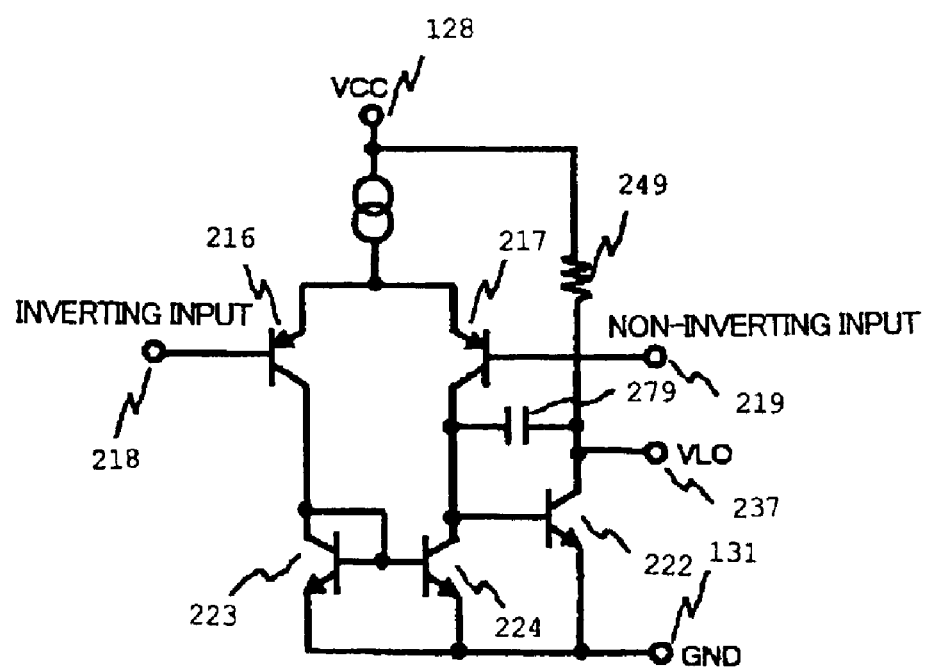
FIG. 42 is a circuit diagram of a comparator in a twenty-fifth embodiment of the present invention.

A twenty-fifth embodiment of this invention will be explained below. It is also possible to incorporate the filter circuit 259 of the twenty-second embodiment (FIG. 35) into the boosted power supply voltage monitor circuit 235. That is, a signal higher than a certain frequency is filtered by making narrower the frequency band of the comparator circuit in the voltage monitor circuit 235. For example, in the twentieth embodiment, FIG. 33 has been mentioned as the concrete example of the comparator. By adding a capacitor 279 to the circuit of FIG. 33 as shown in FIG. 42, it becomes possible to filter a signal above a certain frequency.

According to the twenty-fifth embodiment, it becomes possible to obtain a drive circuit having the filter circuit of the twenty-second embodiment incorporated into the boosted power supply voltage monitor circuit.

A twenty-sixth embodiment of this invention will be explained below. The circuits of the fourth to twenty-fifth embodiments can be applied to applications that require a large current at the output as explained with reference to the fourth embodiment. Therefore, it becomes possible to apply the circuits of the fourth to twenty-fifth embodiments to a wide variety of applications. It is now assumed that the same circuit is applied to a plurality of applications. Even if its capability in an application that demands a maximum output current is ensured, it cannot be said that there are no problems at all in an application that demands a smaller output current.

By way of a more concrete example, it is now assumed that there has been fabricated a pre-driver IC formed with the pre-drive power supply circuit (136c) and the pre-drive circuit (74a), from which the output-stage top and bottom arm transistors 144 and 145 in one of the fourth to twenty-fifth embodiments are excluded. In this instance, it is necessary to design the pre-drive power supply circuit for gate drive according to a maximum capability condition that can be supposed, in order to apply the integrated circuit to various applications. For example, when applying a charge pump circuit to a voltage boosting power supply circuit, it is necessary to set on-resistance (Ron) of the NMOS device of the charge pump inverter so as to satisfy a minimum required gate drive voltage of the output transistor according to the expression (11) on the basis of a maximum gate charge characteristic (Cg) required to drive the output transistor, a maximum number (n) of top and bottom arms that turn on within a PWM period, and a maximum PWM frequency (fpwm). If the circuit at this time is simultaneously applied to an application that is smaller in Cg, n and fpwm, problems are not especially caused in the capability of the pre-drive power supply circuit. For example, however, Ron is smaller than needed. If Ron is small, charging the boosting capacitor is conducted rapidly, but at the same time it also means that the charging current increases. That is, noise such as switching noise increases because the transient current increases. If a circuit having a capability set higher than a capability of a pre-drive power supply circuit demanded by the application is used, there is a possibility that increased noise causes a bad influence such as false operation onto peripheral circuits if the worst comes to the worst.

Figure 43:
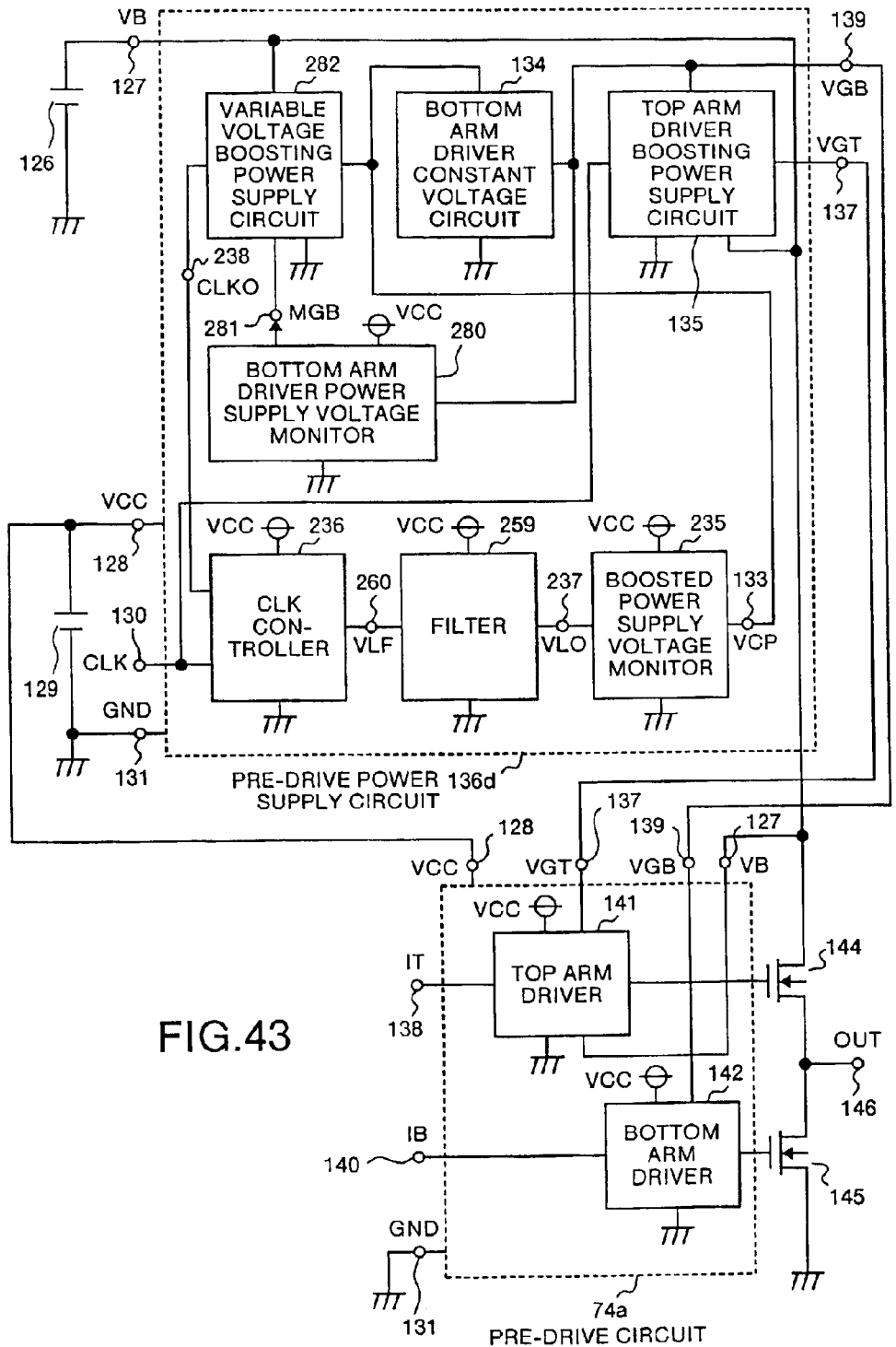
FIG. 43 is a block diagram which shows a twenty-sixth embodiment of the present invention.

FIG. 43 shows an example of a circuit that conducts self-detection of required capability according to application and switches over to another output capability of the voltage boosting power supply circuit in the first to twenty-fifth embodiment in order to improve the problem. However, FIG. 43 shows only an example of the circuit including a pre-drive power supply circuit 136d in which the function is added to the circuit example of the twenty-first embodiment shown in FIG. 35. Its concrete operation will now be explained. As the load of a variable voltage boosting power supply circuit 282 shown in FIG. 43, a load current required for gate drive of the output-stage transistors 144 and 145 is applied to the transistors as explained earlier. If the load current becomes larger, a voltage (VCP) output of the voltage boosting power supply circuit becomes lower. If VCP has become lower than the constant voltage output of the bottom arm driver constant voltage circuit 134 at the normal time, it becomes impossible to output the constant voltage. At this time, the output voltage (VGB) of the bottom arm driver constant voltage circuit is lowered in proportion to the VCP voltage.

A bottom arm driver power supply voltage monitor circuit 280 newly added to the circuit as shown in FIG. 43 detects that VGB has fallen below a certain voltage, for example, the normal output constant voltage of the bottom arm driver constant voltage circuit 134, and transmits a signal to an input terminal 281 (MGB) of the variable voltage boosting power supply circuit 282. Upon receiving the detection signal, the variable voltage boosting power supply circuit 282 increases the output capability in order to prevent the bottom arm drive voltage VGB from falling. That is, when the capability to prevent the falling of the voltage VGB is not required, noise increase is suppressed by lowering the output capability of the variable voltage boosting power supply circuit 282. Only when the capability is required, the output capability of the variable voltage boosting power supply circuit 282 can be increased.

According to the twenty-sixth embodiment, it becomes possible to obtain a drive circuit having an added self-diagnosis circuit that prevents noise from exerting a bad influence upon peripheral circuits and the self circuit by enhancing the capability of the voltage boosting power supply circuit only when required, when applying the circuit in any of the first to twenty-fifth embodiments to a plurality of applications.

A twenty-seventh embodiment of this invention will be explained below. When a charge pump circuit is applied to the variable voltage boosting power supply circuit of the twenty-sixth embodiment, effects similar to those of the twenty-sixth embodiment can be obtained by switching over to another on-resistance of the boosting inverter.

Figure 44:
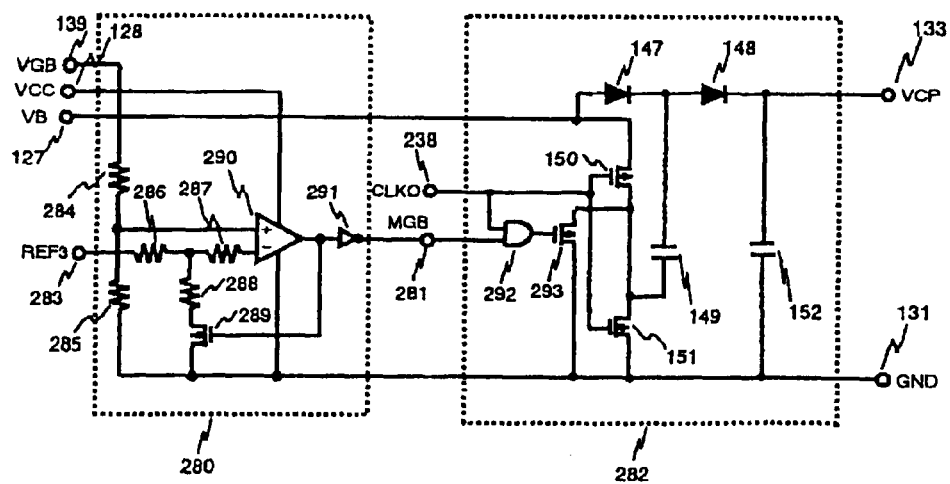
FIG. 44 is a circuit diagram which shows a twenty-seventh embodiment of the present invention.

A concrete circuit example is shown in FIG. 44. Operation of a circuit including elements 284 to 291, as a concrete example of the bottom arm driver power supply voltage monitor circuit 280, is the same as that of the twenty-first embodiment shown in FIG. 34. Therefore, explanation thereof will be omitted. Note that reference numeral 283 represents a terminal of a reference voltage REF3, 147 and 148 rectifier diodes, and 292 an AND circuit.

With reference to FIG. 44, when the VGB voltage on the terminal 139 has fallen below a certain preset value, the output terminal 281 (MGB) of the bottom arm driver power supply voltage monitor circuit 280 is switched from the low voltage to the high voltage. Upon receiving this signal, an NMOS transistor 293 in a variable voltage boosting power supply circuit 282 is activated by a clock signal (CLKO) As a result, on-resistance of an NMOS transistor 151 of the boosting inverter included in the circuit 282 as a double boosting charge pump circuit falls, and the capability of the voltage boosting power supply circuit rises.

As the variable voltage boosting power supply circuit 282 of FIG. 44, a double boosting charge pump circuit is shown. To this circuit, however, any circuit of the sixth to ninth embodiments may be applied.

According to the twenty-seventh embodiment, it becomes possible to obtain a drive circuit that implements the effects of the twenty-sixth embodiment by receiving a signal of the bottom arm driver power supply voltage monitor circuit and decreasing or increasing the NMOS on-resistance of the boosting inverter, when the charge pump circuit of the fifth to eighth embodiment is applied as the voltage boosting power supply circuit of the twenty-sixth embodiment.

A twenty-eighth embodiment of this invention will be explained below. When a charge pump circuit is applied to the voltage boosting power supply circuit of the twenty-sixth embodiment, the effects explained with reference to the twenty-sixth embodiment can be obtained by switching over to another forward voltage of rectifier diodes.

Figure 45:
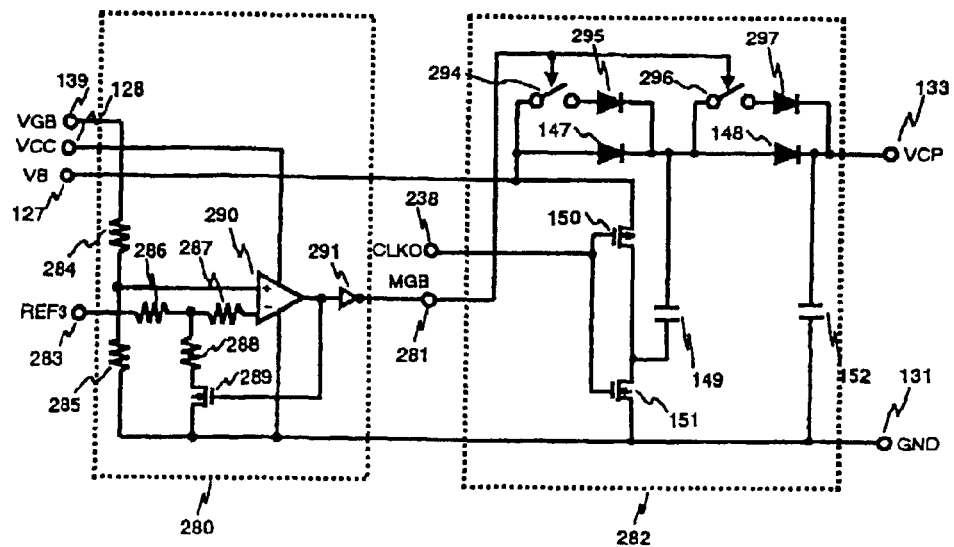
FIG. 45 is a circuit diagram which shows a twenty-eighth embodiment of the present invention.

A concrete circuit example is shown in FIG. 45. A bottom arm driver power supply voltage monitor circuit 280 is the same as that shown in FIG. 44. When the VGB voltage falls below a certain preset value, the terminal 281 (MGB) is switched from a low signal to a high signal. In response to the high signal, switches 294 and 296 turn on. As a result, rectifier diodes 295 and 297 are connected in parallel with the rectifier diodes 147 and 148, respectively. Consequently, the forward voltage reduces and the output capability of the voltage boosting power supply circuit is increased.

In the same way as the twenty-seventh embodiment, a double boosting charge pump circuit is shown as a variable voltage boosting power supply circuit 282 of FIG. 45. However, the charge pump circuit of any of the sixth to ninth embodiments may be applied.

Further, by implementing the present embodiment simultaneously with the twenty-seventh embodiment, the effects explained with reference to the twenty-sixth embodiment can also be obtained.

According to the twenty-eighth embodiment, it becomes possible to obtain a drive circuit that brings about the same effects as those of the twenty-sixth embodiment in the following manner, when the charge pump circuit of the fifth to eighth embodiment is used as the voltage boosting power supply circuit of the twenty-sixth embodiment. That is, the same effects can be obtained by receiving a signal of the bottom arm driver power supply voltage monitor circuit and decreasing or increasing the forward voltage of the rectifier diodes in the charge pump circuit. Further, by implementing the present embodiment simultaneously with the twenty-seventh embodiment, a drive circuit having the same effects as those of the twenty-sixth embodiment can also be obtained.

A twenty-ninth embodiment of this invention will be explained below. When the step-up converter of the tenth embodiment is applied to the voltage boosting power supply circuit of the twenty-sixth embodiment, the effects explained with reference to the twenty-sixth embodiment can be obtained by switching over to another inductance of the coil.

Figure 46:
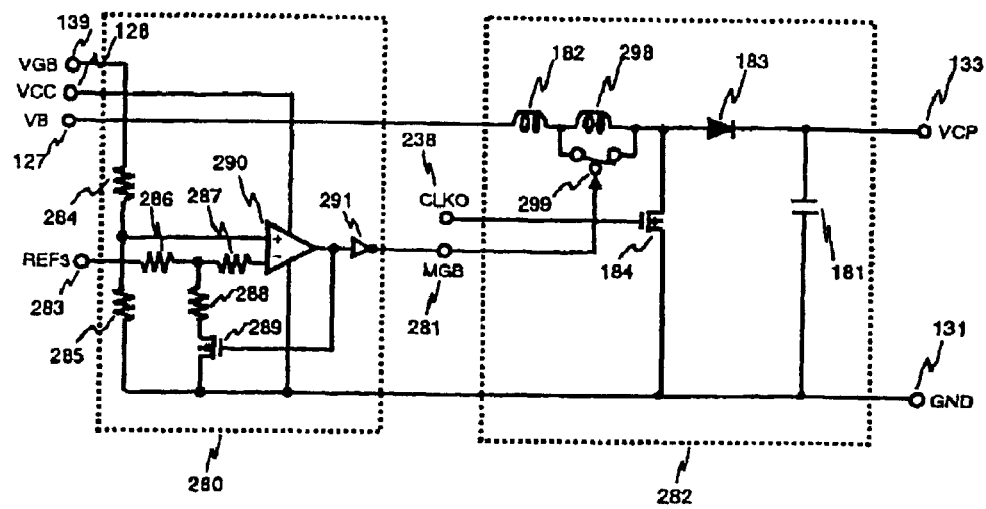
FIG. 46 is a circuit diagram which shows a twenty-ninth embodiment of the present invention.

A concrete circuit example is shown in FIG. 46. A bottom arm driver power supply voltage monitor circuit 280 is the same as that of FIG. 44 and FIG. 45, and consequently explanation thereof will be omitted. Upon receiving a high signal on the terminal 281 (MGB) caused when voltage (VGB) on the bottom arm driver power supply has fallen, a switch 299 releases a short-circuit across a coil 298 and connects the coil 298 in series with a coil 182. As a result, the power supply voltage (VCP) is boosted.

According to the twenty-ninth embodiment, it becomes possible to obtain a drive circuit that brings about the same effects as those of the twenty-sixth embodiment in the following manner, when the step-up converter circuit of the tenth embodiment is used as the voltage boosting power supply circuit of the twenty-sixth embodiment. That is, the same effects can be obtained by receiving a signal of the bottom arm driver power supply voltage monitor circuit and increasing or decreasing the inductance of the coil in the step-up converter.

A thirtieth embodiment of this invention will be explained below. When the step-up converter of the tenth embodiment is applied to the voltage boosting power supply circuit of the twenty-sixth embodiment in the same way as the twenty-ninth embodiment, the same effects as those of the twenty-sixth embodiment can be obtained by switching over to another on-resistance of the NMOS transistor.

Figure 47:
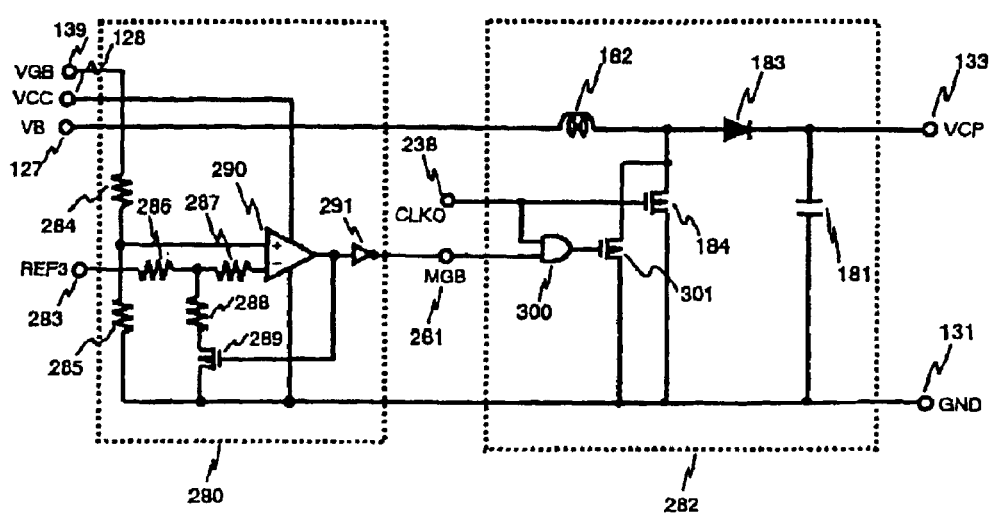
FIG. 47 is a circuit diagram which shows a thirtieth embodiment of the present invention.

A concrete circuit example is shown in FIG. 47. A bottom driver power supply voltage monitor circuit 280 is the same as that shown in FIG. 44 to FIG. 46. When the voltage (VGB) on the bottom drive power supply has fallen, a high signal is output to the terminal 281 (MGB). In response to input of the signal to an AND 300, an NMOS transistor 301 is activated by a clock signal (CLKO). As a result, the power supply voltage is boosted.

According to the thirtieth embodiment, it becomes possible to obtain a drive circuit that brings about the effects of the twenty-sixth embodiment by receiving a signal of the bottom arm driver power supply voltage monitor circuit and decreasing or increasing the on-resistance of the NMOS transistor in the step-up converter, when the step-up converter circuit of the tenth embodiment is applied as the voltage boosting power supply circuit of the twenty-sixth embodiment. Further, by implementing the present embodiment simultaneously with the twenty-ninth embodiment, a drive circuit having the same effects as those of the twenty-sixth embodiment can also be obtained.

A thirty-first embodiment of this invention will be explained below. When the step-up converter of the tenth embodiment is applied to the voltage boosting power supply circuit of the twenty-sixth embodiment in the same way as the twenty-ninth and thirtieth embodiments, the same effects as those of the twenty-sixth embodiment can be obtained by switching over to another forward voltage of a rectifier diode.

Figure 48:
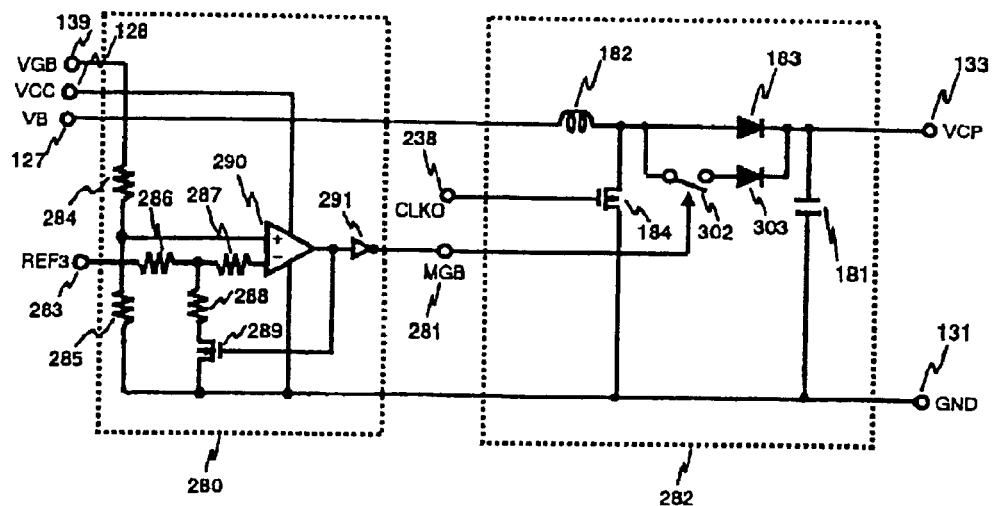
FIG. 48 is a circuit diagram which shows a thirty-first embodiment of the present invention.

A concrete circuit example is shown in FIG. 48. A bottom driver power supply voltage monitor circuit 280 is the same as that shown in FIGS. 44 to 47. When the VGB voltage has fallen, a high signal is output to the terminal 281 (MGB) Upon receiving the high signal, a switch 302 turns on. Since a rectifier diode 303 is thus connected in parallel with the rectifier diode 183, the output (VCP) of the power supply voltage is boosted.

According to the thirty-first embodiment, it becomes possible to obtain a drive circuit that brings about the effects of the twenty-sixth embodiment by receiving a signal of the bottom arm driver power supply voltage monitor circuit and decreasing or increasing the forward voltage of a rectifier diode in the step-up converter, when the step-up converter circuit of the tenth embodiment is applied as the voltage boosting power supply circuit of the twenty-sixth embodiment. Further, by implementing the present embodiment simultaneously with the twenty-ninth or thirtieth embodiment, a drive circuit having the same effects as those of the twenty-sixth embodiment can also be obtained.

A thirty-second embodiment of this invention will be explained below. As explained with reference to the effects of the twenty-sixth embodiment, the bottom arm driver power supply voltage monitor circuit in the twenty-sixth embodiment shown in FIG. 43 detects fall of the constant voltage output (VGB) of the bottom arm driver constant voltage circuit caused by fall of output (VCP) of the voltage boosting power supply circuit that is caused by the gate drive load of the top and bottom arm transistors. Therefore, the VCP voltage may be monitored instead of monitoring the VGB voltage. The boosted power supply voltage monitor circuit which monitors the VCP voltage has already been provided, and therefore it is possible to decrease the circuit scale by adding the function to the boosted power supply voltage monitor circuit 235 shown in FIG. 43.

Figure 49:
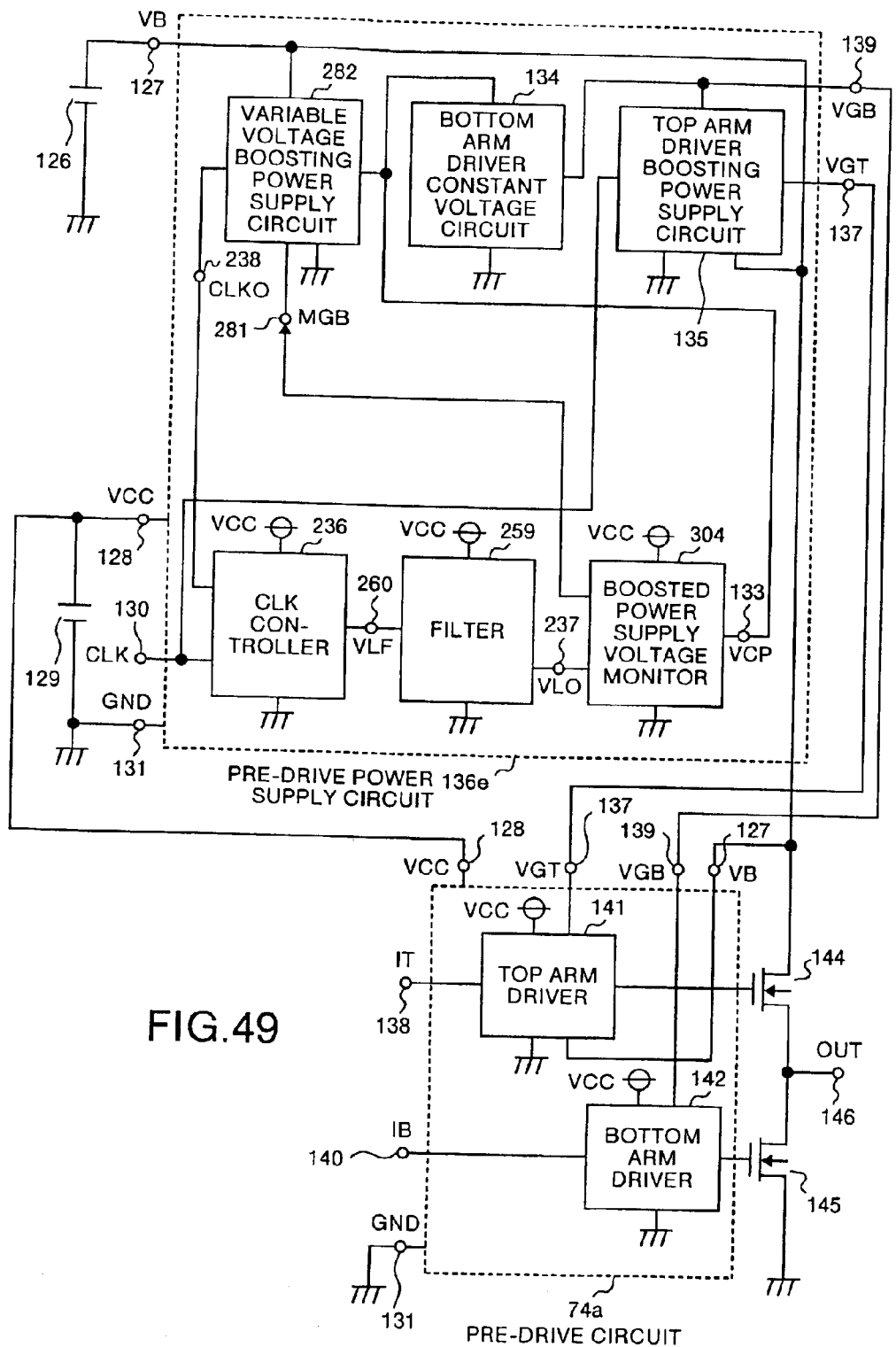
FIG. 49 is a block diagram which shows a thirty-second embodiment of the present invention.

A boosted power supply voltage monitor circuit 304 in a pre-drive power supply circuit 136e shown in FIG. 49 becomes a circuit having the function added thereto. When VCP has fallen below a certain preset value, the voltage monitor circuit 304 transmits a signal to the terminal 281 (MGB) for switching between capabilities of the variable voltage boosting power supply circuit 282. Other operations are the same as those of the twenty-sixth to thirty-first embodiments.

According to the thirty-second embodiment, it becomes possible to obtain a drive circuit that brings about the same effects as those of the twenty-sixth to thirty-first embodiments while reducing the circuit scale, by adding the function of detecting fall of the boosted power supply voltage to the boosted power supply voltage monitor circuit of the twenty-sixth embodiment.

A thirty-third embodiment of this invention will be explained below. In the twenty-sixth embodiment, the circuit that monitors the bottom arm driver power supply voltage and switches between the capabilities of the voltage boosting power supply circuit has been shown. A similar way of thinking can be applied to the top arm driver boosting power supply circuit as well. That is, when the capability of the top arm driver boosting power supply circuit is insufficient, it is possible to conduct self-detection of fall of the top arm gate drive power supply voltage (VGT) and to increase the capability of the top arm driver boosting power supply circuit.

Figure 50:
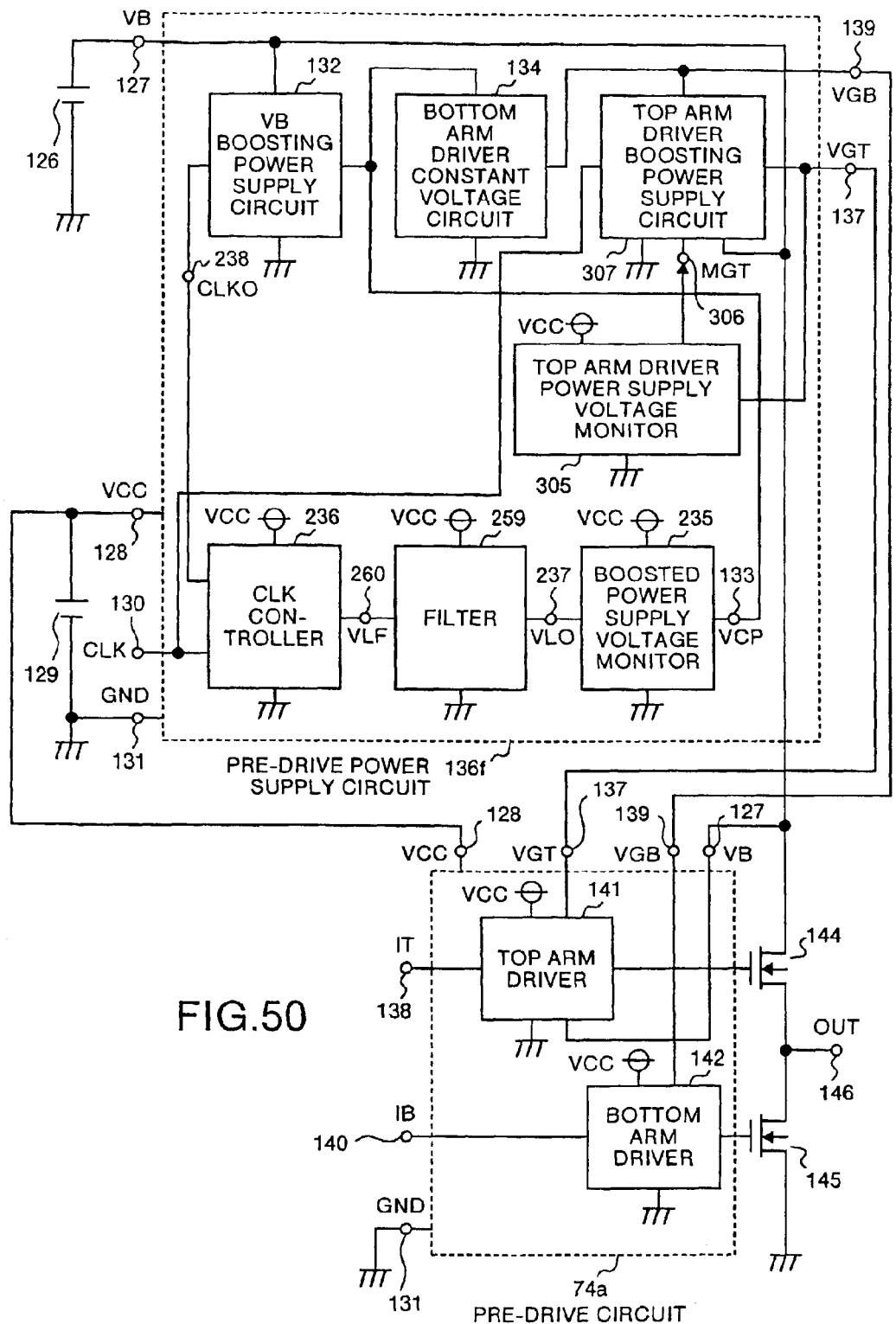
FIG. 50 is a block diagram which shows a thirty-third embodiment of the present invention.
Figure 51:
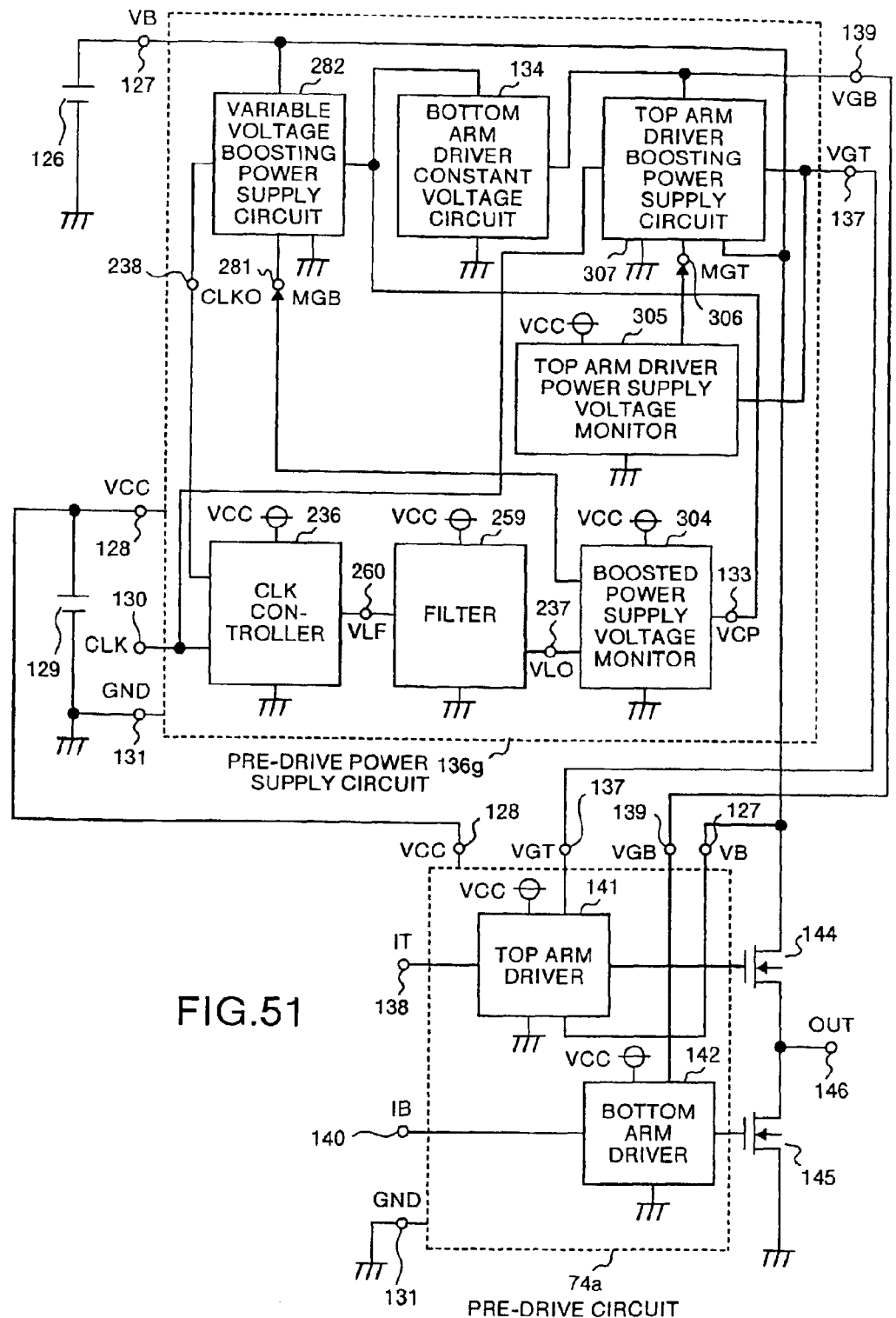
FIG. 51 is a block diagram which shows the thirty-third embodiment of the present invention.

An example of such a circuit is shown in FIG. 50. FIG. 50 shows a circuit example obtained by adding the function to the circuit example of the twenty-first embodiment shown in FIG. 35. However, the function can be applied to any circuit of the first to thirty-second embodiments. A top arm driver power supply voltage monitor circuit 305 in a pre-drive power supply circuit 136f monitors the output voltage (VGT) of the top arm driver boosting power supply circuit 307. When the top arm drive load increases and VGT has fallen below a certain preset value, the voltage monitor circuit 305 transmits a signal to a capability-switchover input terminal 306 (MGT) of the top arm driver boosting power supply circuit 307. Upon receiving this signal, the power supply circuit 307 increases the output capability and improves the fall of the top arm drive voltage caused by increase in load. When the load is small, noise increase caused when the output capability is higher than needed is prevented by lowering the capability. The present embodiment may be implemented simultaneously with the twenty-sixth to thirty-second embodiments. A circuit including a pre-drive power supply circuit 136g obtained by providing the circuit of the thirty-second embodiment shown in FIG. 49 with the function is shown in FIG. 51.

According to the thirty-third embodiment, it becomes possible to obtain a drive circuit having an added self-diagnosis circuit that prevents a bad influence due to noise upon peripheral circuits and the self circuit by enhancing the capability of the top arm driver boosting power supply circuit only when required, when applying the circuit in any of the first to thirty-second embodiments to a plurality of applications.

A thirty-fourth embodiment of this invention will be explained below. When the charge pump circuit as shown in the seventeenth embodiment is used as the top arm driver boosting power supply circuit of the thirty-third embodiment, the on-resistance of the boosting inverter can be switched over to another value in the same way as the twenty-seventh embodiment.

Figure 52:
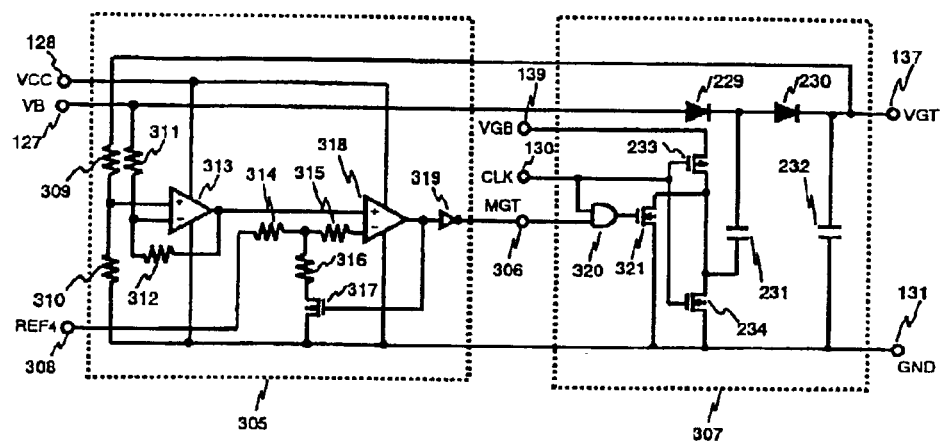
FIG. 52 is a circuit diagram which shows a thirty-fourth embodiment of the present invention.

FIG. 52 shows a concrete example of the circuit. A top arm driver power supply voltage monitor circuit 305 includes resistors 309 to 312, 314 to 316, operational amplifiers 313 and 318, an NMOS transistor 317, and an inverter 319. Further, reference numeral 308 represents a terminal of a reference voltage REF4. A top arm driver boosting power supply circuit 307 comprises rectifier diodes 229, 230, capacitors 231, 232, transistors 233, 234, 321, and an AND circuit 320. An inverting amplifier including the resistors 309 to 312 and the operational amplifier 313 compresses the signal amplitude to a signal with reference to GND so that the VGT−VB voltage corresponding to the gate drive voltage of the top arm can be driven in a comparator having VCC as its power supply. For example, denoting resistance of the resistors 309 and 311 by R1, resistance of the resistors 310 and 312 by R2, and an output of the amplifier 313 by Vo, expression (29) is obtained.

$$V_o = \frac{R2}{R1} \times (VGT - VB) \tag{29}$$

The top arm gate drive voltage (VGT−VB) is compressed by a gain determined by a resistance ratio between R1 and R2 and a compressed value is output. By setting the gain suitably, therefore, elements having a with standing voltage corresponding to VB may be used only in the resistors 309 to 312. As for the amplifier 313, and circuits and elements connected in stages subsequent thereto, any elements corresponding to the VCC voltage may be used. That is, it becomes possible to prevent a cost increase of circuit element components and an increase of layout patterns at the time of integration. As a result, it becomes possible to prevent the manufacturing cost from increasing. The circuit subsequent to the inverting amplifier has the same configuration as that of FIG. 44, which shows the concrete example of the twenty-seventh embodiment. Therefore, explanation of detailed operation thereof will be omitted.

According to the thirty-fourth embodiment, it becomes possible to obtain a drive circuit that brings about the same effects as those of the thirty-third embodiment in the following manner, when the charge pump circuit is used as the top arm driver boosting power supply circuit of the thirty-third embodiment. That is, the same effects can be obtained by receiving a signal of the top arm driver power supply voltage monitor circuit and decreasing or increasing the on-resistance of the NMOS transistor of the boosting inverter in the top arm driver boosting power supply circuit.

A thirty-fifth embodiment of this invention will be explained below. When the charge pump circuit as in the seventeenth embodiment is used as the top arm driver boosting power supply circuit of the thirty-third embodiment, the same effects as those of the thirty-third embodiment can be obtained by switching over to another forward voltage of a rectifier diode in the same way as the twenty-eighth embodiment.

Figure 53:
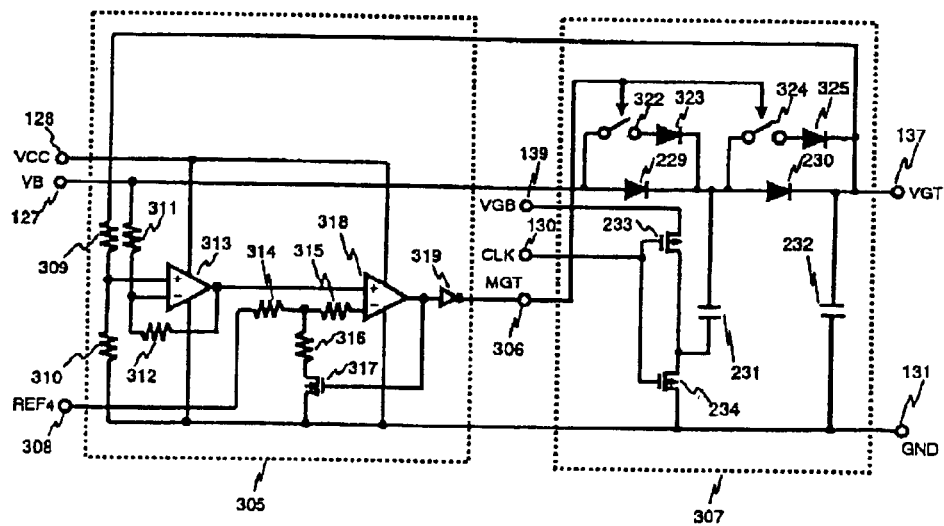
FIG. 53 is a circuit diagram which shows a thirty-fifth embodiment of the present invention.

A concrete circuit example is shown in FIG. 53. A top arm driver power supply voltage monitor circuit 305 is the same as that of the thirty-fourth embodiment shown in FIG. 52. A top arm driver boosting power supply circuit 307 is the same as that of the twenty-eighth embodiment shown in FIG. 45. However, in FIG. 53, reference numerals 322 and 324 represent switches, and 323 and 325 rectifier diodes. Therefore, explanation of detailed operation thereof will be omitted.

According to the thirty-fifth embodiment, it becomes possible to obtain a drive circuit that brings about the same effects as those of the thirty-third embodiment in the following manner, when the charge pump circuit is used as the top arm driver boosting power supply circuit of the thirty-third embodiment. That is, the same effect can be obtained by receiving a signal of the top arm driver power supply voltage monitor circuit and decreasing or increasing the forward voltage of the rectifier diode in the charge pump circuit, Further, by implementing the present embodiment simultaneously with the thirty-fourth embodiment, a drive circuit having the same effects as those of the thirty-third embodiment can also be obtained.

A thirty-sixth embodiment of this invention will be explained below. In the twenty-sixth to thirty-fifth embodiments, the circuits have been explained. More specifically, each of the circuits has the power supply voltage monitor circuit that detects fall of the top and bottom arm drive voltages, and increases the capability of the voltage boosting power supply circuits that drive the top and bottom arms at the time of fall. In the thirty-sixth embodiment, a circuit is explained. This circuit determines a signal, as detection of abnormality, output when each power supply voltage monitor circuit detects fall of the gate drive voltage, and stops operation of the pre-drive circuit.

As explained in the Background of the Invention and with reference to the first embodiment there is a possibility that the output capability of the output-stage top and bottom arm transistors falls when the gate drive voltage falls and consequently the output current or output dynamic range required for application operation cannot be ensured. In this instance, there is a possibility that false operation or destruction of an electric circuit may occur at the worst. The thirty-sixth embodiment is provided to obtain a circuit which ensures safety. Specifically, this circuit detects a case where the gate drive voltage falls below a certain preset value in any of the first to twenty-fifth embodiments as an abnormal mode, and stops the operation of the output transistor drive circuit.

Figure 54:
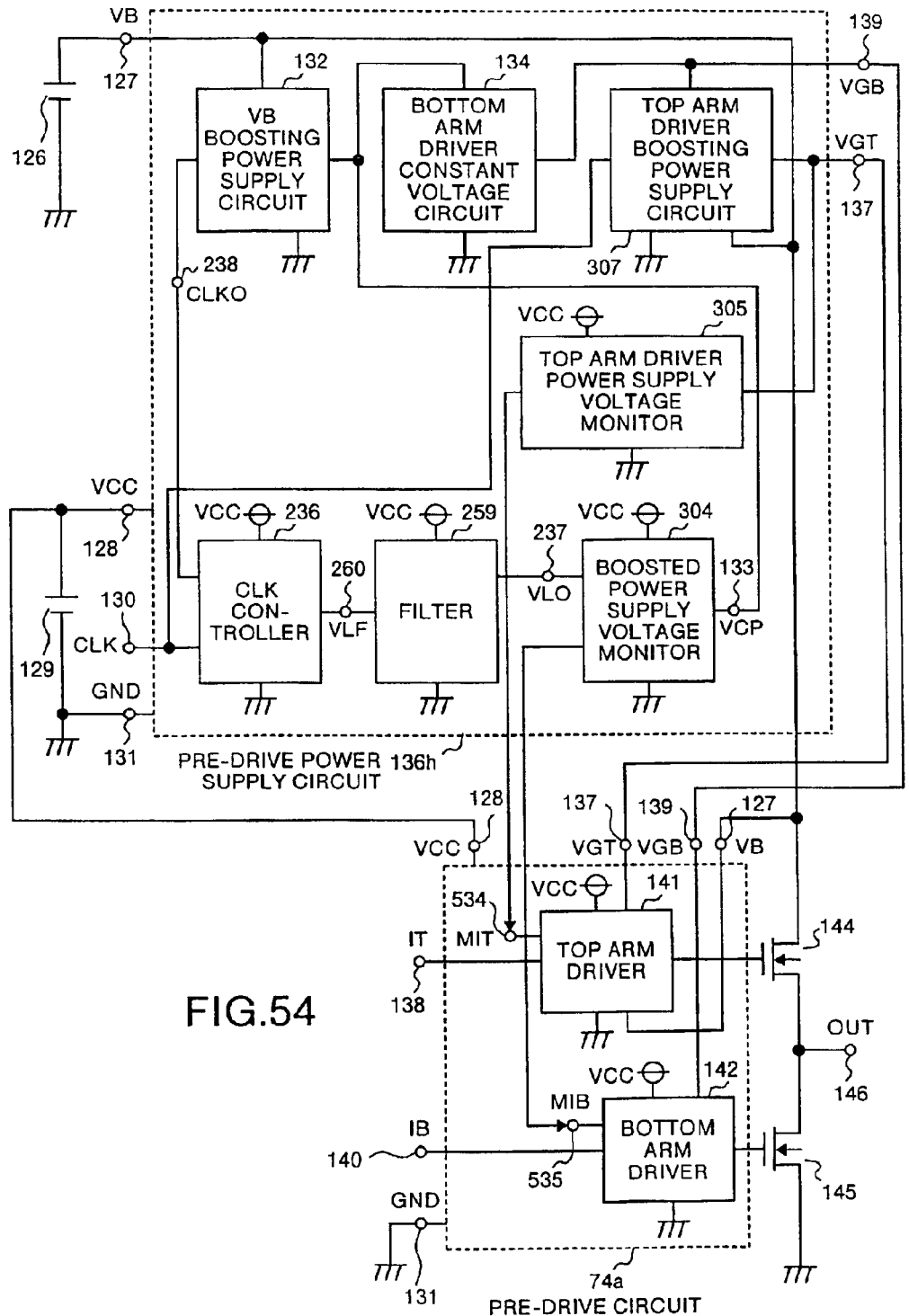
FIG. 54 is a block diagram which shows a thirty-sixth embodiment of the present invention.

FIG. 54 shows an example of a concrete circuit. A top and bottom drive voltage (VGT and VGB) detection circuit in a pre-drive power supply circuit 136*h* has the same configuration as that of FIG. 51. Upon detecting fall of the voltage of the VB boosting power supply circuit 132 below a certain voltage, the boosted power supply voltage monitor circuit 304 transmits an abnormality detection signal to an input terminal (MIB) of a bottom arm driver 142. Upon receiving the signal, the bottom arm driver 142 stops drive of a bottom arm transistor 145. In the same way, upon detecting fall of the top arm drive voltage (VGT−VB), a top arm driver power supply voltage monitor circuit 305 transmits an abnormality detection signal to an input terminal (MIT) of a top arm driver 141. Upon receiving the signal, the top arm driver 141 stops drive of a top arm transistor 144. As heretofore explained, the operation of the pre-driver circuit is thus stopped when the gate drive voltage has fallen.

According to the thirty-sixth embodiment, it becomes possible to obtain a drive circuit that prevents abnormal operation by detecting fall of the gate drive voltage of the output transistor and turning off the output transistor based on the circuits of the first to thirty-fifth embodiments.

A thirty-seventh embodiment of this invention will be explained below. As explained with reference to the first embodiment, one object of the present invention is to provide a circuit applicable to a wide power supply voltage range while preventing the manufacturing cost from increasing, by reducing the number of elements directly supplied with the power supply voltage (VB) in the circuit (the pre-drive circuit 74*a*) that drives the output-stage top and bottom arms and preventing the gate drive voltage of the output transistor from rising higher than needed. In the third to thirty-sixth embodiments, the power supply of the output stage and the power supply (VB) of the pre-drive power supply circuit are made common. For example, in an application having two or more power supply voltages, however, it is possible to reduce the withstanding voltage of elements included in the pre-drive power supply circuit by using a power supply that is different from the power supply for output load drive and that is lower in power supply voltage as a boosting power supply of the pre-drive power supply circuit.

The thirty-seventh embodiment provides reduction of the manufacturing cost of the pre-drive power supply circuit. There is a case where an application has two or more power supplies in which a power supply is discretely provided from a load drive power supply for a coil such as a motor and this power supply has a power supply voltage lower than that of the load drive power supply. In this case, the reduction is achieved by using the low voltage power supply as a reference voltage for boosting of the pre-drive power supply circuit. To be more concrete, the application includes a vehicle-installed 42-V application that has two batteries, a 42 V battery and a 12 V battery.

Figure 55:
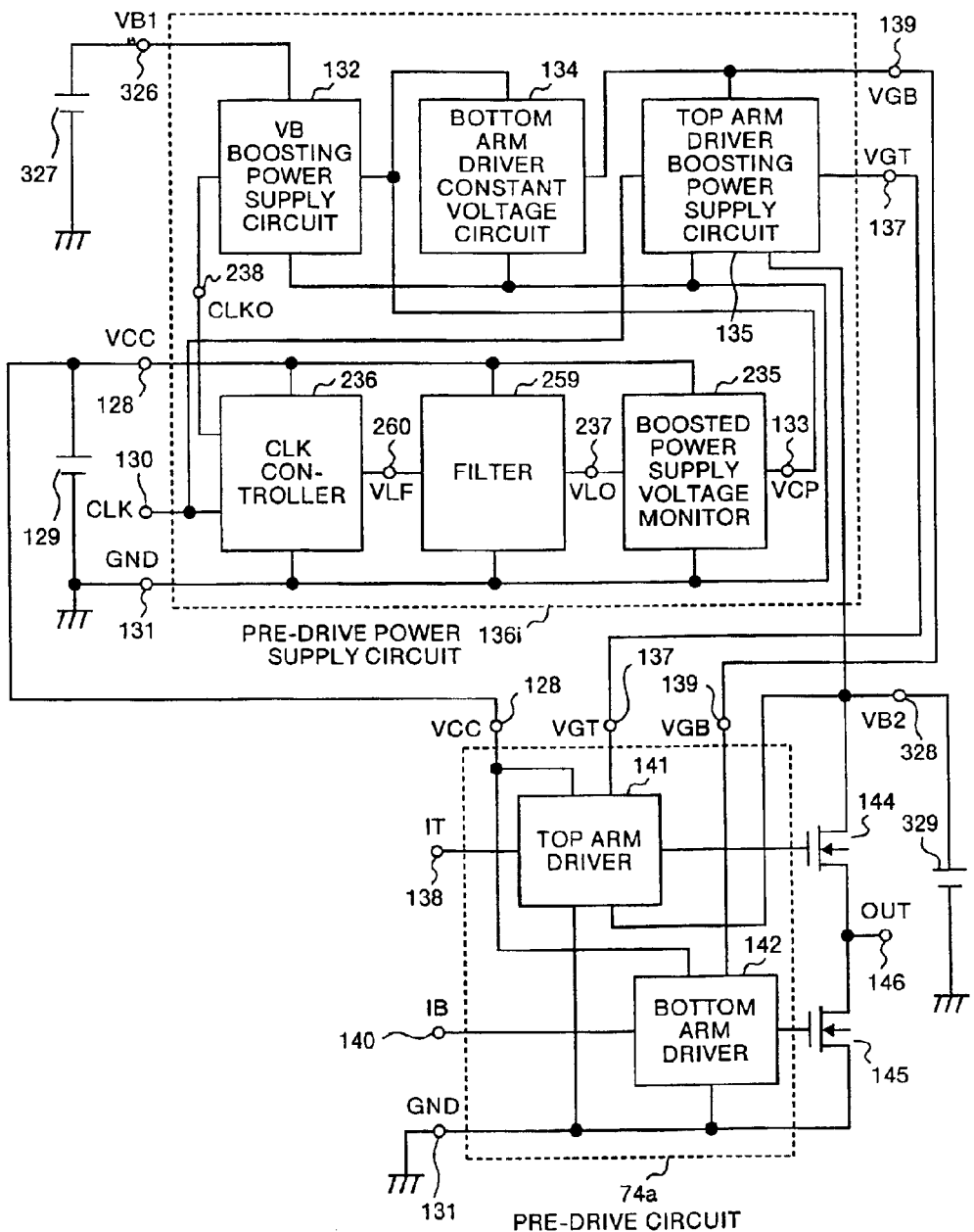
FIG. 55 is a block diagram which shows a thirty-seventh embodiment of the present invention.

FIG. 55 shows an example of a concrete circuit. FIG. 55 shows a circuit example in which the feature has been applied to the twenty-second embodiment shown in FIG. 35. A power supply 327 (VB1) is used as a power supply of a voltage boosting power supply circuit of a pre-drive power supply circuit 136*i*. A power supply 329 (VB2) is used as a power supply of a totem-pole type output stage including the top arm transistor 144 and the bottom arm transistor 145 and as ground of a top arm driver 141. If VB2>VB1, reduction of the circuit scale of the pre-drive power supply circuit is implemented.

According to the thirty-seventh embodiment, in an application such as the vehicle-installed 42 V application having two or more power supplies in which a power supply different from the output-stage power supply for drive of a coil load such as a motor, is lower in power supply voltage, it becomes possible to obtain a drive circuit reduced in manufacturing cost by applying the low voltage power supply different from the output-stage power supply to the power supply of the pre-drive power supply circuits of the third to thirty-seventh embodiments.

A thirty-eighth embodiment of this invention will be explained below. Typically, in the voltage boosting power supply circuit, a rush current flows when the power supply is started. This will now be explained by referring to, for example, the double boosting charge pump circuit of FIG. 12. When the power supply is started and the power supply voltage VB is raised from 0 V to 12 V, it is a matter of course that the decoupling capacitor 152 is not charged. Therefore, the boosted voltage output 133 (VCP) is 0 V. As a result, a current determined by the forward characteristics of the rectifier diodes 147 and 148 instantaneously flows from VB to the decoupling capacitor 152. This is the rush current. The rush current depends upon the circuit configuration, characteristics of elements forming the circuit, and the power supply voltage. If a countermeasure is not taken, however, the rush current becomes the order of several hundreds mA to several A. These values are large considering that the typical load of the output of the voltage boosting power supply circuit is in the range of several mA to several tens mA. Therefore, there is a fear that an element might be destroyed in some cases.

Figure 12:
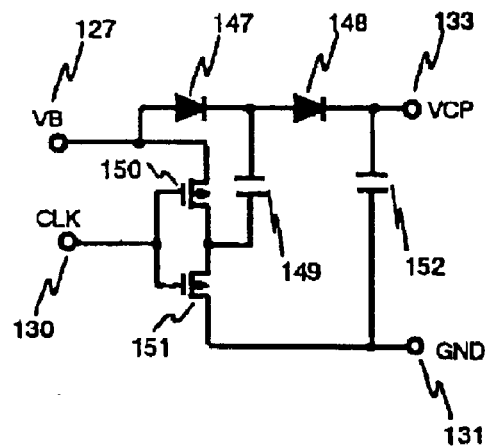
FIG. 12 is a circuit diagram of a double boosting charge pump circuit for a voltage boosting power supply circuit that shows a fifth embodiment of the present invention.

As for the countermeasure against the rush current, in general a limit resistor is inserted between a power supply terminal and a power supply. In the example of FIG. 12, the limit resistor is inserted between the terminal VB and the 12 V power supply. By inserting the limit resistor, however, the impedance of the boost path under ordinary load increases. Therefore, the output of the voltage boosting power supply circuit is lowered. In other words, the output capability of the voltage boosting power supply circuit is lowered as the rush current is decreased.

Figure 56:
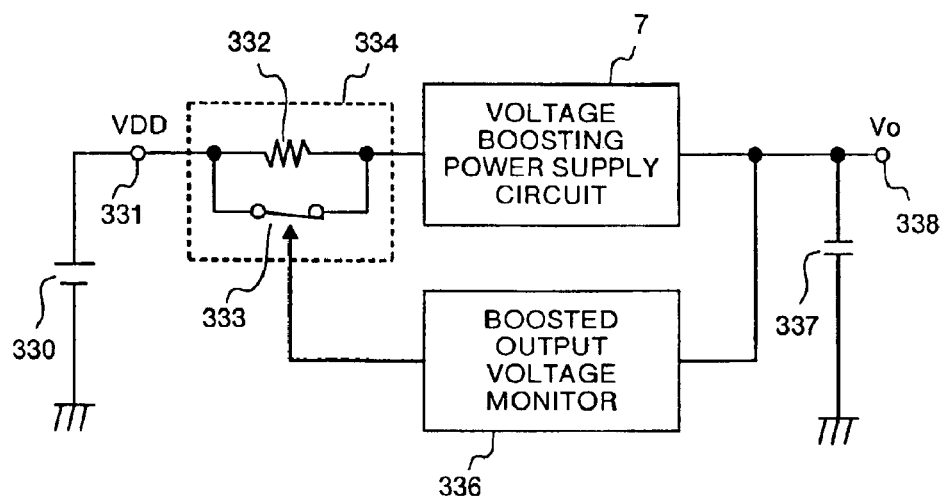
FIG. 56 is a block diagram which shows a thirty-eighth embodiment of the present invention.
Figure 57:
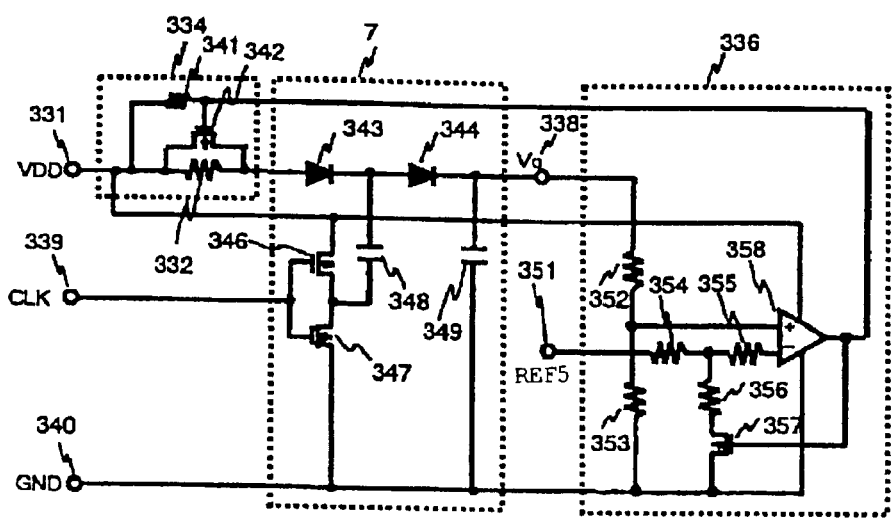
FIG. 57 is a circuit diagram which shows the thirty-eighth embodiment of the present invention.

In the present embodiment, the voltage boosting power supply circuit capability during the ordinary time is ensured by inserting a limit resistor only when the power supply is started at which the rush current is produced and removing the limit resistor at the ordinary time. To be concrete, only when the boosted output voltage is low at the time of starting power supply, the limit resistor is inserted to limit the rush current. FIG. 56 shows its concrete circuit. A boosted output voltage monitor circuit 336, which monitors a boosted output Vo of a voltage boosting power supply circuit 7, turns off a switch 333 when Vo is below a certain voltage. As a result, the rush current that flows from a power supply 330 to the power supply circuit 7 is limited by a limit resistor 332 included in a rush current control switch 334. If the output Vo is boosted above a certain voltage, then the switch 333 turns on to short-circuit across the limit resistor 332. As a result, the output capability of the voltage boosting power supply circuit is prevented from being lowered. In FIG. 56, reference numeral 331 represents a terminal of the VDD, 337 a capacitor, and 338 an output terminal. FIG. 57 shows an example of the circuit. The power supply circuit 7 may be the VCC boosting power supply circuit 69, the VB boosting power supply circuit 132, or the variable voltage boosting power supply circuit 282. In FIG. 57, reference numeral 340 represents a grounding terminal, 341 a resistor, 342 a transistor, 343 and 344 rectifier diodes, 346 and 347 transistors, 348 and 349 a capacitor, 351 a terminal of reference voltage REF5, 352 to 356 resistors, 357 NMOS transistor, and 358 an amplifier.

Figure 58:
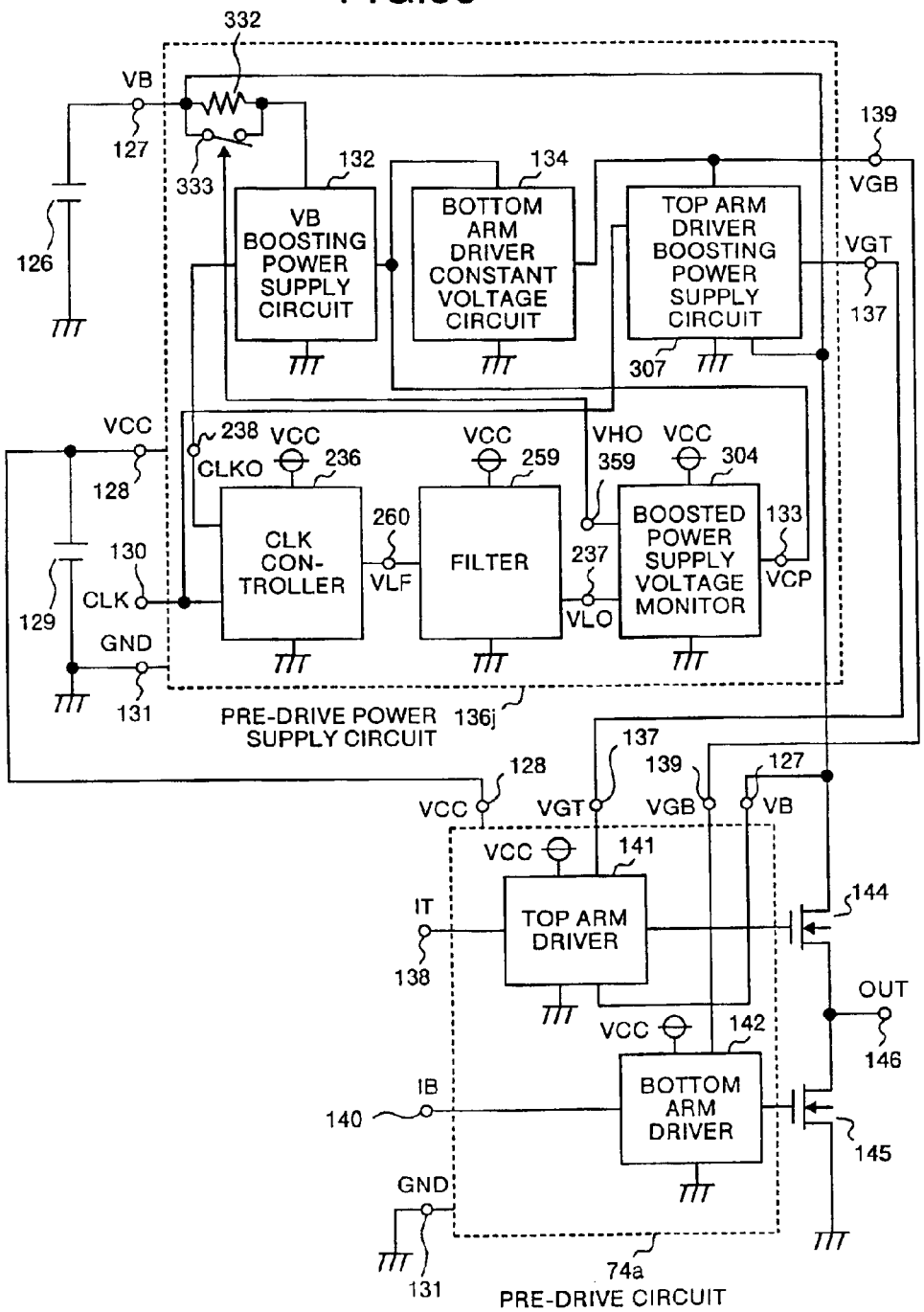
FIG. 58 is a block diagram which shows the thirty-eighth embodiment of the present invention.

The thirty-eighth embodiment can be applied to the first to thirty-seventh embodiments as well in the same way. FIG. 58 shows a circuit example including a pre-drive power supply circuit 136*j* obtained by applying the circuit shown in FIG. 56 to the circuit of the twenty-second embodiment shown in FIG. 35. Upon rise above a certain voltage, the boosted power supply voltage monitor circuit 304 of the twenty-second embodiment outputs a signal to VLO. Besides, the voltage monitor circuit 304 shown in FIG. 58 outputs a signal to VHO when VCP has fallen below a certain voltage. As a result, the effects are obtained.

According to the thirty-eighth embodiment, it becomes possible to obtain a drive circuit that inserts a rush current limit resistor in the voltage boosting power supply circuit only when the boosting output is a constant voltage at the time of starting the power supply and that prevents the boosting output capability from being lowered due to the limit resistor during the ordinary time.

A thirty-ninth embodiment of this invention will be explained below with reference to FIG. 59. By monitoring the boosting output current and inserting a limit resistor when the boosting output current is above a certain current in order to improve the problem concerning the rush current in the same way as the thirty-eighth embodiment, effects similar to those of the thirty-eighth embodiment can be obtained.

Figure 59:
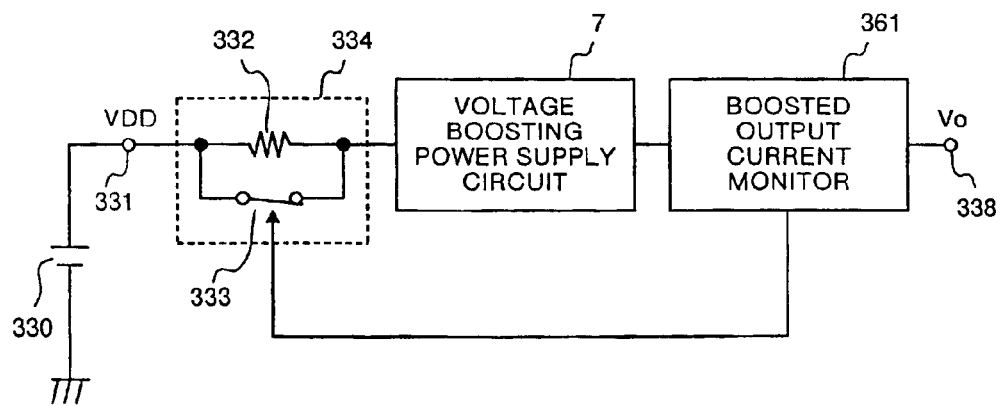
FIG. 59 is a block diagram which shows a thirty-ninth embodiment of the present invention.
Figure 60:
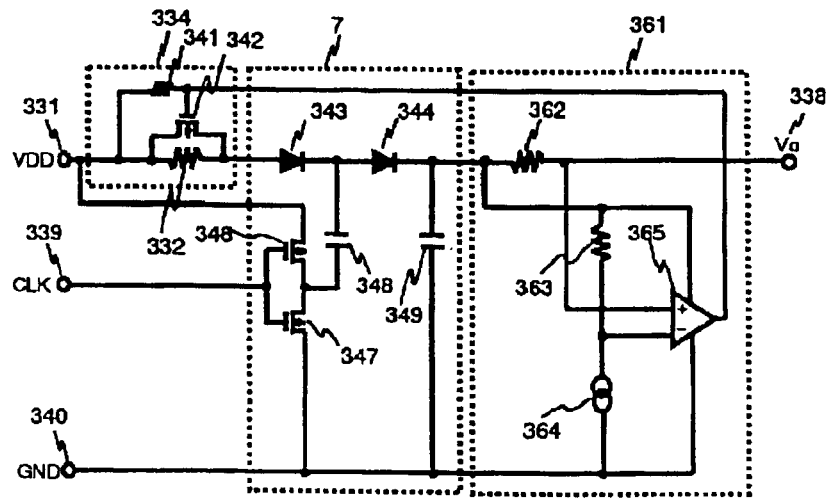
FIG. 60 is a circuit diagram which shows the thirty-ninth embodiment of the present invention.
Figure 61:
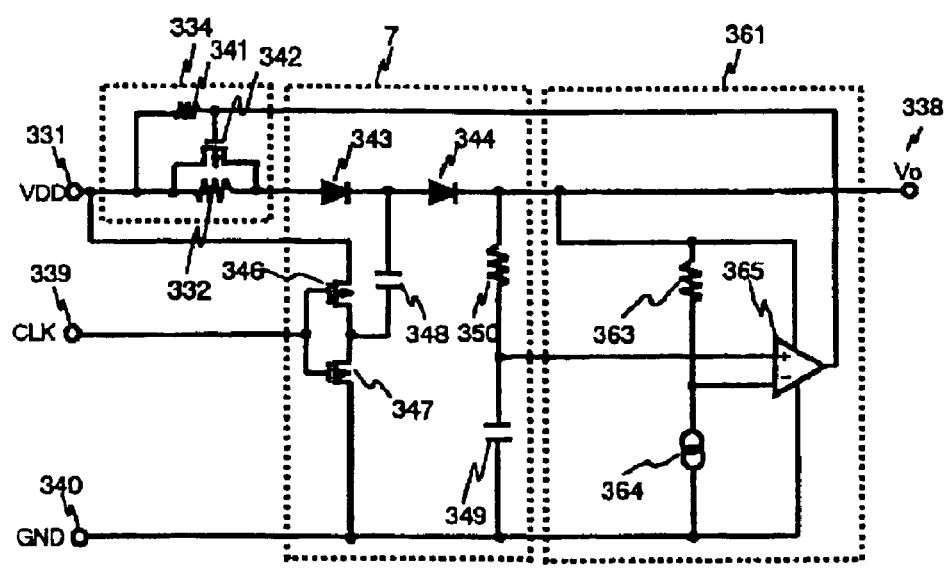
FIG. 61 is a circuit diagram which shows the thirty-ninth embodiment of the present invention.

A concrete circuit example of FIG. 59 is shown in FIG. 60. A resistor 362 is used to sense the output current. The switch 334 determines short-circuit across a limit resistor or release of the short-circuit. The circuit turns on or off the switch 334 by using the resistor 362. In this instance, the boosted output is lowered by the voltage drop across the sensing resistor. Further, in FIG. 60, reference numeral 363 represents a resistor, 364 a constant current source, and 365 an amplifier. Therefore, a circuit modified so as to monitor a charge current of boosting output decoupling capacitor 349 is shown in FIG. 61. In FIG. 61, reference numeral 350 represents a resistor.

Figure 62:
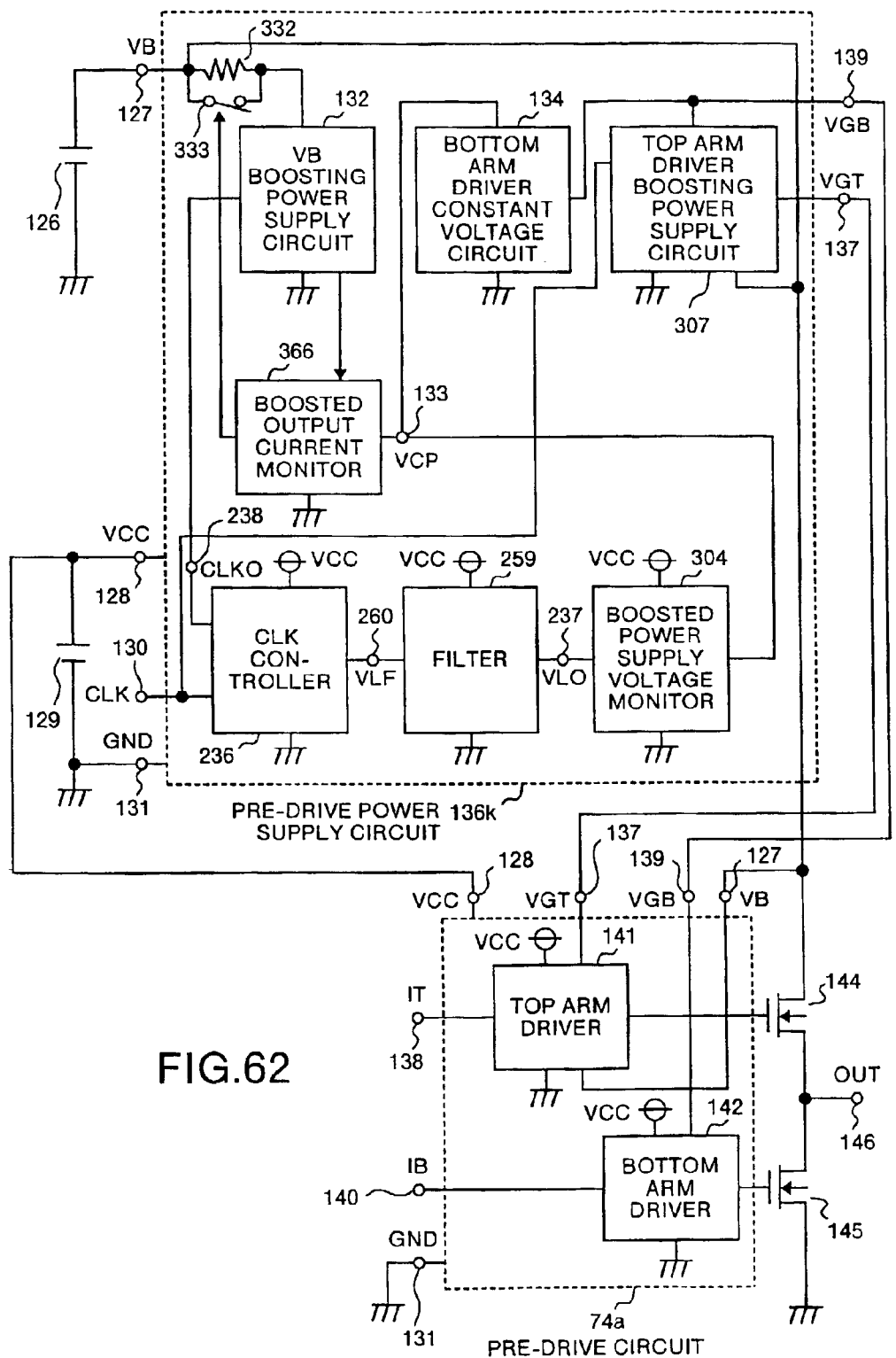
FIG. 62 is a block diagram which shows the thirty-ninth embodiment of the present invention.

The thirty-ninth embodiment can also be applied to the first to thirty-seventh embodiments. FIG. 62 shows a circuit example including a pre-drive power supply circuit 136*k* obtained by applying the thirty-ninth embodiment to the twenty-second embodiment shown in FIG. 35. In FIG. 62, reference numeral 366 represents a boosted output current monitor circuit.

According to the thirty-ninth embodiment, it becomes possible to obtain a drive circuit that inserts a rush current limit resistor in the voltage boosting power supply circuit only when a rush current occurs at the time of starting the power supply and that prevents the boosting output capability from being lowered due to the limit resistor during the ordinary time.

Figure 63:
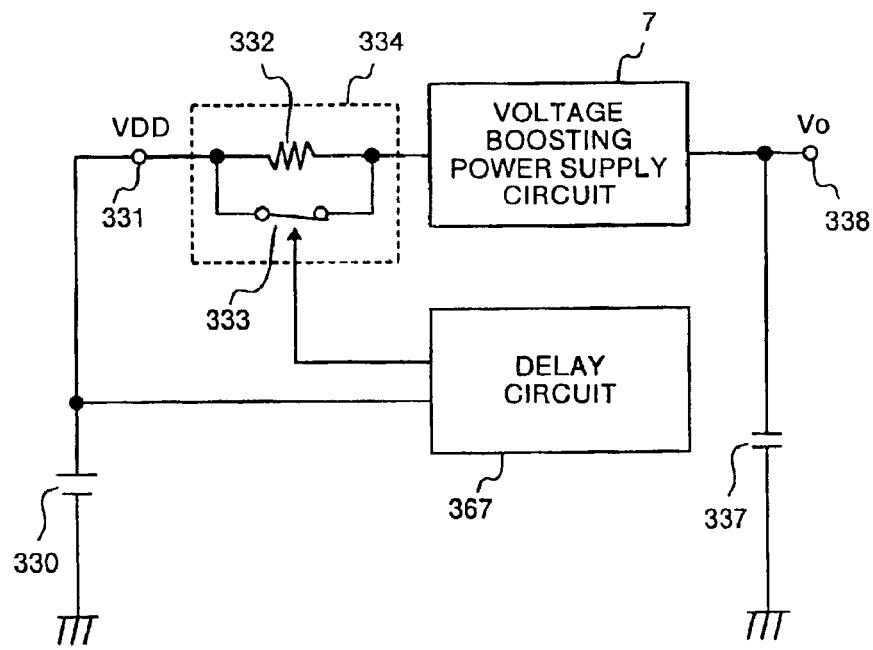
FIG. 63 is a block diagram which shows a fortieth embodiment of the present invention.
Figure 64:
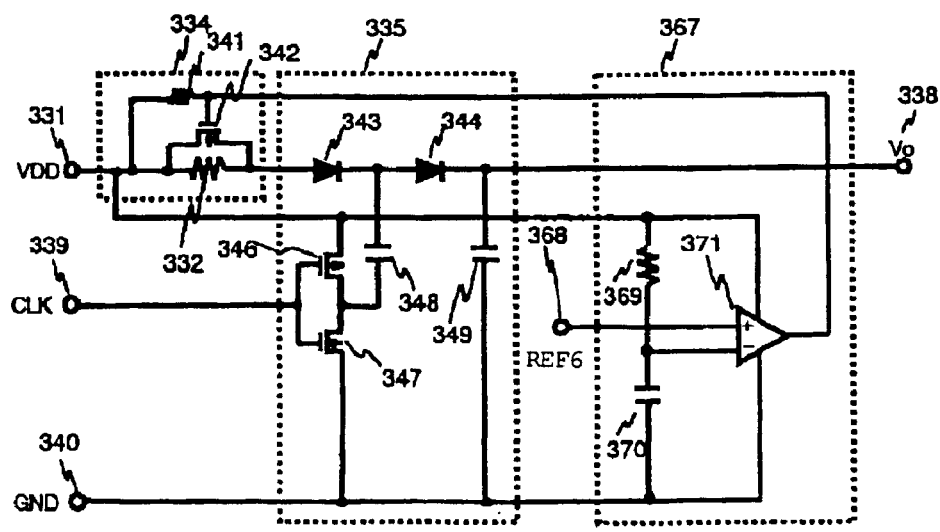
FIG. 64 is a circuit diagram which shows the fortieth embodiment of the present invention.

A fortieth embodiment of this invention will be explained below. In FIG. 63, reference numeral 367 represents a delay circuit at the time of starting power supply. In this circuit, a certain fixed delay time is provided after the start of the power supply and a limit resistor is inserted during that period, in order to improve the problem concerning the rush current in the same way as the thirty-eighth embodiment. In this circuit, effects similar to those of the thirty-eighth embodiment can be obtained. An example of a more concrete circuit is shown in FIG. 64. In FIG. 64, reference numeral 368 represents a terminal of reference voltage REF6, 369 a resistor, 370 a capacitor, and 371 an amplifier.

Figure 65:
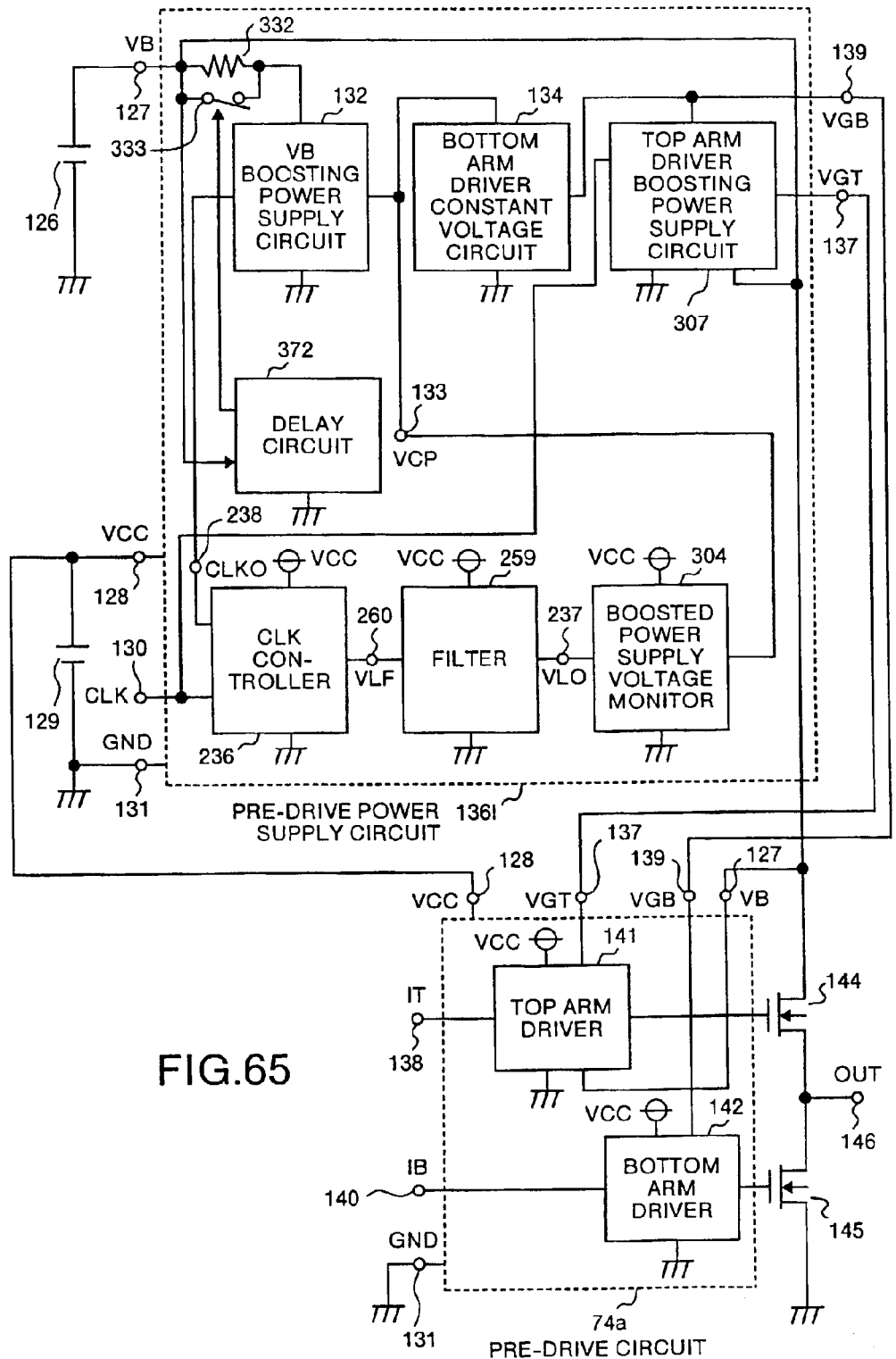
FIG. 65 is a block diagram which shows the fortieth embodiment of the present invention.

The fortieth embodiment can also be applied to the first to thirty-seventh embodiments. FIG. 65 shows a circuit example including a pre-drive power supply circuit 1361 obtained by applying the fortieth embodiment to the twenty-second embodiment shown in FIG. 35. In FIG. 65, reference numeral 372 represents a delay circuit at the time of starting power supply.

According to the fortieth embodiment, it becomes possible to obtain a drive circuit that inserts a rush current limit resistor in the voltage boosting power supply circuit for only a fixed period after the start of the power supply and that prevents the boosting output capability from being lowered due to the limit resistor during the ordinary time.

A forty-first embodiment of this invention will be explained below. In the fortieth embodiment, a delay circuit at the time of starting the power supply, i.e., the circuit that generates a fixed delay time at the time of starting the power supply is needed. In some systems, however, a circuit having the same function as that of the fixed delay generation circuit already exists. This is called power-on reset circuit. This circuit monitors the power supply voltage and stops the circuit operation for a fixed period after the start of the power supply. In the forty-first embodiment, effects similar to those of the fortieth embodiment are obtained by utilizing the output of the power-on reset circuit.

Figure 66:
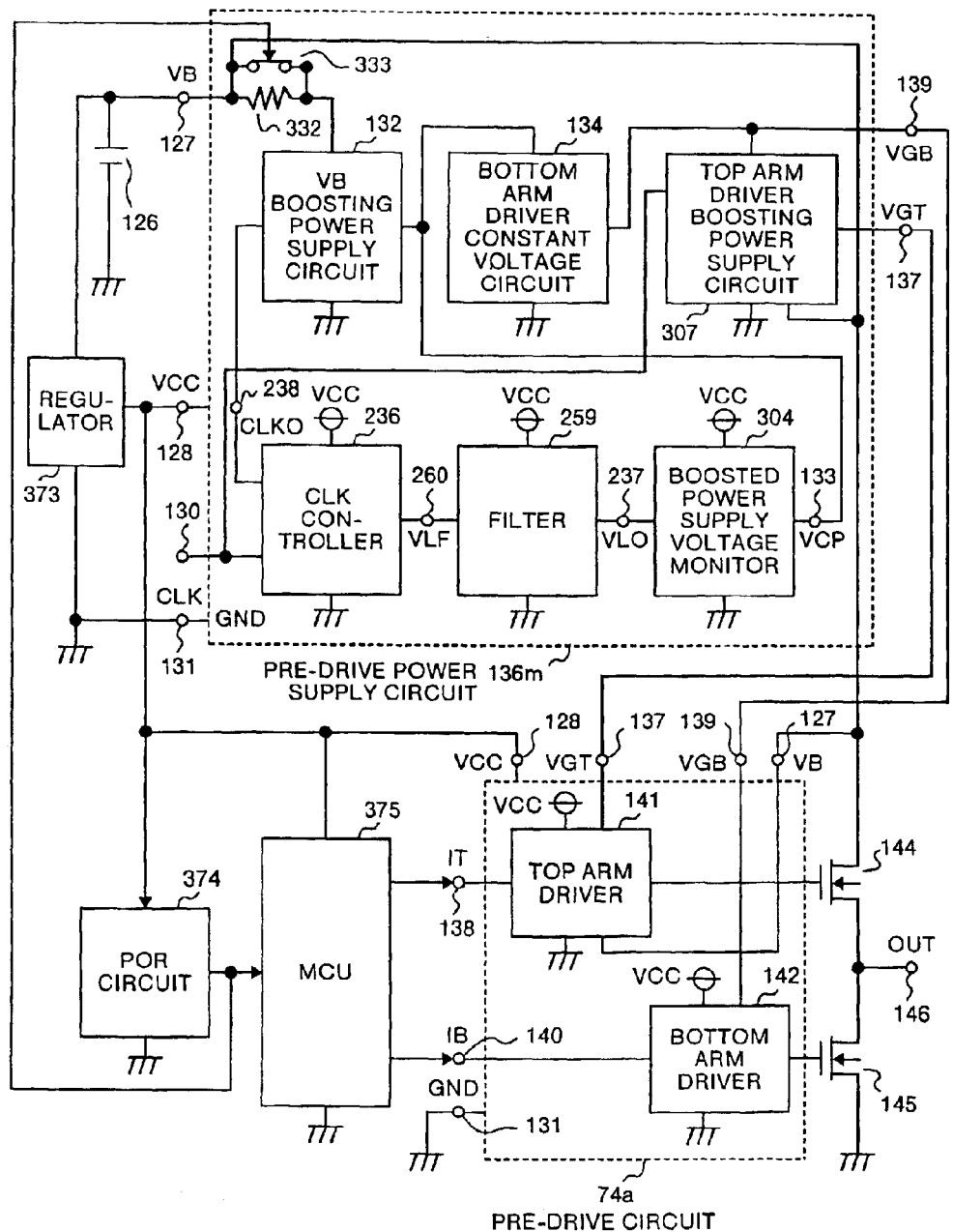
FIG. 66 is a block diagram which shows a forty-first embodiment of the present invention.

FIG. 66 shows a concrete example of the circuit including a pre-drive power supply circuit 136m based on the circuit of the twenty-second embodiment shown in FIG. 35. An MCU 375 that controls the pre-drive circuit uses the VCC power supply. VCC is a constant voltage generated from a power supply 126 (VB) by a regulator circuit 373. After the power supply (VB) is started and a normal constant voltage of a regulator output (VCC) is output, a power-on reset (POR) circuit 374 transmits a reset signal to the MCU for a fixed period so as to prevent false operation of the MCU from occurring. Therefore, by utilizing the reset signal of the POR circuit at the time of starting the power supply, the limit resistor that limits the rush current is inserted, and thereby effects similar to those of the fortieth embodiment can be obtained.

According to the forty-first embodiment, it becomes possible to obtain a drive circuit that bring about the same effects as those of the fortieth embodiment while reducing the circuit scale by utilizing the power-on reset signal included in the system.

The present invention has configurations as heretofore explained. In addition to the effects explained as to individual embodiments, all or some of the following effects are brought about as a whole.

Even if a power supply that is large in power supply voltage variation is used, the capability of the output transistor does not fall when the voltage has fallen.

Even if a power supply that is large in power supply voltage variation is used, elements having a withstanding voltage corresponding to the time when the voltage has increased can be suppressed to a minimum.

Even if a power supply that is large in power supply voltage variation is used, the variation of the output characteristic can be suppressed.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A drive circuit comprising:

a totem-pole output stage including a top arm, a bottom arm, and an output terminal connected between the top arm and the bottom arm, the top arm being connected to a power supply terminal to which a first power supply voltage is supplied;

a pre-drive circuit connected to the totem-pole output stage, the pre-drive circuit including
a top arm driver that drives the top arm, and
a bottom arm driver that drives the bottom arm; and a power supply voltage booster circuit connected to the pre-drive circuit, the power supply voltage booster circuit including
a first voltage booster circuit that boosts a second power supply voltage supplied to the first voltage booster circuit, and outputs a first boosted voltage to the bottom arm driver, and
second voltage booster circuit that boosts the first boosted voltage and outputs a second boosted voltage to the top arm driver, wherein the second voltage booster circuit is connected to the first voltage booster circuit and to the power supply terminal so that the second boosted voltage is the sum of the first boosted voltage and the first supply voltage, and output power for controlling a load is output at the output terminal.

2. A drive circuit comprising:

a drive circuit vower supply;

a totem-pole output stage including a top arm and a bottom arm;

a pre-drive circuit including
a top arm driver that drives the top arm, and
a bottom arm driver that drives the bottom arm; and a power supply voltage boosting power supply circuit including
a top arm driver boosting power supply circuit that boosts a voltage to a voltage to be output at the top arm, and
a bottom arm driver boosting power supply circuit that boosts a power supply voltage and outputs a boosted voltage, wherein the top arm driver boosting power supply circuit outputs a voltage obtained by adding the power supply voltage to the boosted voltage output by the bottom arm driver boosting power supply circuit.

3. A drive circuit comprising:

a drive circuit power supply;

a totem-pole output state including a top arm and a bottom arm;

a pre-drive circuit including
  a top arm driver that drives the top arm, and
  a bottom arm driver that drives the bottom arm; and
a power supply voltage boosting power supply circuit including
  a top arm driver boosting power supply circuit that boosts a voltage to a voltage to be output at the top arm, and
  a bottom arm driver boosting power supply circuit that boosts a power supply voltage and outputs a boosted voltage, wherein the top arm driver comprises:
    a top arm control input signal processor that outputs a signal having an amplitude between the power supply voltage and ground;
    a level shifter that level-shifts the signal to produce a level-shifted signal having an amplitude between an output of the top arm driver boosting power supply circuit and an output of the drive circuit power supply;
    a top arm output driver that converts the level-shifted signal to a drive signal of the top arm; and
    a pre-output circuit that receives an output of the top arm output driver and drives the top arm.

4. A drive circuit comprising:

a drive circuit power supply;

a totem-pole output stage including a top arm and a bottom arm;

a pre-drive circuit including
  a top arm driver that drives the top arm, and
  a bottom arm driver that drives the bottom arm; and a power supply voltage boosting power supply circuit including
  a top arm driver boosting power supply circuit that boosts a voltage to a voltage to be output at the top arm, and
  a bottom arm driver boosting power supply circuit that boosts a power supply voltage and outputs a boosted voltage wherein the power supply voltage boosting power supply circuit comprises a charge pump circuit.

5. A drive circuit comprising:

a drive circuit power supply;

a totem-pole output state including a top arm and a bottom arm;

a pre-drive circuit including
  a top arm driver that drives the top arm, and
  a bottom arm driver that drives the bottom arm; and a power supply voltage boosting power supply circuit including
  a top arm driver boosting power supply circuit that boosts a voltage to a voltage to be output at the top arm, and
  a bottom arm driver boosting power supply circuit that boosts a power supply voltage and outputs a boosted voltage, wherein the power supply voltage boosting power supply circuit comprises a charge pump circuit and a decoupling capacitor.

6. The driver circuit according to claim 1, wherein the power supply voltage booster circuit comprises a charge pump circuit.

7. The driver circuit according to claim 1, wherein the power supply voltage booster circuit comprises a charge pump circuit and a decoupling circuit.

* * * * *